(12) United States Patent
Sato

(10) Patent No.: US 10,097,196 B2
(45) Date of Patent: Oct. 9, 2018

(54) IMAGE ELEMENT, PROCESSING METHOD, AND ELECTRONIC DEVICE

(71) Applicant: SONY CORPORATION, Tokyo (JP)

(72) Inventor: Mamoru Sato, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 15/549,216

(22) PCT Filed: Feb. 12, 2016

(86) PCT No.: PCT/JP2016/054143
§ 371 (c)(1),
(2) Date: Aug. 7, 2017

(87) PCT Pub. No.: WO2016/136500
PCT Pub. Date: Sep. 1, 2016

(65) Prior Publication Data
US 2018/0041218 A1 Feb. 8, 2018

(30) Foreign Application Priority Data

Feb. 26, 2015 (JP) ................. 2015-036648

(51) Int. Cl.
*H03M 1/08* (2006.01)
*H04N 5/374* (2011.01)
(Continued)

(52) U.S. Cl.
CPC ........... *H03M 1/08* (2013.01); *H03M 1/0845* (2013.01); *H03M 1/0863* (2013.01); *H03M 1/56* (2013.01);
(Continued)

(58) Field of Classification Search
None
See application file for complete search history.

(56) References Cited

U.S. PATENT DOCUMENTS

| 5,877,715 A | 3/1999 | Gowda et al. |
| 9,019,138 B2 * | 4/2015 | Iwaki ................ H04N 5/3765 341/169 |

(Continued)

FOREIGN PATENT DOCUMENTS

| JP | 2011-023887 A | 2/2011 |
| JP | 2011-234326 A | 11/2011 |
| JP | 2013-106225 A | 5/2013 |

OTHER PUBLICATIONS

International Search Report and Written Opinion of PCT Application No. PCT/JP2016/054143, dated Apr. 5, 2016, 01 pages of English Translation and 05 pages of ISRWO.

*Primary Examiner* — Howard Williams
(74) *Attorney, Agent, or Firm* — Chip Law Group

(57) ABSTRACT

The present technology relates to an imaging element, a processing method, and an electronic device which are capable of reducing deterioration in an image quality of a captured image caused by power fluctuation. A counting unit includes a counting operation unit that performs a counting operation of counting the count value and a dummy operation unit that performs a dummy counting operation at a timing complementary to the counting operation of the counting operation unit. The present technology can be applied to, for example, an imaging element that counts a count value and performs AD conversion.

9 Claims, 20 Drawing Sheets

(51) Int. Cl.
*H04N 5/357* (2011.01)
*H03M 1/56* (2006.01)
*H04N 5/378* (2011.01)
*H03M 1/12* (2006.01)

(52) U.S. Cl.
CPC ............ *H04N 5/357* (2013.01); *H04N 5/374* (2013.01); *H04N 5/378* (2013.01); *H03M 1/123* (2013.01)

(56) References Cited

U.S. PATENT DOCUMENTS

2011/0013058 A1 1/2011 Sakurai et al.
2015/0171884 A1* 6/2015 Tsukuda ................. H04N 5/378
341/118

\* cited by examiner

IMAGE ELEMENT, PROCESSING METHOD, AND ELECTRONIC DEVICE

CROSS REFERENCE TO RELATED APPLICATIONS

This application is a U.S. National Phase of International Patent Application No. PCT/JP2016/054143 filed on Feb. 12, 2016, which claims priority benefit of Japanese Patent Application No. JP 2015-036648 filed in the Japan Patent Office on Feb. 26, 2015. Each of the above-referenced applications is hereby incorporated herein by reference in its entirety.

TECHNICAL FIELD

The present technology relates to an imaging element, a processing method, and an electronic device, and more particularly to an imaging element, a processing method, and an electronic device which are capable of suppressing deterioration in an image quality of a captured image caused by power fluctuation of a counter that performs counting in an imaging element that performs analog to digital (AD) conversion, for example, by counting of count values.

BACKGROUND ART

In recent years, complementary metal oxide semiconductor (CMOS) image sensors have been widely used as an (solid state) imaging element from the viewpoint of cost and the like.

In the CMOS image sensor, a slope type AD converter is widely used for AD conversion of electric signals (hereinafter also referred to as "pixel signals") output from pixels. In the slope type AD converter, AD conversion of the pixel signal is performed by using a ramp waveform as a reference signal (voltage), comparing the reference signal with the pixel signal through a comparator, and counting a period of time until an output of the comparator is inverted through a counter.

Further, the slope type AD converter is excellent in linearity and noise characteristics, and it is possible to configure a column AD converter that simultaneously performs AD conversion on all columns by arranging the slope type AD converter for each pixel column, for example.

According to the column AD converter, it is possible to speed up the AD conversion by lowering an operating frequency per slope type AD converter. Further, in the column AD converter, since a reference signal generating circuit that generates the reference signal can be shared by the slope type AD converters of the respective columns, efficiency of an area and power consumption are high.

Thus, the slope type AD converter is better in compatibility with the CMOS image sensor than other AD conversion types.

Note that a technique of reducing power consumption by configuring a counter with a latch circuit that latches lower bits of a count value of a counter using a gray code and a binary ripple counter that counts upper bits of the count value using a binary code has been proposed in Patent Document 1.

In Patent Document 1, first and second latch methods have been proposed as a latch method of latching the gray code by the latch circuit for the lower bits of the count value.

In the first latch method, the latch circuit is operated from the start of the AD conversion, and the gray code is latched by the latch circuit at a timing at which the output of the comparator is inverted. In the second latch method, the latch circuit is operated at a timing at which the output of the comparator is inverted, and the gray code is latched by the latch circuit at a timing at which a delay signal obtained by delaying the output of the comparator is inverted. Using the second latch method, it is possible to reduce the power consumption to be smaller than in the first latch method.

In Patent Document 1, the upper bits of the count value are counted by the binary counter. The binary counter starts the counting from the start of the AD conversion and stops the counting at a timing at which the output of the comparator is inverted.

CITATION LIST

Patent Document

Patent Document 1: Japanese Patent Application Laid-Open No. 2011-234326

SUMMARY OF THE INVENTION

Problems to be Solved by the Invention

In the counter described above, a period in which the counting operation for counting the count value is performed differs according to each counter of the slope type AD converter configuring the column AD converter due to a subject shape, a luminance, or the like.

As described above, a power voltage of the counter fluctuates since the period in which the counting operation is performed differs according to each counter. The fluctuation in the power voltage appears in the count value as noise which is unable to be canceled by digital correlated double sampling (CDS).

In other words, due to the fluctuation in the power voltage of the counter, streaks occur, and the image quality of the captured image captured by the CMOS image sensor deteriorates.

Here, for example, the streak refers to a phenomenon that in an image having a rectangular white at a central portion of a black background, a white appears to float on a black on both sides of the rectangular white or a phenomenon that in an image having a rectangular black at a central portion of a white background, a black appears to float on a white on both sides of the rectangular black.

The present technology was made in light of the foregoing, and it is desirable to suppress or prevent the deterioration in the image quality of the captured image caused by the power fluctuation of the counter.

Solutions to Problems

An imaging element or an electronic device of the present technology is an imaging element or an electronic device including the imaging element, the imaging element including: a pixel including a photoelectric converting element that performs photoelectric conversion, the pixel outputting an electric signal; a reference signal generating unit that generates a reference signal whose level changes; a comparing unit that compares the electric signal with the reference signal; and a counting unit that counts a count value in accordance with a comparison result of the electric signal and the reference signal and performs analog to digital (AD) conversion of the electric signal, the counting unit including a counting operation unit that performs a counting operation of counting the count value, and a dummy operation unit that performs a dummy counting operation at a timing complementary to the counting operation of the counting operation unit.

A processing method of the present technology is a processing method performed by an imaging element including a pixel including a photoelectric converting element that performs photoelectric conversion, the pixel outputting an electric signal, a reference signal generating unit that generates a reference signal whose level changes, a comparing unit that compares the electric signal with the reference signal, and a counting unit that includes a counting operation unit and a dummy operation unit, the counting unit counting a count value in accordance with a comparison result of the electric signal and the reference signal and performing analog to digital (AD) conversion of the electric signal, the processing method including: performing, by the counting operation unit, a counting operation of counting the count value; and performing, by the dummy operation unit, a dummy counting operation at a timing complementary to the counting operation of the counting operation unit.

In the present technology, in the counting operation unit, a counting operation for counting the count value is performed, and in the dummy operation unit, the counting operation of dummy is performed at a timing complementary to the counting operation of the counting operation unit.

Note that the imaging element may be an independent device or may be an internal block constituting one device.

Effects of the Invention

According to the present technology, it is possible to reduce the deterioration in the image quality of the captured image caused by the power fluctuation of the counter.

Note that the effects described herein are not necessarily limited, and any of effects described in the present disclosure may be included.

MODE FOR CARRYING OUT THE INVENTION

<One Embodiment of Imaging Element to which Present Technology is Applied>

Figure 1:
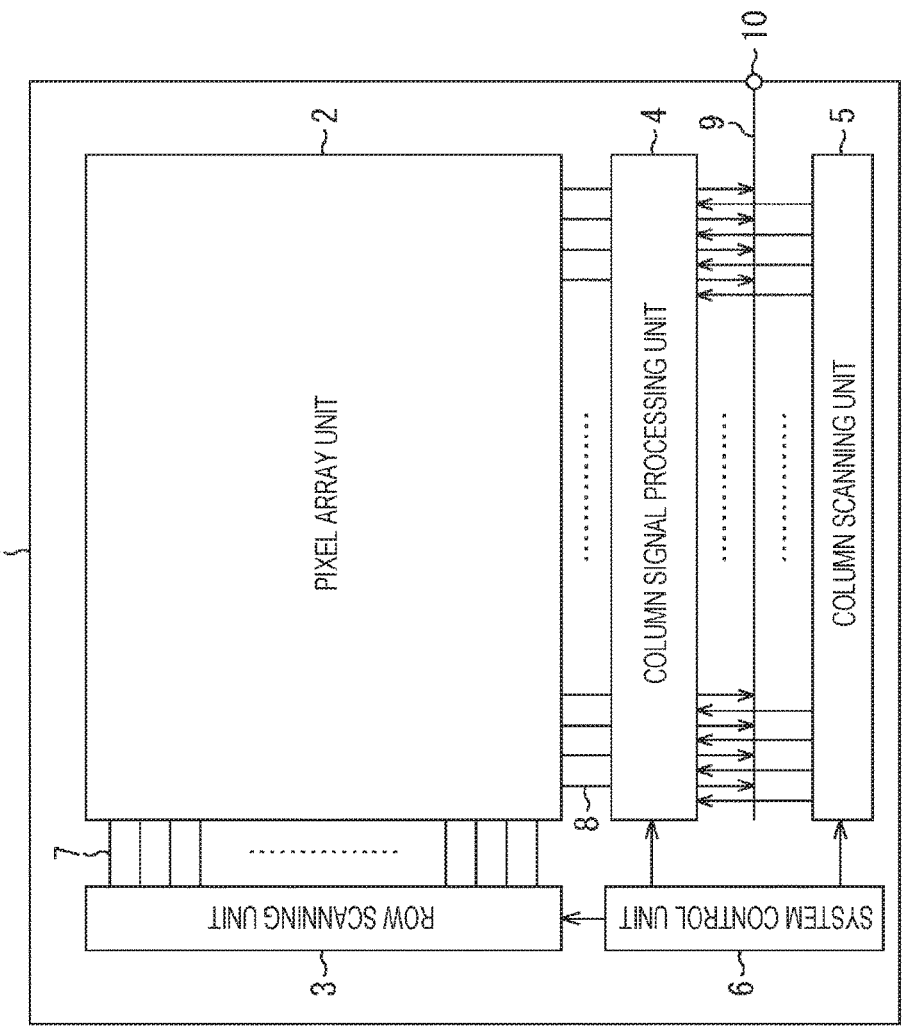
FIG. 1 is a block diagram illustrating an exemplary configuration of one embodiment of an imaging element to which the present technology is applied.

FIG. 1 is a block diagram illustrating an exemplary configuration of one embodiment of an imaging element to which the present technology is applied.

Referring to FIG. 1, the imaging element includes a semiconductor substrate 1, a pixel array unit 2, a row scanning unit 3, a column signal processing unit 4, a column scanning unit 5, a system control unit 6, a pixel drive line 7, a vertical signal line (VSL) 8, a transfer line 9, and an output terminal 10.

The pixel array unit 2 through the output terminal 10 are formed on the semiconductor substrate 1.

In the pixel array unit 2, as will be described later, H×V pixels 110 (FIG. 2) each of which performs photoelectric conversion are arranged in horizontal and vertical directions in a two-dimensional matrix form.

The pixel array unit 2 outputs pixel signals obtained by photoelectric conversion in the respective pixels 110 on the VSL 8 under the control of the row scanning unit 3.

In accordance with the control of the system control unit 6, the row scanning unit 3 controls (drives) the pixels 110 connected to the pixel drive line 7 via the pixel drive line 7. Here, the pixel drive line 7 is arranged for pixels 110 in one row.

The column signal processing unit 4 is connected to, for example, H pixels 110 arranged in each row via H VSLs 8, and the pixels signals which are electric signals (voltages) output from the pixels 110 to the VSLs 8 are supplied to the column signal processing unit 4 as voltages (VSL voltages) of the VSLs 8.

In accordance with the control of the system control unit 6, the column signal processing unit 4 performs the AD conversion on the VSL voltages (the pixel signals) supplied from the Hpixels 110 arranged in each row via the VSLs 8 in parallel. Further, in accordance with the control of the column scanning unit 5, the column signal processing unit 4 outputs digital data obtained as a result of performing AD conversion on the VSL voltages as pixel values (pixel data) of the pixels 110 to the transfer line 9. The pixel values output on the transfer line 9 are transferred to the output terminal 10 and output to the outside.

Here, the column signal processing unit 4 can perform the AD conversion on pixel signals of all the H pixels 110 arranged in one row in parallel and can also perform the AD conversion on a plurality of pixels which are less in number than H among the H pixels 110 in parallel.

Note that, in the following description, for the sake of simplicity of description, the column signal processing unit 4 is assumed to perform the AD conversion on the VSL voltages of all the H pixels 110 arranged in one row in parallel.

The column scanning unit 5 controls the column signal processing unit 4 under the control of the system control unit 6 such that the AD conversion results of the VSL voltages (pixel signals) are output to the transfer line 9.

The system control unit 6 controls the row scanning unit 3, the column signal processing unit 4, and the column scanning unit 5.

In the imaging element having the above configuration, in the pixel array unit 2, the pixel 110 performs the photoelectric conversion on light incident thereon. The pixel signals which are the electric signals obtained as results of performing the photoelectric conversion in the pixels 110 are output, for example, from the pixels 110 in a first row to the VSLs 8 in units of H pixels 110 in one row in accordance with the control via the pixel drive line 7 by the row scanning unit 3.

The VSL voltages on the VSLs 8 obtained by outputting the pixel signals to the VSLs 8 are subject to the AD conversion in the column signal processing unit 4 in units of rows in parallel, and the pixel values which are the AD conversion results are output from the output terminal 10 via the transfer line 9.

<Exemplary Configuration of Pixel Array Unit 2 and First Exemplary Configuration of Column Signal Processing Unit 4>

Figure 2:
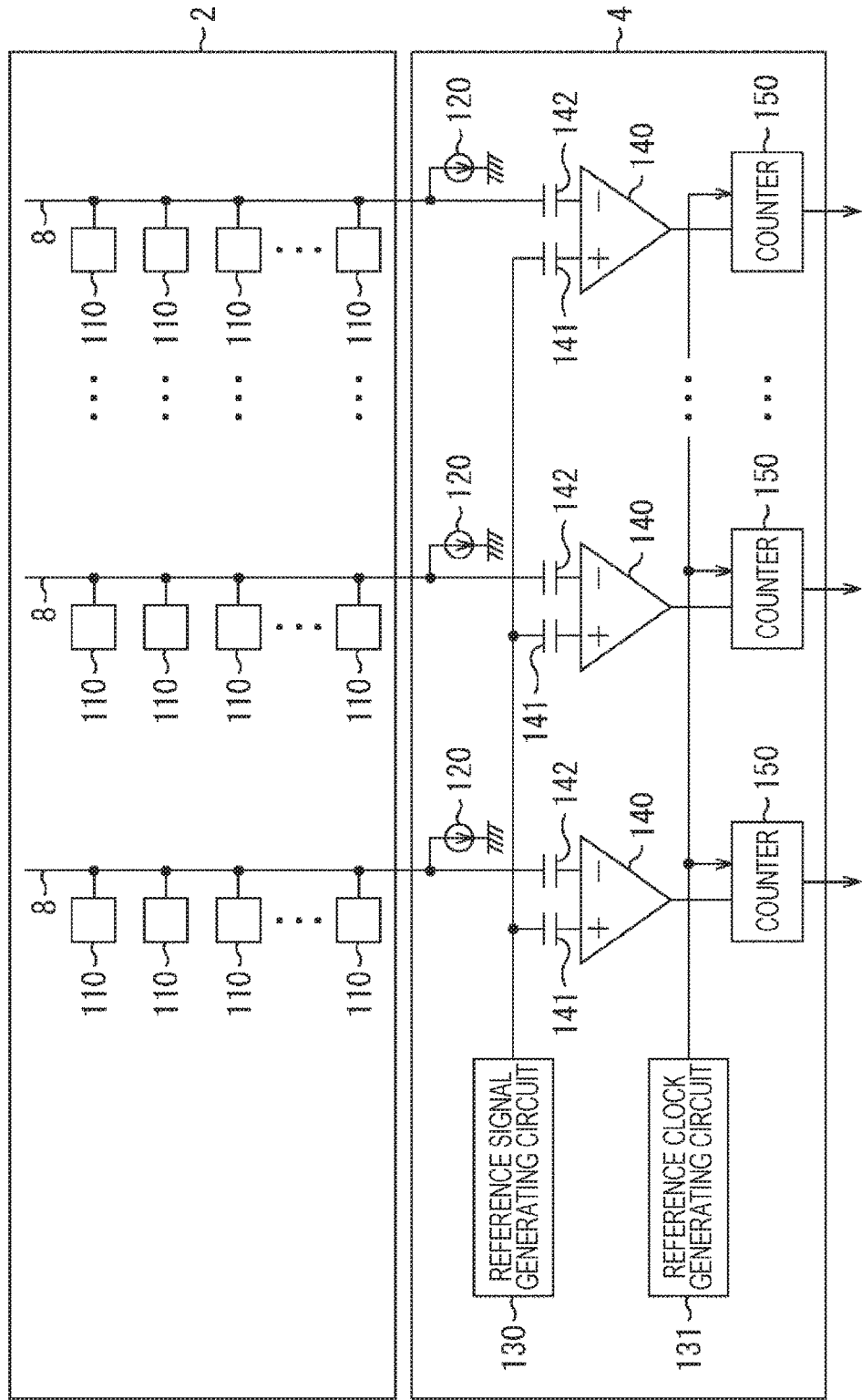
FIG. 2 is a block diagram illustrating an exemplary configuration of a pixel array unit 2 and a first exemplary configuration of a column signal processing unit 4.

FIG. 2 is a block diagram illustrating an exemplary configuration of the pixel array unit 2 and a first exemplary configuration of the column signal processing unit 4.

The pixel array unit 2 includes a plurality of pixels 110 that perform the photoelectric conversion. In the pixel array unit 2, the plurality of pixels 110 are arranged in a two-dimensional H×V matrix form.

The VSL 8 is wired for each column of pixels 110, and the pixel 110 outputs the pixel signal obtained as a result of photoelectric conversion to the VSL 8.

The pixel signal output from the pixel 110 to the VSL 8 is supplied to the column signal processing unit 4 as the VSL voltage.

The column signal processing unit 4 includes H bias circuits 120, H comparators 140, and H counters 150 which are equal in number to the VSLs 8, a reference signal generating circuit 130, and a reference clock generating circuit 131 and constitutes a column AD converter.

The bias circuit 120 is a current source and controls the VSL 8 such that the VSL 8 has a predetermined voltage by applying an electric current to the VSL 8.

The reference signal generating circuit 130 is configured with, for example, a digital to analog converter (DAC), and generates a reference signal having a period whose level (voltage) changes from a predetermined initial value to a predetermined final value with a certain gradient such as a ramp signal and supplies the reference signal to one of two input terminals of each of the H comparators 140.

The reference clock generating circuit 131 generates a reference clock which is a clock for enabling the counter 150 to count a count value and supplies the reference clock to the H counters 150.

In the comparator 140, the other input terminal is connected to the VSL 8, and thus the VSL voltage (the pixel signal) is supplied to the other input terminal of the comparator 140 via the VSL 8.

Here, capacitors 141 and 142 for canceling an analog element variation are connected to the two input terminals of the comparator 140. The reference signal is supplied from the reference signal generating circuit 130 to the comparator 140 via the capacitor 141, and the VSL voltage is supplied from the VSL 8 to the comparator 140 via the capacitor 142.

The comparator 140 compares the reference signal and the VSL voltage which are supplied to the two input terminals, and outputs a comparison result as a comparator output VCO.

Here, in a case where the reference signal is higher than the VSL voltage (or in a case where the reference signal is equal to or higher than the VSL voltage), for example, the comparator 140 outputs a high (H) level of a H level and a low (L) level and outputs the H level as the comparator output VCO. Further, in a case where the reference signal is not higher than the VSL voltage, the comparator 140 inverts the comparator output VCO and outputs the L level.

The comparator output VCO is supplied from the comparator 140 to the counter 150.

The counter 150 counts the count value in synchronization with the reference clock supplied from the reference clock generating circuit 131.

The counter 150 counts the count value in accordance with the comparator output VCO of the comparator 140.

In other words, for example, the counter 150 counts the count value when the comparator output VCO is the H level, and stops the counting when the comparator output VCO is inverted to the L level.

As described above, the counter 150 performs the AD conversion on the VSL voltage (the pixel signal) by performing the counting during a period of time necessary for changing the level of the reference signal until the VSL voltage and the reference signal (voltage) coincide with each other (until a magnitude relation between the VSL voltage and the reference signal is reversed).

The counter 150 outputs the count value, that is, the AD conversion result of the VSL voltage (the pixel signal) to the transfer line 9 (FIG. 1) as the pixel value.

In the column signal processing unit 4 of FIG. 2, a set of comparator 140 and counter 150 constitutes one slope type AD converter.

Further, in FIG. 2, a set of comparator 140 and counter 150 which is one slope type AD converter is arranged for each column (of pixels 110), but a set of comparator 140 and counter 150 may be arranged for every two or more columns, and the AD conversion may be performed on the two or more columns in a time division manner.

<Exemplary Configuration of Pixel 110>

Figure 3:
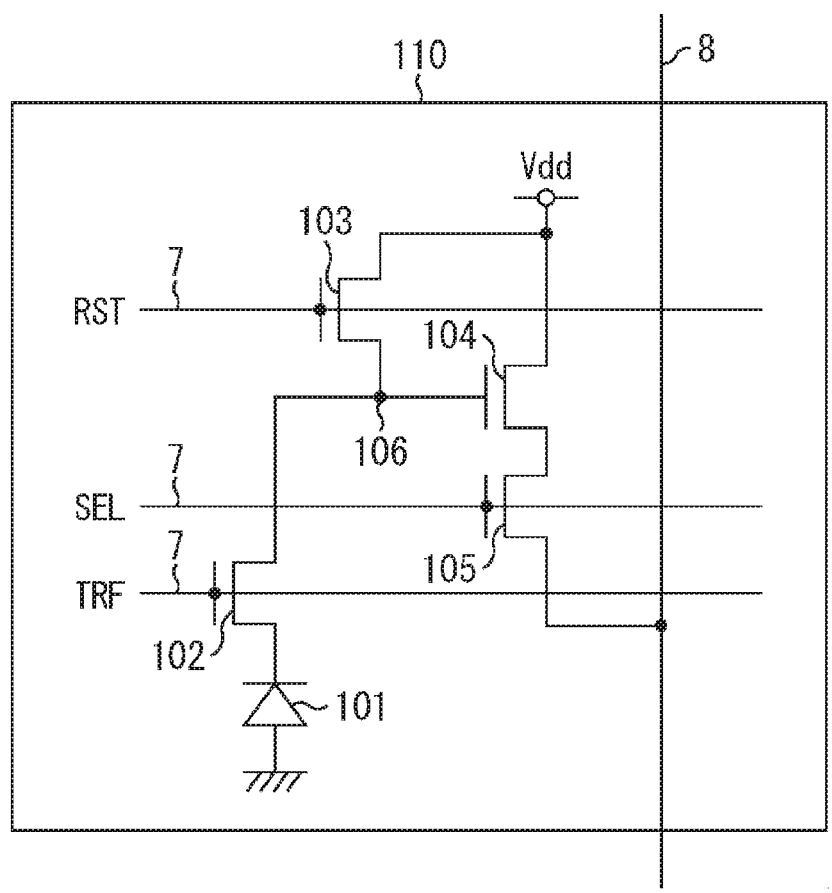
FIG. 3 is a circuit diagram illustrating an exemplary configuration of a pixel 110.

FIG. 3 is a circuit diagram illustrating an exemplary configuration of pixel 110.

In FIG. 3, the pixel 110 includes a photo diode (PD) 101 and four negative channel MOS (NMOS) field effect transistors (FETs) 102, 103, 104, and 105.

Further, in the pixel 110, a drain of the FET 102, a source of the FET 103, and a gate of the FET 104 are connected, and a floating diffusion (FD) (capacitor) 106 for converting electric charges to a voltage is formed at a connection point thereof.

The PD 101 is an example of a photoelectric converting element that performs the photoelectric conversion, and receives incident light and performs the photoelectric conversion by charging electric charges corresponding to the incident light.

An anode of the PD 101 is connected to the ground (grounded), and a cathode of the PD 101 is connected to a source of the FET 102.

The FET 102 is an FET that transfers the electric charges charged in the PD 101 from the PD 101 to the FD 106 and is hereinafter also referred to as a "transfer Tr 102."

The source of the transfer Tr 102 is connected to the cathode of the PD 101, and the drain of the transfer Tr 102 is connected to the FD 106.

Further, a gate of the transfer Tr 102 is connected to the pixel drive line 7, and a transfer pulse TRF is supplied to the gate of the transfer Tr 102 via the pixel drive line 7.

Here, in order that the row scanning unit 3 (FIG. 1) drives (control) the pixel 110 via the pixel drive line 7, control signals applied to the pixel drive line 7 include a reset pulse (to be described later) RST and a selection pulse SEL in addition to the transfer pulse TRF.

The FET 103 is an FET that resets the electric charges (voltage (electric potential)) charged in the FD 106 and is hereinafter also referred to as a "reset Tr 103".

A drain of the reset Tr 103 is connected to a power supply Vdd.

Further, a gate of the reset Tr 103 is connected to the pixel drive line 7, and the reset pulse RST is supplied to the gate of the reset Tr 103 via the pixel drive line 7.

The FET 104 is an FET that amplifies (buffers) the voltage of the FD 106 and is hereinafter also referred to as an "amplifying Tr 104."

The gate of the amplifying Tr 104 is connected to the FD 106, and a drain of the amplifying Tr 104 is connected to the power supply Vdd. Further, a source of the amplifying Tr 104 is connected to a drain of the FET 105.

The FET 105 is an FET that selects an output of the electric signal (VSL voltage) to the VSL 8 and is hereinafter also referred to as a "selecting Tr 105."

A source of the selecting Tr 105 is connected to the VSL 8.

Further, a gate of the selecting Tr 105 is connected to the pixel drive line 7, and the selection pulse SEL is supplied to the gate of selecting Tr 105 via the pixel drive line 7.

Here, the source of the amplifying Tr 104 is connected to the bias circuit 120 (FIG. 2) serving as the current source via the selecting Tr 105 and the VSL 8, (a circuit of) a source follower (SF) is constituted by the amplifying Tr 104 and the bias circuit 120, and thus the voltage of the FD 106 becomes the VSL voltage of the VSL 8 via the SF.

The FD 106 is a region which is formed at the connection point of the drain of the transfer Tr 102, the source of the FET 103, and the gate of the FET 104 and converts the electric charges into a voltage, similarly to a capacitor.

Note that the pixel 110 may not include the selecting Tr 105.

Note that the pixel 110 may employ a shared pixel configuration (an FD sharing type) in which the reset Tr 103 to the FD 106 are shared by two or more sets of PD 101 and transfer Tr 102.

Furthermore, the pixel 110 may employ a configuration which has a memory function of storing the electric charges obtained by the PD 101 and is capable of performing a global shutter operation.

In the pixel 110 having the above configuration, the PD 101 receives light incident thereon, performs the photoelectric conversion, and starts to charge the electric charges according to a light amount of the received incident light.

Note that herein for the sake of simplicity of description, the selection pulse SEL is assumed to be at the H level, and the selecting Tr 105 is assumed to be in the ON state.

When a predetermined period of time (an exposure period of time) elapses after the PD 101 starts to charge the electric charges, the row scanning unit 3 (FIG. 1) causes the transfer pulse TRF to temporarily transition (from the L level) to the H level.

When the transfer pulse TRF temporarily transitions to the H level, the transfer Tr 102 temporarily enters the ON state.

When the transfer Tr 102 enters the ON state, the electric charges charged in the PD 101 are transferred to and charged in the FD 106 via the transfer Tr 102.

The row scanning unit 3 causes the reset Tr 103 to temporarily enter the ON state by causing the reset pulse RST to temporarily transition to the H level before causing the transfer pulse TRF to temporarily transition to the H level.

When the reset Tr 103 enters on state, the FD 106 is connected to the power supply Vdd via the reset Tr 103, and the electric charges in the FD 106 are discharged to the power supply Vdd and reset through the reset Tr 103.

Here, as described above, when the FD 106 is connected to the power supply Vdd, and the electric charges in the FD 106 are reset, the pixel 110 is reset.

After the electric charges of the FD 106 are reset, the row scanning unit 3 causes the transfer pulse TRF to temporarily transition to the H level as described above. Accordingly, the transfer Tr 102 temporarily enters the ON state.

When the transfer Tr 102 enters the ON state, the electric charges charged in the PD 101 are transferred to and charged in the reset FD 106 via the transfer Tr 102.

The voltage (potential) corresponding to the electric charges charged in the FD 106 is output to the VSL 8 as the VSL voltage via the amplifying Tr 104 and the selecting Tr 105.

In the set of the comparator 140 and the counter 150 (FIG. 2) connected to the VSL 8, the reset level which is the VSL voltage immediately after the pixel 110 is reset is subject to the AD conversion.

Furthermore, in the set of the comparator 140 and the counter 150, the signal level (the reset level and the level serving as the pixel value) which is the VSL voltage after the transfer Tr 102 temporarily enters the ON state (the voltage corresponding to the electric charges which are charged in the PD 101 and transferred to the FD 106) is subjected to the AD conversion.

Further, in the set of the comparator 140 and the counter 150, the digital CDS of obtaining a difference between the AD conversion result of the reset level (hereinafter also referred to as a "reset level AD value") and the AD conversion result of the signal level (hereinafter also referred to as a "signal level AD value") as the pixel value is performed.

Note that the digital CDS may be performed after the AD conversions of the reset level and the signal level are preformed or may be performed during the AD conversions of the reset level and the signal level.

<Overview of Operation of Imaging Element>

Figure 4:
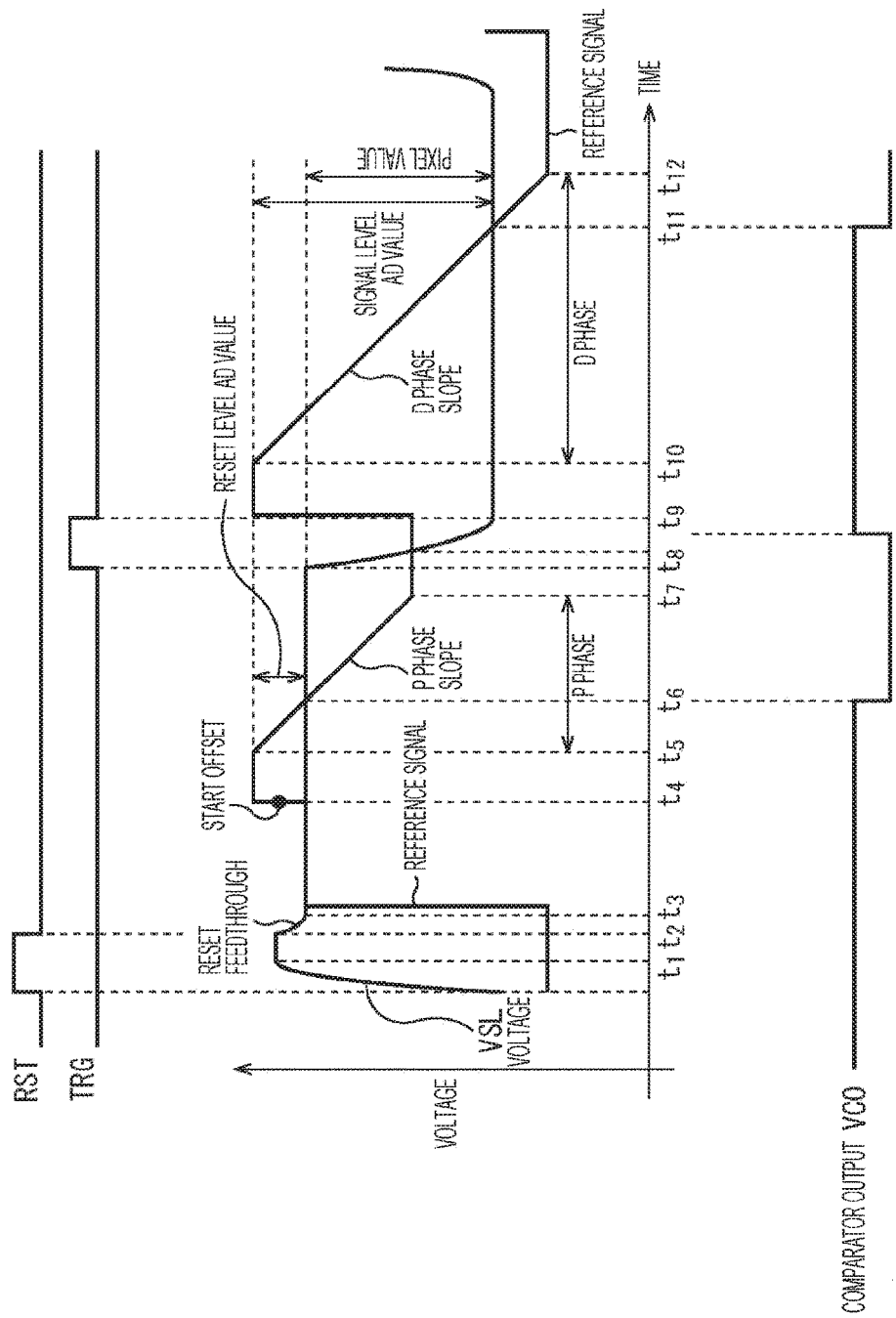
FIG. 4 is a diagram for describing an overview of an operation of an imaging element.

FIG. 4 is a diagram for describing an overview of an operation of the imaging element (FIG. 1).

Note that in FIG. 4, a horizontal axis indicates a time, and a vertical axis indicates a voltage.

FIG. 4 is a waveform diagram illustrating an example of the VSL voltage supplied from the pixel 110 to the comparator 140 via the VSL 8 and the reference signal (voltage)

supplied from the reference signal generating unit 130 to the comparator 140 in the imaging element.

Note that FIG. 4 also illustrates the transfer pulse TRF applied to (the gate of) the transfer Tr 102 (FIG. 3), the reset pulse RST applied to the reset Tr 103, and the comparator output VCO of the comparator 140 together with the VSL voltage and the reference signal.

In the imaging element, the reset pulse RST temporarily transitions to the H level, and thus the pixel 110 is reset.

In the reset of the pixel 110, as described with reference to FIG. 3, the FD 106 is connected to the power supply Vdd via the reset Tr 103, and the electric charges in the FD 106 are reset, and thus the VSL voltage output from the pixel 110, that is, the VSL voltage of the VSL 8 output from the FD 106 via the amplifying Tr 104 and the selecting Tr 105 in the pixel 110 increases and becomes a voltage corresponding to the power supply Vdd at a time $t_1$.

While the FD 106 is connected to the power supply Vdd, the VSL voltage maintains the voltage corresponding to the power supply Vdd, and thereafter, if the reset pulse RST transitions to the L level at a time $t_2$, a small amount of electric charges are input to the FD 106 due to movement of a small amount of electric charges in the pixel 110, and thus the VSL voltage drops slightly.

In FIG. 4, the VSL voltage slightly drops due to the movement of the electric charges occurring in the pixel 110 from the time $t_2$ at which the reset pulse RST transitions to the L level to a time $t_3$.

As described above, the drop of the VSL voltage which occurs after the pixel 110 is reset is referred to as a "reset feedthrough."

Thereafter, an auto zero process is performed, and the comparator 140 is set so that it is possible to determine (compare) the magnitude relation between the VSL voltage and the reference signal on the basis of the fact that the VSL voltage applied to the comparator 140 coincides with the reference signal at the time of the auto zero process.

In FIG. 4, through the auto zero process, the reference signal (waveform) is arranged so that the voltage dropped by the reset feedthrough from the VSL voltage during the reset of the pixel 110 is used as a so-called reference.

The reference signal generating circuit 130 increases the reference signal by a predetermined voltage at a time $t_4$ after the auto zero process is completed (ends).

Herein, the increasing of the reference signal by a predetermined voltage at the time $t_4$ after the auto zero process ends is hereinafter also referred to as a "start offset."

Further, the reference signal generating circuit 130 decreases the voltage of the reference signal at a constant rate for the AD conversion of the VSL voltage, but a portion in which the voltage of the reference signal is decreased at the constant rate is referred to as a "slope."

At the time $t_4$, the reference signal generating circuit 130 performs the start offset of offsetting the reference signal by a predetermined voltage in a direction opposite to a direction of the slope (a direction in which the voltage of the reference signal changes).

Thereafter, the reference signal generating circuit 130 decreases (drops) the voltage of the reference signal at a constant rate using a certain period from a time $t_5$ to a time $t_7$ as an AD conversion period for the reset level.

Therefore, the reference signal of the period from the time $t_5$ to the time $t_7$ forms a slope.

The slope of the reference signal in the period from the time $t_5$ to the time $t_7$ is a slope for performing the AD conversion on the reset level of the VSL voltage (the VSL voltage immediately after the pixel 110 is reset (the VSL voltage after the pixel 110 is reset, and the voltage is dropped by the reset feedthrough)), and the period of the slope (the period from the time $t_5$ to the time $t_7$) is hereinafter also referred to as a "preset (P) phase." Further, the slope of the P phase is also referred to as a "P phase slope."

Here, since the comparator 140 is set so that the VSL voltage at the time of the auto zero process coincides with (the voltage of) the reference signal through the auto zero process after the pixel 110 is reset, if the start offset is performed to increase the reference signal by a predetermined voltage at the time $t_4$ after the auto zero process ends, the voltage of the reference signal is higher than the VSL voltage (reset level). Therefore, at the start time $t_5$ of the P phase, the comparator output VCO of the comparator 140 transitions to the H level indicating that the reference signal is higher than the VSL voltage.

The counter 150 starts to count the reference clock from the start timing of the AD conversion period for the reset level, that is, the start time $t_5$ of the P phase slope.

In the P phase, (the voltage of) the reference signal (voltage) gradually decreases, and in FIG. 4, at a time $t_6$ of the P phase, the reference signal coincides with the VSL voltage as the reset level, and the magnitude relation between the reference signal and the VSL voltage is reversed from that at the time at which the P phase starts.

As a result, the comparator output VCO of the comparator 140 is inverted (reversed) from the H level at the time of the start of P phase to the L level.

If the comparator output VCO of the comparator 140 transitions to the L level, the counter 150 stops the counting of the reference clock, and the count value of the counter 150 at that time is the AD conversion result of the reset level (the reset level AD value).

After the P phase ends, in the imaging element, the transfer pulse TRF transitions from the L level to the H level during a period from a time $t_8$ to a time $t_9$, and as a result, in the pixel 110 (FIG. 3), the electric charges charged in the PD 101 by the photoelectric conversion are transferred to and charged in the FD 106 via the transfer Tr 102.

If the electric charges are charged in the FD 106, the VSL voltage corresponding to the electric charges charged in the FD 106 drops, and if the transfer pulse TRF transitions from the H level to the L level at the time $t_9$, the transfer of the electric charges from the PD 101 to the FD 106 ends, and the VSL voltage becomes the signal level (voltage) corresponding to the electric charges charged in the FD 106.

Further, after the P phase ends, the reference signal generating circuit 130 increases the reference signal to, for example, the same voltage as that when the P phase starts.

As described above, if the VSL voltage becomes the voltage corresponding to the electric charges charged in the FD 106, and the reference signal is increased to the same voltage as that when the P phase starts, the magnitude relation between the reference signal and the VSL voltage is reversed again.

As a result, the comparator output VCO of comparator 140 transitions to the H level.

After the reference signal is increased to the same voltage as that when the P phase starts, the reference signal generating circuit 130 decrease (drops) the voltage of the reference voltage, for example, at a rate of the same change as the case of the P phase using a certain period of time from the time $t_{10}$ to a time $t_{12}$ (which need not coincide with a certain period of time (P phase) from the time $t_5$ to the time $t_7$) as the AD conversion period for the signal level.

Therefore, the reference signal in the period from the time $t_{10}$ to the time $t_{12}$ forms a slope similarly to the reference signal of the P phase in the period from the time $t_5$ to the time $t_7$.

The slope of the reference signal in the period from the time $t_{10}$ to the time $t_{12}$ is the slope for performing the AD conversion on the signal level of the VSL voltage (the VSL voltage immediately after the electric charges are transferred from the PD 101 to the FD 106 in the pixel 110 (FIG. 3)) and the period of the slope (the period from the time $t_{10}$ to the time $t_{12}$) is also referred to as a "data (D) phase." Further, the slope of the D phase is also referred to as a "D phase slope."

Here, at the start time $t_{10}$ of D phase, the reference signal becomes higher than the VSL voltage as in the case of the start time $t_5$ of P phase. Therefore, the comparator output VCO of the comparator 140 becomes the H level representing that the reference signal is higher than the VSL voltage at the start time $t_{10}$ of D phase.

The counter 150 starts to count the clock at the start timing of the AD conversion period for the signal level, that is, the start time $t_{10}$ of the D phase slope.

In the D phase, (the voltage of) the reference signal is decreased, and in FIG. 4, the reference signal coincides with the VSL voltage serving as the signal level at a time $t_{11}$ of the D phase, and the magnitude relation between the reference signal and the VSL voltage is reversed from that when the D phase starts.

As a result, the comparator output VCO of the comparator 140 is inverted from the H level at the time of the start of the D phase to the L level.

The comparator output VCO is inverted and transitions to the L level, and the counter 150 stops the counting of the reference clock. Further, the count value of the counter 150 at that time is the AD conversion result of the signal level (the signal level AD value).

Accordingly, in the column signal processing unit 4, the reset level AD value is obtained in the P phase, the signal level AD value is obtained in the D phase, and the digital CDS for obtaining a difference between the reset level AD value and the signal level AD value is further performed. Further, the difference obtained as a result of digital CDS is output as the pixel value.

Note that, in the counter 150, the digital CDS can be performed while performing the AD conversions of the P phase and the D phase.

In other words, for example, it is possible to perform the digital CDS together with the AD conversions of the P phase and the D phase by performing the counting serving as the AD conversion of the P phase in a negative direction, using a counting result of the P phase as an initial value, and performing the counting serving as the AD conversion of the D phase in a positive direction.

Further, for example, it is possible to perform the digital CDS together with the AD conversions of the P phase and the D phase by performing the counting of the P phase in the positive direction, using a complement of a counting result of the P phase (a value obtained by changing a sign of the counting result to be negative) as an initial value, and performing the counting of the D phase in the positive direction.

<Exemplary Configuration of Counter 150>

Figure 5:
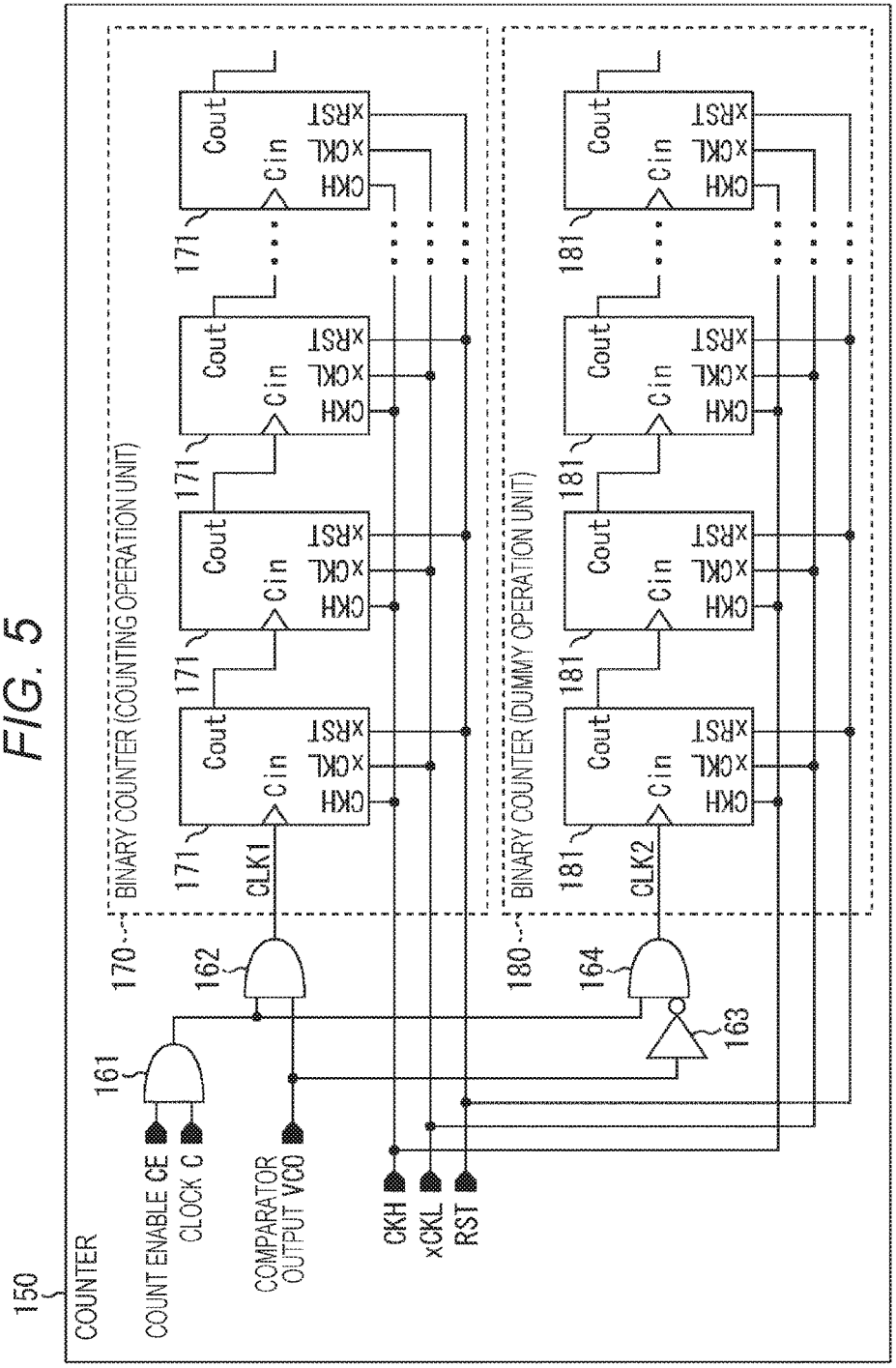
FIG. 5 is a circuit diagram illustrating an exemplary configuration of a counter 150.

FIG. 5 is a circuit diagram illustrating an exemplary configuration of the counter 150 in FIG. 2.

In FIG. 5, the counter 150 is a binary counter that counts the count value using a binary code.

In FIG. 5, counter 150 includes AND gates 161 and 162, NOT gate 163, AND gate 164, and binary counter 170 and 180.

Further, a count enable signal CE, a reference clock C, the comparator output VCO, a signal CKH, a signal xCKL, and a counter reset signal xRST are supplied to the counter 150.

Here, the reference clock C is supplied from the reference clock generating circuit 131 (FIG. 2), and the comparator output VCO is supplied from the comparator 140. For example, the remaining signals, that is, the count enable signals CE, the signal CKH, the signal xCKL, and the counter reset signal xRST are supplied from the system control unit 6 (FIG. 1).

The AND gate 161 outputs an AND operation result of the count enable CE and the reference clock C.

Here, the count enable signal CE is a signal that permits the counting of the counter 150, and has the H level only in the periods of the P phase and the D phase.

Therefore, the reference clock C supplied to the AND gate 161 passes through the AND gate 161 only in the periods of the P phase and the D phase.

The AND gate 162 supplies an AND operation result of an output of the AND gate 161 and the comparator output VCO to the binary counter 170 as a signal CLK1.

Therefore, in a case where the comparator output VCO is the H level, that is, in a case where the reference signal is higher than the VSL voltage, the reference clock C output from the AND gate 161 (passing through the AND gate 161) passes through the AND gate 162 and is supplied (output) to the binary counter 170 as the signal CLK1.

The NOT gate 163 inverts the comparator output VCO and supplies the inverted comparator output VCO to the AND gate 164.

The AND gate 164 supplies an AND operation result of the output of the AND gate 161 and the inversion result of the comparator output VCO output from the NOT gate 163 to the binary counter 180 as a signal CLK2.

Therefore, in a case where the comparator output VCO is inverted from the H level to the L level, that is, in a case where the reference signal is not higher than the VSL voltage, the reference clock C output from the AND gate 161 passes through the AND gate 164 and is supplied (output) to the binary counter 180 as the signal CLK2.

The binary counter 170 is a sort of counting operation unit that performs the counting operation for counting the count value and includes N D-flip flops (FFs) 171 which are equal in number to the number of bits according to a resolution of the AD conversion performed by the column signal processing unit 4 (the number of bits indicating the AD conversion result).

In the binary counter 170, the N D-FFs 171 are connected in series such that a terminal Cout of each D-FF 171 is connected to a terminal Cin of a next D-FF 171 and constitutes a ripple counter of counting the count value using the binary code.

Note that the output of the AND gate 162 is connected to the terminal Cin of the first D-FF 171 among the N D-FFs 171. Therefore, the signal CLK1 (the reference clock C) output from the AND gate 162 is supplied to the terminal Cin of the first D-FF 171.

As described above, in a case where the comparator output VCO has the H level, that is, in a case where the reference signal is higher than the VSL voltage, the reference clock C is supplied to the binary counter 170 as the signal CLK1.

Therefore, in the binary counter 170, in the P phase and the D phase, in a case where the comparator output VCO has the H level, the counting operation for counting the count value is performed in accordance with the reference clock C.

Note that the D-FF 171 constituting the binary counter 170 operates in accordance with the signal CKH, the signal xCKL, and the counter reset signal xRST (the same applies to a D-FF 181 to be described later), and an operation thereof will be described later.

The binary counter 180 is a type of dummy operation unit that performs a dummy counting operation at a timing complementary to the counting operation of the binary counter 170 and has the same configuration as the binary counter 170 to perform the same counting operation as the binary counter 170.

In other words, the binary counter 180 includes N D-FFs 181, similarly to the binary counter 170. Further, the N D-FFs 181 are connected in series such that a terminal Cout of each D-FF 181 is connected to a terminal Cin of a next D-FF 181 and constitute the ripple counter.

Note that the output of the AND gate 164 is connected to the terminal Cin of the first D-FF 181 among the N D-FFs 181. Therefore, the signal CLK2 (the reference clock C) output from the AND gate 164 is supplied to the terminal Cin of the first D-FF 181.

As described above, in a case where the comparator output VCO is inverted from the H level to the L level, that is, in a case where the reference signal is not higher than the VSL voltage, the reference clock C is supplied to the binary counter 180 as the signal CLK2.

Therefore, in the binary counter 180, in the P phase and the D phase, in a case where the comparator output VCO is inverted from the H level to the L level, the counting operation for counting the count value is performed in accordance with the reference clock C.

As described above, in the P phase and the D phase, the binary counter 170 performs the counting operation in a case where the comparator output VCO has the H level, and in the P phase and the D phase, the binary counter 180 performs the counting operation in a case where the comparator output VCO has the L level.

Therefore, the binary counter 180 performs the counting operation at the timing complementary to the counting operation of binary counter 170 in the P phase and the D phase.

Further, in FIG. 5, the counter 150 employs the count value of the binary counter 170 as the AD conversion result for the VSL voltage, and the count value of the binary counter 180 is not particularly used. As described above, since the count value of the binary counter 180 is not used, the counting operation of the binary counter 180 for counting the count value can be regarded as the dummy counting operation.

Note that, in order to equalize charging and discharging currents at the time of the counting operations of the binary counter 170 and the binary counter 180, the binary counters 170 and 180 are layout-designed to have equal wiring loads.

Figure 6A:
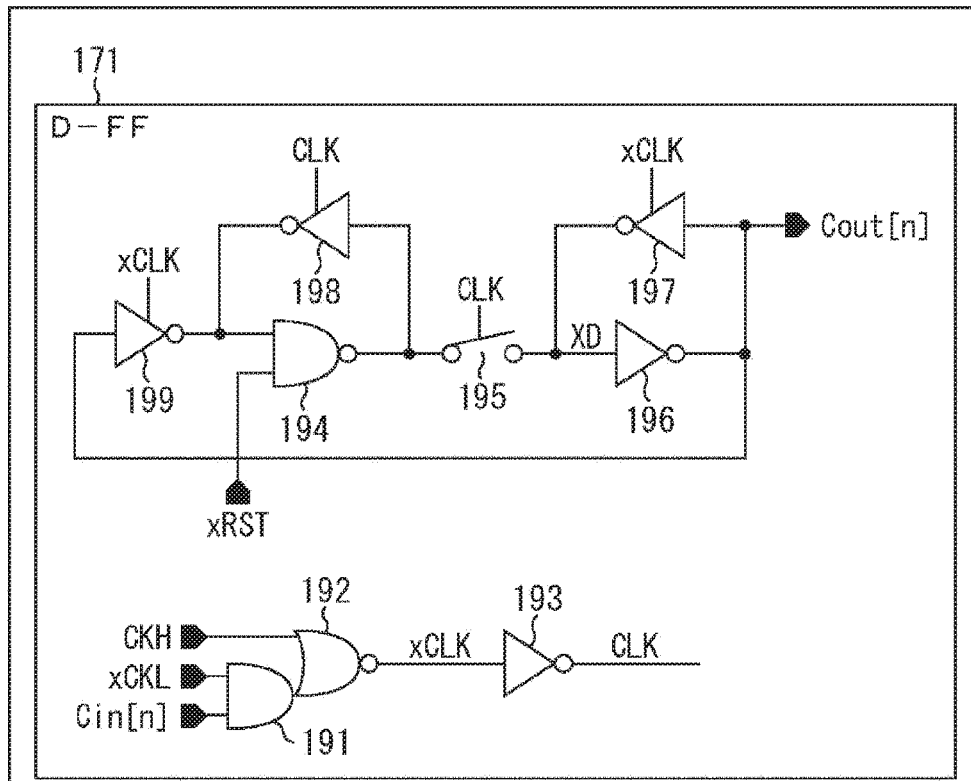
FIGS. 6A and 6B are diagrams illustrating an exemplary configuration and an exemplary operation of a D-FF 171.
Figure 6B:
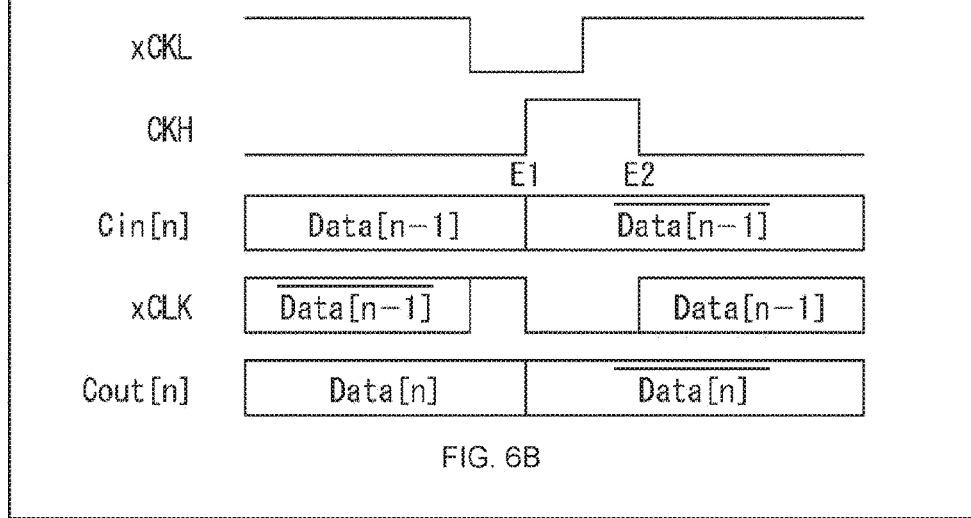

FIGS. 6A and 6B are diagrams illustrating an exemplary configuration and an exemplary operation of the D-FF 171 of FIG. 5.

In other words, FIG. 6A illustrates the exemplary configuration of the D-FF 171.

The D-FF 171 includes an AND gate 191, a NOR gate 192, a NOT gate 193, a NAND gate 194, a switch 195, and NOT gate 196, 197, 198, and 199.

Here, a signal supplied to a terminal Cin of an (n+1)-th D-FF 171 among the N D-FFs 171 constituting the binary counter 170 is also referred to as Cin[n] (n=0, 1, ..., N−1).

Further, a signal output from a terminal Cout of the (n+1)-th D-FF 171 among the N D-FFs 171 constituting the binary counter 170 is also referred to as Cout[n].

The signal Cin[n] is also a signal Cout[n−1] which is output from a terminal Cout of an n-th D-FF 171 at a stage prior to the (n+1)-th D-FF 171, and the signal Cout[n] is also a signal Cin[n+1] which is supplied to a terminal Cin of an (n+2)-th D-FF 171 at a stage subsequent to the (n+1)-th D-FF 171.

In the (n+1)-th D-FF 171, the AND gate 191 outputs an AND operation result of the signal Cin[n] (the reference clock C output as the signal CLK1 from the AND gate 162 (FIG. 5) in the first D-FF 171) and the signal xCKL.

The NOR gate 192 outputs a NOR operation result of the signal CKH and the output of the AND gate 191 as the signal xCLK.

The NOT gate 193 outputs the signal CLK obtained by inverting the signal xCLK output from the NOR gate 192.

The signal xCLK is supplied to the NOT gates 197 and 199 as a control signal. The signal CLK is supplied to the switch 195 and the NOT gate 198 as a control signal.

The NAND gate 194 outputs a NAND operation result of the counter reset signal xRST and the output of the NOT gate 198 or 199.

The switch 195 is turned on or off when the signal CLK has the H level or the L level, and supplies the output of the NAND gate 194 to the NOT gate 196 in the ON state.

The NOT gate 196 inverts the output of the NAND gate 194 or the output of the NOT gate 197 supplied via the switch 195 and outputs the inverted signal as the signal Cout[n].

The NOT gate 197 enters a high impedance state in a case where the signal xCLK has the L level, and inverts and outputs the output of the NOT gate 196 (the signal Cout[n]) in a case where the signal xCLK has the H level.

The NOT gate 198 enters the high impedance state in a case where the signal CLK has the L level, and inverts and outputs the output of the NAND gate 194 in a case where the signal CLK has the H level.

The NOT gate 199 enters the high impedance state in a case where the signal xCLK has the L level, and inverts and outputs the output of the NOT gate 196 (the signal Cout[n]) in a case where the signal xCLK has the H level.

In the (n+1)-th D-FF 171 having the above configuration, the signal Cout[n] is reset to the L level when the counter reset signal xRST temporarily transitions to the L level.

Then, in the D-FF 171, the signal Cin[n] (the reference clock C output as the signal CLK1 from the AND gate 162 (FIG. 5) in the first D-FF 171) is divided and a division result is the signal Cout[n] and supplied to the subsequent D-FF 171 as the signal Cin[n+1].

An N-bit bit string configured with signals Cout[0] to Cout[N−1] is the count value of the binary code.

Note that the D-FF 181 has a similar configuration to that of the D-FF 171 of FIG. 6A.

FIG. 6B is a timing chart for describing the operation of the (n+1)-th D-FF 171.

Further, in FIG. 6B, Data[n] indicates a value (the H or L level) of Cout[n] of the (n+1)-th D-FF 171, Data[n] having a bar on a top thereof indicates a value obtained by inverting Data[n].

If the P phase ends, the system control unit 6 (FIG. 1) causes the signal xCKL to temporarily transition to the L level and then causes the signal CKH to temporarily transition to the H level.

Note that a timing of a rising edge E1 of the H level of the signal CKH is within a period in which the signal xCKL has the L level, and a timing of a falling edge E2 of the H level of the signal CKH is a timing after the signal xCKL having the L level returns to the H level.

The signal Cout[n] output from the D-FF 171 is locked when the signal xCKL transitions to the L level.

Furthermore, if the signal CKH transitions to the H level in a state in which the signal xCKL has the L level, the signal Cout[n] is inverted at the timing of the rising edge E1 of the signal CKH.

In FIG. 6B, Cout[n−1] (=Data[n−1]) of the n-th D-FF 171 at a stage prior to the (n+1)-th D-FF 171 is set inverted at the timing of the rising edge E1 of the signal CKH as the signal Cin[n].

Furthermore, in FIG. 6B, the signal xCLK is inverted in accordance with the inversion of the signal Cin[n].

The signals Cout[0] to Cout[N−1] of the N D-FFs 171 are inverted as described above, and thus the inverted signals Cout[0] to Cout[N−1] are a complement umber of the binary code indicated by the signals Cout[0] to Cout[N−1] before the inversion.

Therefore, if the counting operation of the D phase is performed using the signals Cout[0] to Cout[N−1] obtained by inverting the signals Cout[0] to Cout[N−1] obtained by the counting operation of the P phase as an initial value, it is possible to perform the digital CDS of subtracting the AD conversion result of the P phase from the AD conversion result of the D phase.

<AD Conversion Operation>

Figure 7:
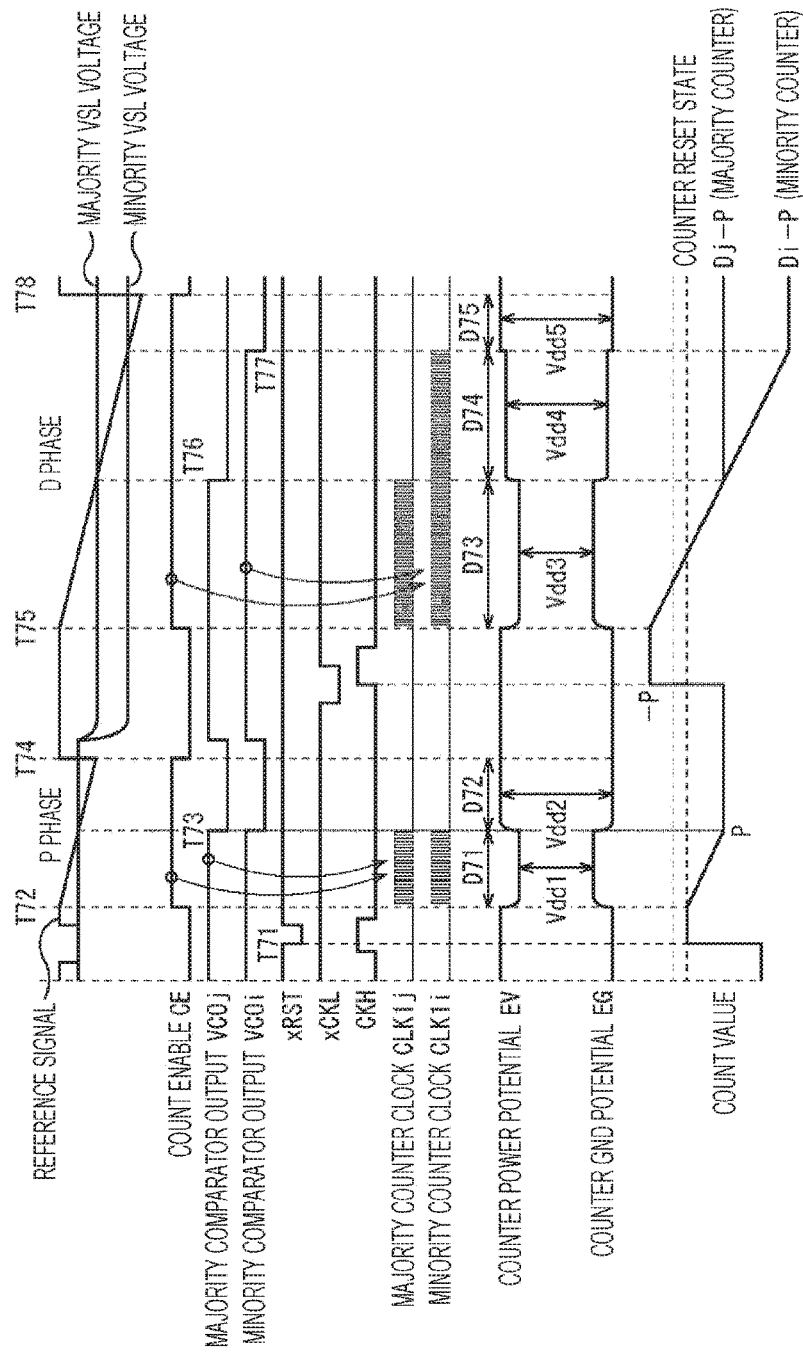
FIG. 7 is a timing chart for describing an example of an AD conversion operation in a case where a binary counter 180 is not operated in a counter 150.

FIG. 7 is a timing chart for describing an example of the AD conversion operation in a case where the column signal processing unit 4 includes the counter 150 having the configuration of FIG. 5.

However, in FIG. 7, the binary counter 170 serving as the counting operation unit in the counter 150 in FIG. 5 is operated, but the binary counter 180 serving as the dummy operation unit is not operated.

As described above, in the column signal processing unit 4, the VSL voltages (the pixel signals) of the H pixels in one row are simultaneously subject to the AD conversion.

In the present embodiment, in the H pixels whose VSL voltages are simultaneously subject to the AD conversion, for example, levels of the pixel signals of a majority of pixels are assumed to be low, and levels of the pixel signals of a minority of pixels are assumed to be high.

Hereinafter, a majority of pixels having a low pixel signal level are also referred to "majority pixels," and a minority of pixels having a high pixel signal level are also referred to as "minority pixels." Further, a VSL voltage of the majority pixel is also referred to as a "majority VSL voltage," and a VSL voltage of the minority pixel is also referred to as a "minority VSL voltage."

Further, hereinafter, the comparator output VCO of the comparator 140 that compares the majority VSL voltage with the reference signal is also referred to as a majority comparator output VCOj, and the comparator output VCO of the comparator 140 that compares the minority VSL voltage with the reference signal is also referred to as a minority comparator output VCOi.

Further, hereinafter, the reference clock C supplied as the signal CLK1 to the first D-FF 171 constituting the binary counter 170 constituting the counter 150 (FIG. 5) that counts the count value in accordance with the majority comparator output VCOj is also referred to as a majority counter clock CLK1j. Similarly, the reference clock C supplied as the signal CLK1 to the first D-FF 171 constituting the binary counter 170 constituting the counter 150 (FIG. 5) that counts the count value in accordance with the minority comparator output VCOi is also referred to as a minority counter clock CLK1i.

The majority counter clock CLK1j and the minority counter clock CLK1i alternately toggle between the L level and the H level in a case where the binary counter 170 of the counter 150 performs the counting operation.

The reference signal, the majority VSL voltage, the minority VSL voltage, the count enable signal CE, the majority comparator output VCOj, the minority comparator output VCOi, the counter reset signal xRST, the signal xCKL, the signal CKH, the majority counter clock CLK1j, the minority counter clock CLK1i, a counter power potential EV, a counter GND potential EG, and the count value are illustrated in FIG. 7.

Here, the counter power potential EV indicates a potential of the power source of the counter 150, and the counter GND potential EG indicates a potential of the GND of the counter 150.

The count value indicates the count value of the counter 150, that is, the count value of the binary code of the binary counter 170.

At a time T71 before the P phase starts, the counter reset signal xRST temporarily transitions to the L level, and thus the count value of the binary counter 170 is reset. In other words, the signals Cout[0] to Cout[N−1] of the N D-FFs 171 constituting the binary counter 170 transition to the L level.

The count enable signal CE transitions to the H level only in the P phase and the D phase.

Further, the comparator output VCO (the majority comparator output VCOj and the minority comparator output VCOi) has the H level when each of the P phase and the D phase starts.

In a case where the count enable signal CE has the H level, and the comparator output VCO has the H level, the reference clock C (the majority counter clock CLK1j or the minority counter clock CLK1i) is supplied to the binary counter 170.

In a case where the reference clock C (the majority counter clock CLK1j or the minority counter clock CLK1i) is supplied, the binary counter 170 performs the counting operation in synchronization with the reference clock C.

In FIG. 7, at a start time T72 of the P phase, the reference clock C (the majority counter clock CLK1j or the minority counter clock CLK1i) starts to be supplied to the binary counter 170, and the counting operation starts.

In the P phase, both the majority VSL voltage and the minority VSL voltage have the reset level, and thus in the comparator 140 that performs the AD conversion on the majority VSL voltage and the comparator 140 that performs the AD conversion on the minority VSL voltage, the comparator outputs VCO (the majority comparator output VCOj and the minority comparator output VCOi) are inverted at close timings.

In FIG. 7, at a time T73 of the P phase, both the majority comparator output VCOj and the minority comparator output VCOi are inverted from the H level to the L level.

If the majority comparator output VCOj is inverted to the L level, the supply of the reference clock C (the majority counter clock CLK1j) to the binary counter 170 of the counter 150 of the majority pixel (the counter 150 that performs the counting in accordance with the comparison result between the majority VSL voltage and the reference signal) is stopped. As a result, the binary counter 170 of the counter 150 of the majority pixel stops the counting operation.

Similarly, if the minority comparator output VCOi is inverted to the L level, the supply of the reference clock C (the minority counter clock CLK1i) to the binary counter 170 of the counter 150 of the minority pixel (the counter 150 that performs the counting in accordance with the comparison result between the minority VSL voltage and the reference signal) is stopped. As a result, the binary counter 170 of the counter 150 of the minority pixel stops the counting operation.

In FIG. 7, at a time T73 of the P phase, the majority comparator output VCOj and the minority comparator output VCOi are inverted to the L level, and all the binary counters 170 of the H counters 150 stop the counting operation accordingly. The count value of the binary counter 170 at that time is a value P.

Then, after the P phase ends, before the D phase starts, the signal xCKL temporarily transitions to the L level, and the signal CKH further temporarily transitions to the H level, and thus the count value of the P phase is inverted to a value −P as described above with reference to FIGS. 6A and 6B. A subsequent counting of the D phase is performed using the value −p as an initial value.

In FIG. 7, at a start time T75 of the D phase, the reference clock C (the majority counter clock CLK1j or the minority counter clock CLK1i) starts to be supplied to the binary counter 170, and the counting operation starts.

In the D phase, the majority VSL voltage and the minority VSL voltage are different, and thus the majority comparator output VCOj of the comparator 140 that performs the AD conversion on the majority VSL voltage and the minority comparator output VCOi of the comparator 140 that performs the AD conversion on the minority VSL voltage are inverted at different timings.

In FIG. 7, the majority comparator output VCOj is inverted from the H level to the L level at a time T76 of the D phase. If the majority comparator output VCOj is inverted to the L level, the supply of the reference clock C (the majority counter clock CLK1j) to the binary counter 170 of the counter 150 of the majority pixel is stopped. As a result, the binary counter 170 of the counter 150 of the majority pixel stops the counting operation.

The count value when the binary counter 170 of the counter 150 of the majority pixel stops the counting operation at the time T76 of the D phase is a value Dj−P. Here, Dj indicates the AD conversion result of the majority VSL voltage of the D phase.

Further, in FIG. 7, the minority comparator output VCOi is inverted from the H level to the L level at a time T77 after the time T76 of the D phase. If the minority comparator output VCOi is inverted to the L level, the supply of the reference clock C (the minority counter clock CLK1i) to the binary counter 170 of the counter 150 of the minority pixel is stopped. As a result, the binary counter 170 of the counter 150 of the minority pixel stops the counting operation.

The count value when the binary counter 170 of the counter 150 of the minority pixel stops the counting operation at the time T77 of the D phase is a value Di−P. Here, Di indicates the AD conversion result of the minority VSL voltage of the D phase.

In FIG. 7, the D phase ends at a time T78.

As described above, the binary counters 170 of the H counters 150 perform the counting operation from the start time T72 of the P phase to the time T73 at which the majority comparator output VCOj and the minority comparator output VCOi are inverted.

Further, the binary counter 170 of the counter 150 of the majority pixel among the H counters 150 performs the counting operation from the start time T75 of the D phase to the time T76 at which the majority comparator output VCOj is inverted.

Furthermore, the binary counter 170 of the counter 150 of the minority pixel among the H counters 150 performs the counting operation from the start time T75 of the D phase to the time T77 at which the minority comparator output VCOi is inverted.

In a case where the counter 150 performs the counting operation, since the operation current flows, the counter power potential EV decreases, and the counter GND potential EG increases, and as a result, the power voltage of the counter 150 which is the difference between the counter power potential EV and the counter GND potential EG decreases.

In FIG. 7, in a period D71 from the start time T72 of the P phase to the time T73 at which the majority comparator output VCOj and the minority comparator output VCOi are inverted, all the binary counters 170 of both the counter 150 of the majority pixel and the counter 150 of the minority pixel perform the counting operation, and thus a power voltage Vdd1 of the counter 150 in the period D71 is greatly reduced.

Further, in FIG. 7, in a period D72 from the time T73 to the end time T74 of the P phase, all the binary counters 170 of the counter 150 of the majority pixel and the counter 150 of the minority pixel stop the counting operation, and thus a power voltage Vdd2 of the counter 150 in the period D72 has substantially an original voltage.

Further, in FIG. 7, in a period D73 from the start time T75 of the D phase to the time T76 at which the majority comparator output VCOj is inverted, similarly to the case of the period D71, all the binary counters 170 of both the counter 150 of the majority pixel and the counter 150 of the minority pixel perform the counting operation, and thus a power voltage Vdd3 of the counter 150 in the period D73 is greatly reduced.

Further, in FIG. 7, in a period D74 from the time T76 at which the majority comparator output VCOj is inverted to the time T77 at which the minority comparator output VCOi is inverted, the binary counter 170 of the counter 150 of the majority pixel stops the counting operation, and the binary counter 170 of the counter 150 of the minority pixel performs the counting operation, and thus a power voltage Vdd4 of the counter 150 in the period D74 decreases by an amount corresponding to the counting operation of the binary counter 170 of the counter 150 of the minority pixel.

Further, in FIG. 7, in a period D75 from the time T77 at which the minority comparator output VCOi is inverted to the end time T78 of the D phase, all the binary counter 170 of both the counter 150 of the majority pixel and the counter 150 of the minority pixel stop the counting operation, and thus a power voltage Vdd5 of the counter 150 in the period D75 has substantially an original voltage similarly to the case of the period D72.

In FIG. 7, the power voltage Vdd1 in the period D71 and the power voltage Vdd3 in the period D73 are smallest since the binary counters 170 of all the H counters 150 perform the counting operation.

Further, the power voltage Vdd4 in the period D74 is lower than the original voltage since the binary counter 170 of only the counter 150 of the minority pixel among the H counters 150 performs the counting operation but higher than the power voltage Vdd1 in the period D71 and the power voltage Vdd3 in the period D73.

The power voltage Vdd2 in the period D72 and the power voltage Vdd5 in the period D75 are the original voltages and are highest among the power voltages Vdd1 to Vdd5.

As described above, in FIG. 7, in the period D73, all the binary counters 170 of both the counter 150 of the majority pixel and the counter 150 of the minority pixel perform the counting operation, but in the period D74, the binary counter 170 of the counter 150 of the majority pixel stops the counting operation, and the binary counter 170 of the counter 150 of the minority pixel performs the counting operation.

Therefore, the power voltage Vdd4 in the period D74 is greatly recovered from the power voltage Vdd3 in the period D73 by an amount corresponding to the binary counter 170 of the counter 150 of the majority pixel that has stopped the counting operation.

In the period D74, as described above, the power voltage Vdd4 is recovered, and thus a signal delay amount or the like inside the counter 150 fluctuates from the case of the period D73. As a result, in the binary counter 170 of the counter 150 of the minority pixel that performs the counting operation in both the period D73 and the period D74, there are cases in which the number of countings performed during a certain unit time of the period D73 does not coincide with the number of countings performed during a unit time of the period D74, and an error occurs in the AD conversion result.

The error of the AD conversion result caused by the fluctuation in the power voltage appears in a captured image captured by the imaging element as streaks.

Figure 8:
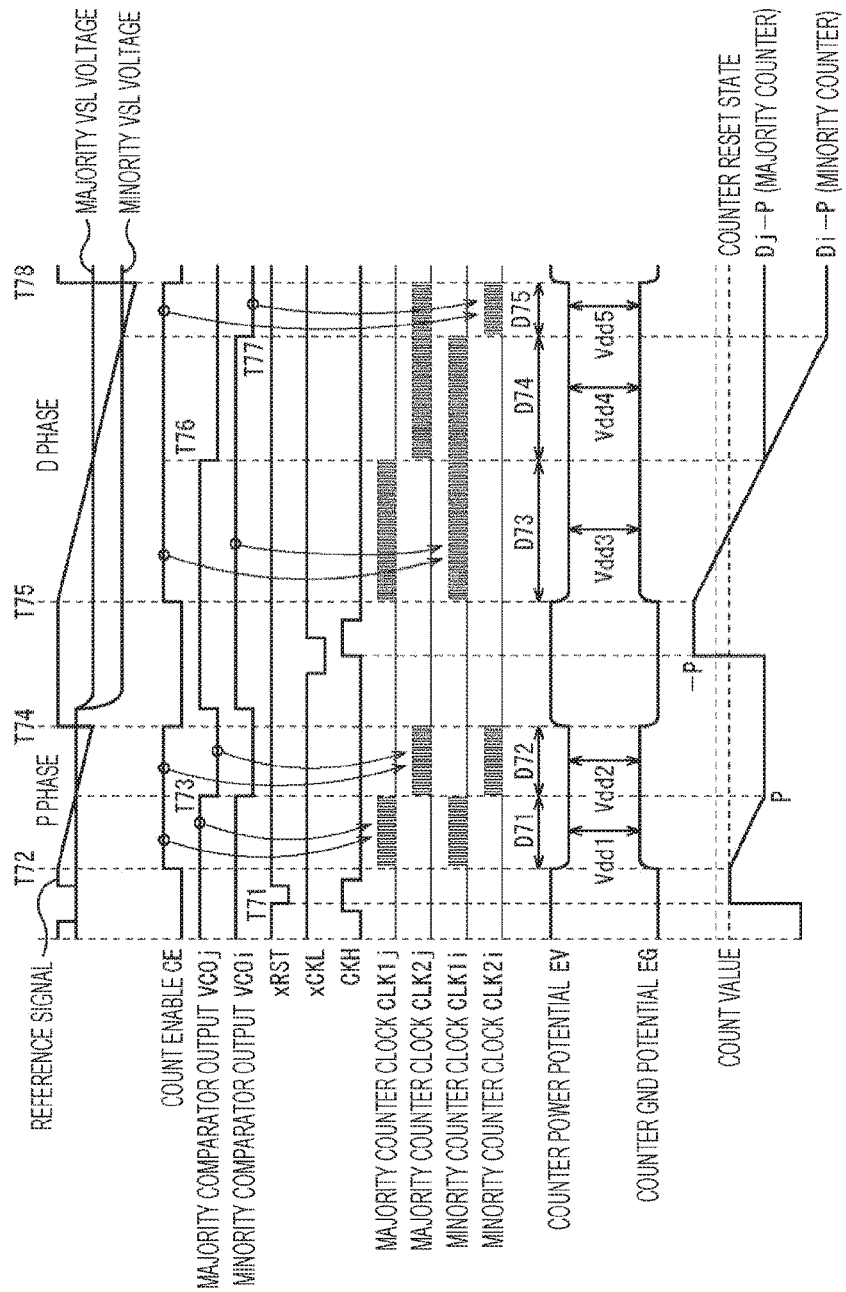
FIG. 8 is a timing chart for describing an example of an AD conversion operation in a case where binary counters 170 and 180 are operated in a counter 150.

FIG. 8 is a timing chart for describing an example of the AD conversion operation in a case where the binary counter 180 serving as the dummy operation unit is operated together with the binary counter 170 serving as the counting operation unit in the counter 150 in FIG. 5.

Similarly to FIG. 7, the reference signal, the majority VSL voltage, the minority VSL voltage, the count enable signal CE, the majority comparator output VCOj, the minority comparator output VCOi, the counter reset signal xRST, the signal xCKL, the signal CKH, the majority counter clock CLK1j, the minority counter clock CLK1i, the counter power potential EV, the counter GND potential EG, and the count value are illustrated in FIG. 8.

A majority counter clock CLK2j and a minority counter clock CLK2i are further illustrated in FIG. 8.

Here, the majority counter clock CLK2j indicates a reference clock C which is supplied as the signal CLK2 to the first D-FF 181 constituting the binary counter 180 serving as the dummy operation unit constituting the counter 150 (FIG. 5) that counts the count value in accordance with the majority comparator output VCOj.

The minority counter clock CLK2i indicates a reference clock C which is supplied as the signal CLK2 to the first D-FF 181 constituting the binary counter 180 constituting the counter 150 that counts the count value in accordance with the minority comparator output VCOi.

The majority counter clock CLK2j and the minority counter clock CLK2i alternately toggle between the L level and the H level, similarly to the majority counter clock CLK1j and the minority counter clock CLK1i.

The majority counter clock CLK2j or the minority counter clock CLK2i alternately toggles between the L level and the H level in a case where the binary counter 180 of counter 150 performs the dummy counting operation (hereinafter also referred to as a "dummy operation").

Note that, in FIG. 8, the reference signal, the majority VSL voltage, the minority VSL voltage, the count enable signal CE, the counter reset signal xRST, the signal xCKL, the signal CKH, the majority counter clock CLK1j, the minority counter clock CLK1i, and the count value are similar to those in FIG. 7, and thus description thereof is appropriately omitted.

As described above with reference to FIG. 7, in a case where the count enable signal CE has the H level, and the comparator output VCO has the H level, the reference clock C (the majority counter clock CLK1j or the minority counter clock CLK1i) is supplied to the binary counter 170 serving as the counting operation unit.

In a case where the reference clock C (the majority counter clock CLK1j or the minority counter clock CLK1i) is supplied, the binary counter 170 performs the counting operation in synchronization with the reference clock C.

On the other hand, in a case where the count enable signal CE has the H level, and the comparator output VCO has the L level, the reference clock C (the majority counter clock CLK2j or the minority counter clock CLK2i) is supplied to the binary counter 180 (FIG. 5) serving as the dummy operation unit.

In a case where the reference clock C (the majority counter clock CLK2j or the minority counter clock CLK2i) is supplied, the binary counter 180 performs the counting operation in synchronization with the reference clock C.

As described above with reference to FIG. 7, in the P phase, both the majority VSL voltage and the minority VSL voltage have the reset level, and thus in the comparator 140 that performs the AD conversion on the majority VSL voltage and the comparator 140 that performs the AD conversion on the minority VSL voltage, the comparator outputs VCO (the majority comparator output VCOj and the minority comparator output VCOi) are inverted at close timings.

In FIG. 8, similarly to FIG. 7, at a time T73 of the P phase, both the majority comparator output VCOj and the minority comparator output VCOi are inverted from the H level to the L level.

In the P phase, the binary counters 170 of the counter 150 of the majority pixel and the counter 150 of the minority pixel are supplied with the reference clock C (the majority counter clock CLK1j and the minority counter clock CLK1i) until the majority comparator output VCOj and the minority comparator output VCOi are inverted from the H level to the L level at the time T73. As a result, the binary counters 170 of the counter 150 of the majority pixel and the counter 150 of the minority pixel perform the counting operation.

If the majority comparator output VCOj is inverted to the L level at the time T73 of the P phase, the supply of the reference clock C (the majority counter clock CLK1j) to the binary counter 170 of the counter 150 of the majority pixel is stopped. As a result, the binary counter 170 of the counter 150 of the majority pixel stops the counting operation.

However, if the majority comparator output VCOj is inverted to the L level, the reference clock C (the majority counter clock CLK2j) starts to be supplied to the binary counter 180 of the counter 150 of the majority pixel. As a result, the binary counter 180 of the counter 150 of the majority pixel starts the counting operation serving as the dummy operation in synchronization with the reference clock C.

Similarly, if the minority comparator output VCOi is inverted to the L level, the supply of the reference clock C (the minority counter clock CLK1i) to the binary counter 170 of the counter 150 of the minority pixel is stopped. As a result, the binary counter 170 of the counter 150 of the minority pixel stops the counting operation.

However, if the minority comparator output VCOi is inverted to the L level, the reference clock C (the minority counter clock CLK2i) starts to be supplied to the binary counter 180 of the counter 150 of the minority pixel. As a result, the binary counter 180 of the counter 150 of the minority pixel starts the counting operation serving as the dummy operation in synchronization with the reference clock C.

In FIG. 8, at the time T73 of the P phase, the majority comparator output VCOj and the minority comparator output VCOi are inverted to the L level, and all the binary counters 170 of the H counters 150 stop the counting operation accordingly. The count value of the binary counter 170 at that time is the value P.

Further, in FIG. 8, all the binary counters 180 of the H counters 150 start the counting operation serving as the dummy operation in accordance with the inversion of the majority comparator output VCOj and the minority comparator output VCOi at the time T73 of the P phase.

Then, at an end time T74 of the P phase, the count enable signal CE transitions from the H level to the L level, and thus all the binary counters 180 of the H counters 150 stop the counting operation serving as the dummy operation.

Before the D phase starts after the P phase ends, the signal xCKL temporarily transitions to the L level, and the signal CKH temporarily transitions to the H level, and thus the count value of the P phase is inverted to the value −P as described above with reference to FIGS. 6A and 6B. The subsequent counting of the D phase is performed using the value −p as an initial value.

In FIG. 8, similarly to FIG. 7, at a start time T75 of the D phase, the reference clock C (the majority counter clock CLK1j or the minority counter clock CLK1i) starts to be supplied to the binary counter 170, and the counting operation is started.

In the D phase, the majority VSL voltage and the minority VSL voltage are different, and thus the majority comparator output VCOj of the comparator 140 that performs the AD conversion on the majority VSL voltage and the minority comparator output VCOi of the comparator 140 that performs the AD conversion on the minority VSL voltage are inverted at different timings.

In FIG. 8, the majority comparator output VCOj is inverted from the H level to the L level at a time T76 of the D phase, similarly to FIG. 7. If the majority comparator output VCOj is inverted to the L level, the supply of the reference clock C (the majority counter clock CLK1j) to the binary counter 170 of the counter 150 of the majority pixel is stopped. As a result, the binary counter 170 of the counter 150 of the majority pixel stops the counting operation.

The count value when the binary counter 170 of the counter 150 of the majority pixel stops the counting operation at the time T76 of the D phase is a value Dj−P.

If the majority comparator output VCOj is inverted to the L level at the time T76 of the D phase as described above, the reference clock C (the majority counter clock CLK2j) starts to be supplied to the binary counter 180 of the counter 150 of the majority pixel. As a result, the binary counter 180 of the counter 150 of the majority pixel starts the counting operation serving as the dummy operation in synchronization with the reference clock C.

In FIG. 8, the minority comparator output VCOi is inverted from the H level to the L level at a time T77 after the time T76 of the D phase. If the minority comparator output VCOi is inverted to the L level, the supply of the reference clock C (the minority counter clock CLK1i) to the binary counter 170 of the counter 150 of the minority pixel is stopped. As a result, the binary counter 170 of the counter 150 of the minority pixel stops the counting operation.

The count value when the binary counter 170 of the counter 150 of the minority pixel stops the counting operation at the time T77 of the D phase is a value Di−P.

If the minority comparator output VCOi is inverted to the L level at the time T77 of the D phase as described above, the reference clock C (the minority counter clock CLK2i) starts to be supplied to the binary counter 180 of the counter 150 of the minority pixel. Accordingly, the binary counter 180 of the counter 150 of the minority pixel starts the counting operation serving as the dummy operation in synchronization with the reference clock C.

Then, at an end time T78 of the D phase, the count enable signal CE transitions from the H level to the L level, and all the binary counters 180 of the H counters 150 stop the counting operation serving as the dummy operation accordingly.

As described above, the binary counter 170 of the H counter 150 performs a counting operation similar to the case of FIG. 7.

In other words, the binary counters 170 of the H counters 150 perform the counting operation from the start time T72 of the P phase to the time T73 at which the majority comparator output VCOj and the minority comparator output VCOi are inverted.

Further, the binary counter 170 of the counter 150 of the majority pixel among the H counters 150 performs the counting operation from the start time T75 of the D phase to the time T76 at which the majority comparator output VCOj is inverted.

Furthermore, the binary counter 170 of the counter 150 of the minority pixel among the H counters 150 performs the counting operation from the start time T75 of the D phase to the time T77 at which the minority comparator output VCOi is inverted.

On the other hand, in the P phase, the binary counters 180 of the H counters 150 perform the counting operation serving as the dummy operation from time T73 at the majority comparator output VCOj and the minority comparator output VCOi are inverted to end time T73 of the P phase.

Further, in the D phase, the binary counter 180 of the counter 150 of the majority pixel among the H counters 150 performs the counting operation serving as the dummy operation from the time T76 at which the majority comparator output VCOj is inverted to the end time T78 of the D phase.

Furthermore, in the D phase, the binary counter 180 of the counter 150 of the minority pixel among the H counters 150 performs the counting operation serving as the dummy operation from the time T77 at which the minority comparator output VCOi is inverted to the end time T78 of the D phase.

Therefore, in a case where the binary counter 180 serving as the dummy operation unit is operated together with the binary counter 170 serving as the counting operation unit in the counter 150, in the counter 150 of the majority pixel, if the binary counter 170 performs the counting operation in the P phase and the D phase, the binary counter 180 stops the dummy operation. Further, in a case where the binary counter 170 stops the counting operation, the binary counter 180 performs the dummy operation.

Similarly, even in the counter 150 of the minority pixel, if the binary counter 170 performs the counting operation in the P phase and the D phase, the binary counter 180 stops the dummy operation. Further, if the binary counter 170 stops the counting operation, the binary counter 180 performs the dummy operation.

As described above, in the counter 150, in the P phase and the D phase, the binary counter 170 performs the counting operation, or the binary counter 180 performs the dummy operation. Therefore, the operation current of the counter 150 becomes constant (uniform) over the P phase and the D phase, and the power voltage of the counter 150 also becomes constant regardless of an imaging condition (a subject shape, a luminance, or the like).

In other words, in FIG. 8, the power voltage Vdd1 of the counter 150 in the period D71 from the start time T72 of the P phase to the time 173 at which the majority comparator output VCOj and the minority comparator output VCOi are inverted, the power voltage Vdd2 of the counter 150 in the period D72 from the time T73 to the end time T74 of the P phase, the power voltage Vdd3 of the counter 150 in the period D73 from the start time T75 of the D phase to the time T76 at which the majority comparator output VCOj is inverted, the power voltage Vdd4 of the counter 150 in the period D74 from the time T76 at which the majority comparator output VCOj is inverted to the time T77 at which the minority comparator output VCOi is inverted, and the power voltage Vdd5 of the counter 150 in the period D75 from the time T77 at which the minority comparator output VCOi is inverted to the end time T78 of the D phase are the same.

As a result, it is possible to prevent the occurrence of an error in the AD conversion result and the occurrence of streaks caused by the fluctuation in (the fluctuation amount of) the power voltage of the counter 150 described above with reference to FIG. 7.

<Second Exemplary Configuration of Column Signal Processing Unit 4>

Figure 9:
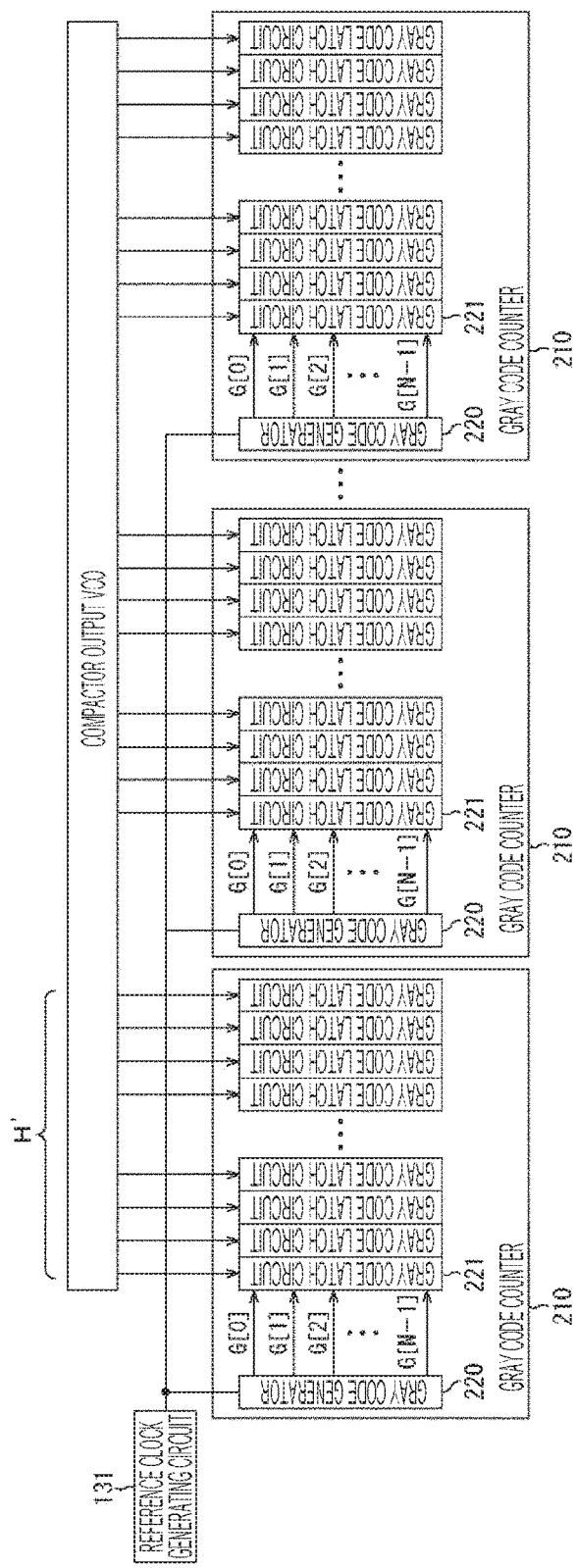
FIG. 9 is a block diagram illustrating a second exemplary configuration of a column signal processing unit 4.

FIG. 9 is a block diagram illustrating a second exemplary configuration of the column signal processing unit 4 of FIG. 1.

Note that, in FIG. 9, parts corresponding to those in FIG. 2 are denoted by the same reference numerals, and description thereof will be appropriately omitted below.

Further, the bias circuit 120, the reference signal generating circuit 130, the comparator 140, and the capacitors 141 and 142 are not illustrated in FIG. 9.

The column signal processing unit 4 of FIG. 9 differs from that of FIG. 2 in that gray code counters 210 that are smaller in number than H are arranged instead of the H counters 150 that count the count values of the binary code.

The gray code counter 210 is arranged for every H' (<H) columns which are a predetermined number of columns and functions to count the count value serving as the AD conversion of the pixel signals of the pixels 110 included in the H' columns for which the gray code counter 210 is arranged.

The gray code counter 210 is supplied with the comparator outputs VCO of H' comparators 140 connected with the pixels 110 in the H' column for which the gray code counter 210 undertakes the AD conversion via the VSL 8.

The gray code counter 210 includes a gray code generator 220 and H' gray code latch circuits 221 and counts a count value of a gray code in accordance with the comparator outputs VCO of the H' comparators 140.

The reference clock C is supplied from the reference clock generating circuit 131 to the gray code generator 220.

In synchronization with the reference clock C from the reference clock generating circuit 131, the gray code generator 220 generates an N-bit gray code and supplies the N-bit gray code to H' gray code latch circuits 221.

Here, an (n+1)-th bit from the least significant bit of the N-bit gray code is referred to as a bit G[n] (n=0, 1, ..., N−1).

The gray code latch circuit 221 is supplied with the gray code from the gray code generator 220 and the comparator output VCO of the comparator 140 connected with the pixels 110 in the columns corresponding to the gray code latch circuit 221 via the VSL 8.

In other words, the gray code latch circuit 221 is arranged for each column of the pixels 110, and the comparator output VCO of the comparator 140 of the column corresponding to the gray code latch circuit 221 is supplied to the gray code latch circuit 221.

The gray code latch circuit 221 sequentially latches the gray code synchronized with the reference clock C supplied from the gray code generator 220 when the supplied comparator output VCO has the H level. Then, if the supplied comparator output VCO is inverted to the L level, the gray code latch circuit 221 stops the latching of the new gray code and maintains the latching of the gray code latched at that time.

<Exemplary Configuration of Gray Code Latch Circuit 221>

Figure 10:
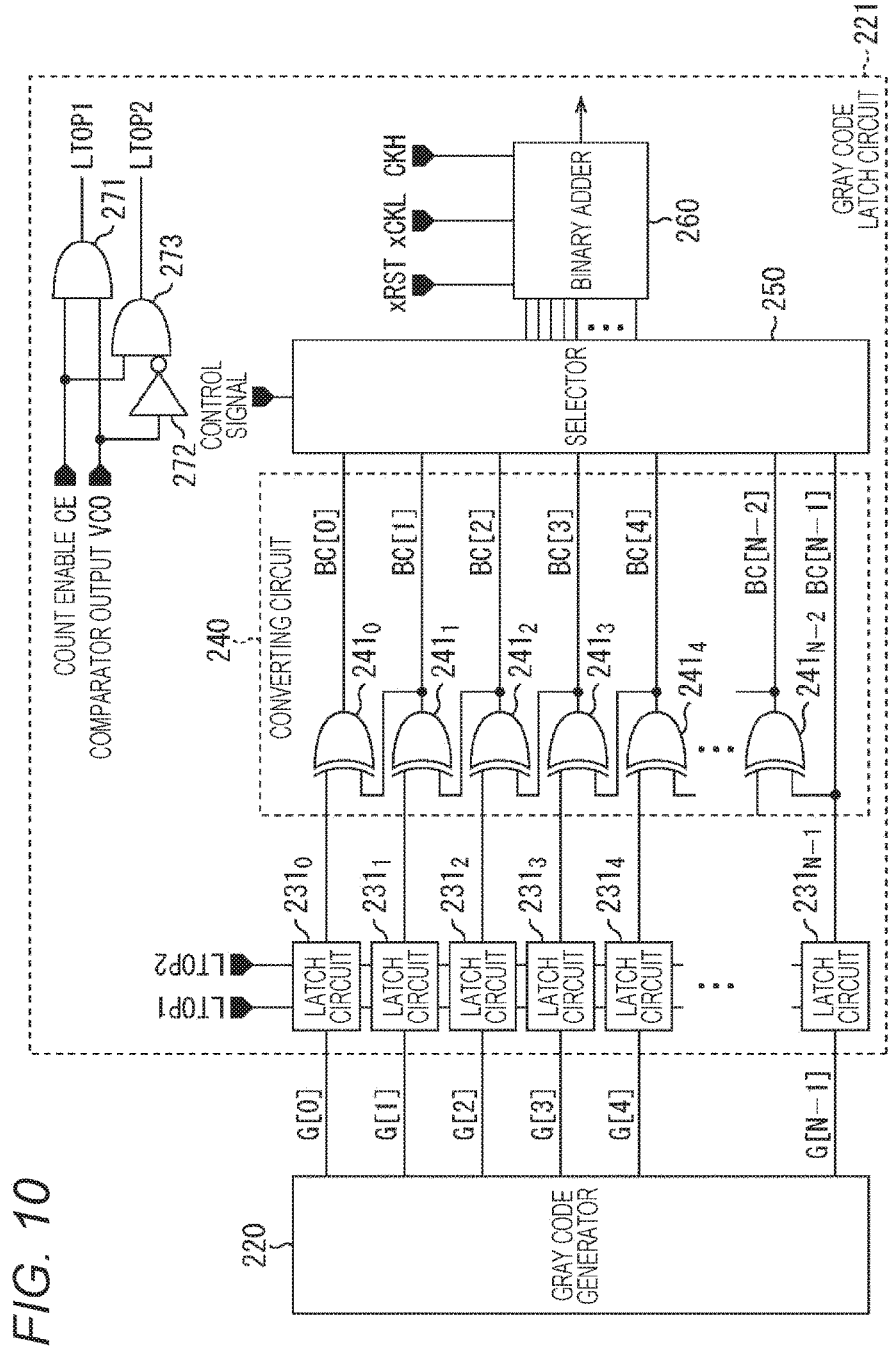
FIG. 10 is a circuit diagram illustrating an exemplary configuration of a gray code latch circuit 221.

FIG. 10 is a circuit diagram illustrating an exemplary configuration of the gray code latch circuit 221 of FIG. 9.

Referring to FIG. 10, the gray code latch circuit 221 includes N latch circuits $231_0$ to $231_{N-1}$, a converting circuit 240, a selector 250, a binary adder 260, an AND gate 271, a NOT gate 272, and an AND gate 273.

The bit G[n] of the N-bit gray code is supplied from the gray code generator 220 to the latch circuit $231_n$. The latch circuit $231_n$ latches the bit G[n] of the gray code supplied from the gray code generator 220 in accordance with signals LTOP1 and LTOP2 supplied thereto.

In order to add the count value of the gray code, the converting circuit 260 converts the N-bit gray code including bits G[0] to G[N−1] which are latched in the N latch circuits $231_0$ to $231_{N-1}$ into an N-bit binary code, and supplies the N-bit binary code to the selector 250.

In other words, the converting circuit 260 includes N−1 exclusive OR (EXOR) gates $241_0$ to $241_{N-2}$.

The EXOR gate $241_n$ outputs an EXOR operation result of the output of the latch circuit $231_n$ (the bit G[n] latched in the latch circuit $231_n$) and an output BC[n+1] of the EXOR gate $241_{n+1}$ 1-bit higher than it as an (n+1)-th bit BC[n+1] from the least significant bit of the N bit binary code.

However, only the EXOR gate $241_{N-2}$ of the (N−1)-th bit from the least significant bit outputs an EXOR operation result of an output of the latch circuit $231_{N-2}$ (bit G[N−2]) and the output of the latch circuit $231_{N-1}$ (bit G[N−1]) as the (N−1)-th bit BC[N−2] from the least significant bit of the N-bit binary code.

Further, the converting circuit 240 outputs the output of the latch circuit $231_{N-1}$ (bit G[N−1]) as the most significant bit (an N-th bit from the least significant bit) BC[N−1] of the N-bit binary code without change.

For example, a control signal is supplied from the system control unit 6 (FIG. 1) to the selector 250. In accordance with the control signal from the system control unit 6, the selector 250 sequentially selects the N-bit binary code supplied from the converting circuit 240, for example, from the least significant bit, and supplies the binary code to the binary adder 260.

The binary adder 260 is supplied with the N-bit binary code from the selector 250 and supplied from the signal CKH, the signal xCKL, and the counter reset signal xRST from system control unit 6.

In accordance with the signal CKH, the signal xCKL, and the counter reset signal xRST, the binary adder 260 performs an addition (binary addition) of the binary code obtained in the P phase and the binary code obtained in the D phase which are supplied from the selector 250. The digital CDS is performed through the binary addition.

The binary adder 260 outputs the added value obtained by the binary addition as the pixel value obtained as a result of performing the AD conversion and the digital CDS.

The AND gate 271 outputs an AND operation result of the count enable CE supplied from the system control unit 6 and the comparator output VCO supplied from the comparator 140 as the signal LTOP1.

The NOT gate 272 inverts and outputs the comparator output VCO supplied from the comparator 140.

The AND gate 273 outputs an AND operation result of the count enable CE supplied from the system control unit 6 and the output of the NOT gate 272, that is, a signal obtained by inverting the comparator output VCO as the signal LTOP2.

Here, the count enable signal CE has the H level only in the periods of the P phase and the D phase as described with reference to FIG. 5.

Further, the comparator output VCO has the H level in a case where the reference signal is higher than the VSL voltage (the pixel signal) and has the L level in a case where the reference signal is not higher than the VSL voltage (the pixel signal) (in a case where the magnitude relation between the reference signal and the VSL voltage is changed).

Therefore, in the P phase or the D phase, the signal LTOP1 output from the AND gate 271 has the H level while the reference signal is higher than the VSL voltage, and has the L level in a case where the reference signal is not higher than the VSL voltage.

On the other hand, the signal LTOP2 output from the AND gate 273 is a signal complementary to the signal LTOP1. In other words, in the P phase or the D phase, the signal LTOP2 has the L level while the reference signal is higher than the VSL voltage, and has the H level in a case where the reference signal is not higher than the VSL voltage.

Note that, in gray code latch circuit 221 of FIG. 10, in order to perform the digital CDS through the binary addition of the binary code obtained in the P phase and the binary code obtained in the D phase, the converting circuit 240 converts the gray code into the binary code, and the binary code is supplied to the binary adder 260 via the selector 250 and subject to the binary addition.

As described above, the digital CDS may be performed inside the gray code latch circuit 221 or may be performed outside the gray code latch circuit 221. In other words, for example, the digital CDS may be performed by a processor such as a digital processing unit (DPU) (not illustrated) outside the gray code latch circuit 221. In this case, the gray code latch circuit 221 may be configured without including the converting circuit 240, the selector 250, and the binary adder 260 for performing digital CDS.

Figure 11:
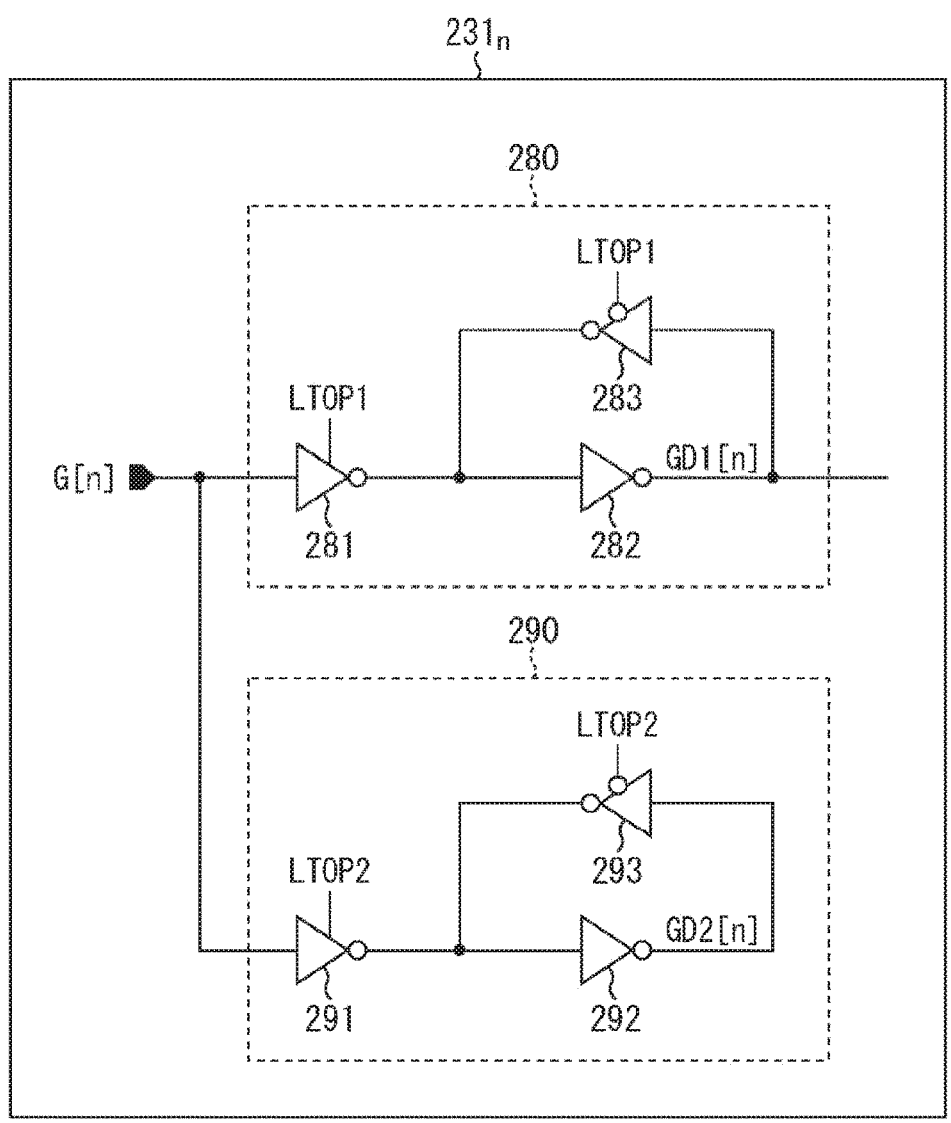
FIG. 11 is a circuit diagram illustrating an exemplary configuration of a latch circuit $231_n$.

FIG. 11 is a circuit diagram illustrating an exemplary configuration of the latch circuit $231_n$ of FIG. 10.

The latch circuit $231_n$ includes latch circuits 280 and 290.

The latch circuit 280 is a sort of counting operation unit that latches the bit G[n] of the count value of the gray code output from the gray code generator 220 as (part of) the counting operation for counting the count value.

The latch circuit 280 includes NOT gates 281, 282, and 283.

The NOT gate 281 enters the high impedance state when the signal LTOP1 has the L level, and inverts and outputs the bit G[n] of the gray code output from the gray code generator 220 (FIG. 10) when the signal LTOP1 has the H level.

The NOT gate 282 inverts the output of the NOT gate 281 or 283, and outputs an (n+1)-th bit GD1[n] from the least significant bit of the count value of the gray code serving as the AD conversion result of the VSL voltage (the pixel signal).

The NOT gate 283 enters the high impedance state when the signal LTOP1 has the H level, and inverts and outputs the output of the NOT gate 282 (the bit GD1[n]) when the signal LTOP1 has the L level.

Here, as described above with reference to FIG. 10, in the P phase or the D phase, the signal LTOP1 has the H level in a case where the comparator output VCO has the H level and has the L level in a case where the comparator output VCO has the L level.

Therefore, in the P phase or the D phase, in a case where the comparator output VCO has the H level, the NOT gate 281 enters the operation state, and the NOT gate 283 enters the high impedance state (an open state).

As a result, the latch circuit 280 performs the counting operation of latching the bit G[n] of the gray code output from the gray code generator 220 as the bit GD1[n] which is the output of the NOT gate 282 through the NOT gates 281 and 282, and the bit GD1[n] alternately toggles between the H level and the L level in accordance with the bit G[n] of the gray code.

On the other hand, if the comparator output VCO is inverted to the L level in the P phase or the D phase, the NOT gate 281 enters the high impedance state, and the NOT gate 283 enters the operation state.

As a result, in the latch circuit 280, the counting operation by the NOT gate 281 and 282 is stopped. Further, in the latch circuit 280, the bit GD1[n] output from the NOT gate 282 when the comparator output VCO is inverted to the L level is maintained as the bit GD1[n] which is the output of the NOT gate 282 through the NOT gates 282 and 283.

The latch circuit 290 is a sort of dummy operation unit that performs the dummy counting operation (the dummy operation) at a timing complementary to the counting operation of the latch circuit 280 and includes the same configuration as the latch circuit 280 in order to perform the same counting operation as the latch circuit 280.

In other words, the latch circuit 290 includes NOT gates 291, 292, and 293, similarly to the latch circuit 280.

The NOT gate 291 enters the high impedance state when the signal LTOP2 has the L level, and inverts and outputs the bit G[n] of the gray code output from the gray code generator 220 (FIG. 10) when the signal LTOP2 has the H level.

The NOT gate 292 inverts the output of the NOT gate 291 or 293 and outputs the inverted output as a bit GD2[n].

The NOT gate 293 enters the high impedance state when the signal LTOP2 has the H level, and inverts and outputs the output (bit GD2[n]) of the NOT gate 292 when the signal LTOP2 has the L level.

Here, as described above with reference to FIG. 10, in the P phase or the D phase, in a case where the comparator output VCO has the L level, the signal LTOP2 has the H level, and in a case where the comparator output VCO has the H level, the signal LTOP2 has the L level.

Therefore, in the P phase or the D phase, in a case where the comparator output VCO has the H level, the NOT gate 291 enters the high impedance state, and the NOT gate 293 enters the operation state.

As a result, in the latch circuit 290, the bit GD2[n] output from the NOT gate 292 is maintained as the output (bit GD2[n]) of the NOT gate 292 without change through the NOT gates 292 and 293.

On the other hand, in the P phase or the D phase, in a case where the comparator output VCO is inverted to the L level, the NOT gate 291 enters the operation state, and the NOT gate 293 enters the high impedance state.

As a result, the latch circuit 290 performs the counting operation of latching the bit G[n] of the gray code output from the gray code generator 220 as the bit GD2[n] which is the output of the NOT gate 292 through the NOT gate 291 and 292, and the bit GD2[n] alternately toggles between the H level and the L level in accordance with bit G[n] of the gray code.

As described above, the latch circuit 280 performs the counting operation in a case where the comparator output VCO has the H level in the P phase and the D phase, and the latch circuit 290 performs the counting operation in a case where the comparator output VCO has the L level in the P phase and the D phase.

Therefore, the latch circuit 290 performs the counting operation at the timing complementary to the counting operation of the latch circuit 280.

Further, in the latch circuit $231_n$ of FIG. 11, the bit GD1[n] output from the NOT gate 282 of the latch circuit 280 is output as the bit of the count value of the gray code serving as the AD conversion result of the VSL voltage (the pixel signal), but the bit GD2[n] output from the NOT gate 292 of the latch circuit 290 is not output as the AD conversion result of the VSL voltage. As described above, the counting operation of the latch circuit 290 of latching the bit G[n] of the gray code output from the gray code generator 220 as the bit GD2[n] which is not output as the AD conversion result of the VSL voltage can be regarded as the dummy counting operation (the dummy operation).

Note that, in order to equalize the charging and discharging currents at the time of the counting operations of the latch circuits 280 and 290, the latch circuits 280 and 290 are layout-designed to have equal loads.

<AD Conversion Operation>

Figure 12:
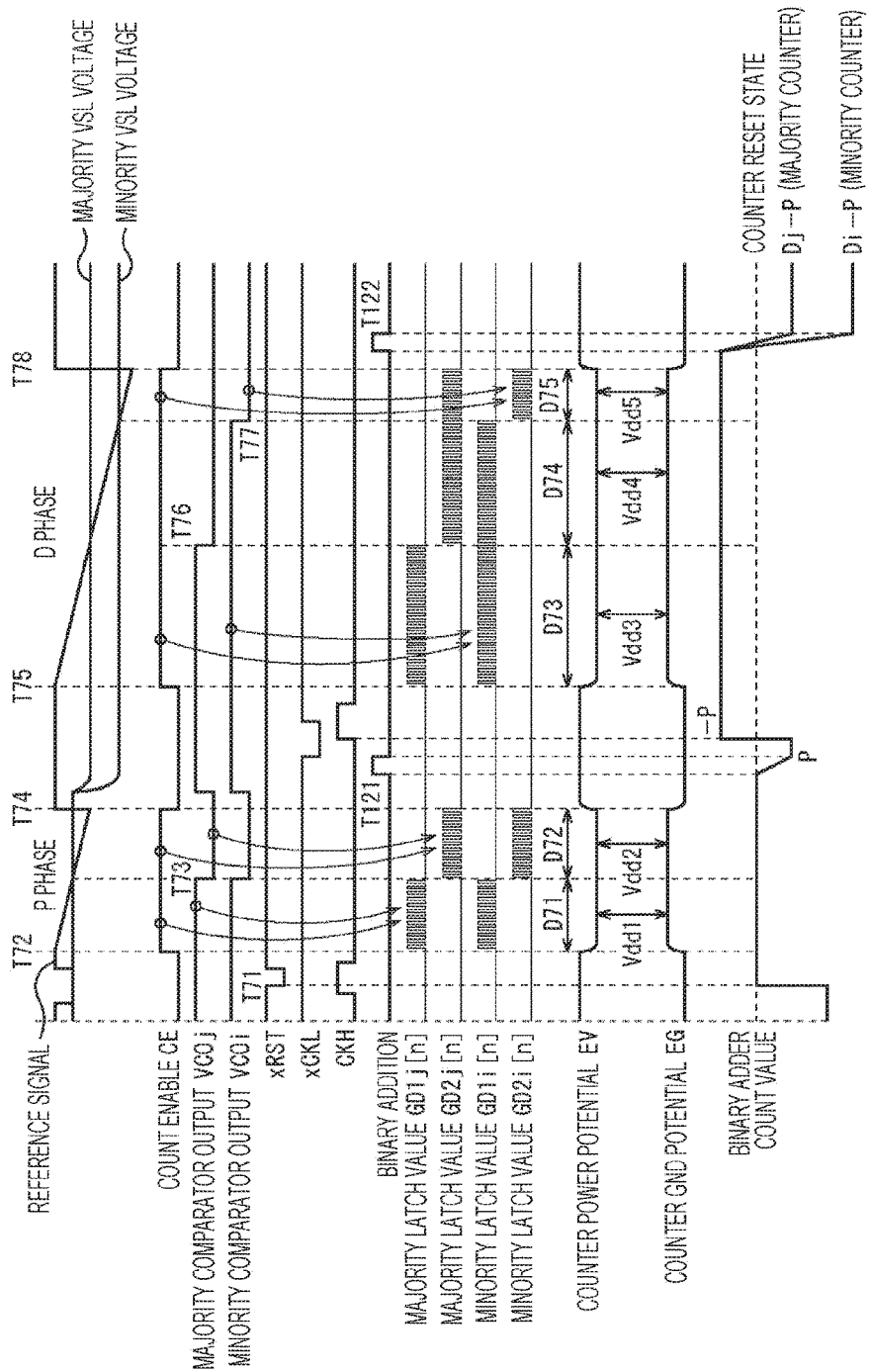
FIG. 12 is a timing chart for describing an example of an AD conversion operation of a column signal processing unit 4.

FIG. 12 is a timing chart for describing an example of the AD conversion operation of the column signal processing unit 4 of FIG. 9.

Similarly to FIGS. 7 and 8, the reference signal, the majority VSL voltage, the minority VSL voltage, the count enable signal CE, the majority comparator output VCOj, the minority comparator output VCOi, the counter reset signal xRST, the signal xCKL, the signal CKH, the counter power potential EV, the counter GND potential EG, and the count value are illustrated in FIG. 12.

Further, a timing to control the binary addition, majority latch values GD1j[n] and GD2j[n], and minority latch values GD1i[n] and GD2i[n] are illustrated in FIG. 12.

Here, the majority latch value GD1j[n] indicates the bit GD1[n] output from the NOT gate 282 of the latch circuit 280 serving as the counting operation unit constituting the latch circuit $231_n$ (FIG. 11) that latches the bit G[n] of the gray code in accordance with the majority comparator output VCOj.

Further, the majority latch value GD2j[n] indicates the bit GD2[n] output from the NOT gate 292 of the latch circuit 290 serving as the dummy operation unit constituting the latch circuit $231_n$ that latches the bit G[n] of the gray code in accordance with the majority comparator output VCOj.

Furthermore, the minority latch value GD1i[n] indicates the bit GD1[n] output from the NOT gate 282 of the latch circuit 280 serving as the counting operation unit constituting the latch circuit $231_n$ that latches the bit G[n] of the gray code in accordance with the minority comparator output VCOi.

Further, the minority latch value GD2i[n] indicates the bit GD2[n] output from the NOT gate 292 of the latch circuit 290 serving as the dummy operation unit constituting the latch circuit $231_n$ that latches the bit G[n] of the gray code in accordance with the minority comparator output VCOi.

As described above with reference to FIG. 11, in a case where the latch circuit 280 performs the counting operation, the bit GD1[n] output from the NOT gate 282 toggles, and in a case where the latch circuit 290 performs the dummy counting operation (the dummy operation), the bit GD2[n] output from the NOT gate 292 toggles.

Therefore, the majority latch value GD1j[n] or the minority latch value GD1i[n] toggles in a case where the latch circuit 280 of the latch circuit $231_n$ performs the counting operation. Further, the majority latch value GD2j[n] or the minority latch value GD2i[n] are toggling in a case where the latch circuit 290 of the latch circuit $231_n$ performs the dummy operation.

Note that, in FIG. 12, the reference signal, the majority VSL voltage, the minority VSL voltage, the count enable signal CE, the majority comparator output VCOj, the minority comparator output VCOi, the counter reset signal xRST, the signal xCKL, and the signal CKH are similar to those in FIGS. 7 and 8, and thus description thereof will be appropriately omitted.

At a time T71 before the P phase starts, the counter reset signal xRST temporarily transitions to the L level, and the count value of the binary code serving as a storage value of the binary adder 260 is reset accordingly.

The count enable signal CE has the H level only in the P phase and the D phase.

Further, the comparator output VCO (the majority comparator output VCOj and the minority comparator output VCOi) has the H level when each of the P phase and the D phase starts.

As described above with reference to FIG. 11, in the latch circuit 280 serving as the counting operation unit, in the P phase or the D phase, that is, in the period in which the count enable signal CE has the H level, in a case where the comparator output VCO has the H level, the counting operation in which the bit GD1[n] (the majority latch value GD1j[n] or the minority latch value GD1i[n]) toggles in accordance with the bit G[n] of the gray code is performed.

On the other hand, in the latch circuit 290 serving as the dummy operation unit, in the P phase or the D phase (the period in which the count enable signal CE has the H level), in a case where the comparator output VCO has the L level, the dummy counting operation in which the bit GD2[n] (the majority latch value GD2j[n] or the minority latch value GD2i[n]) toggles in accordance with the bit G[n] of the gray code is performed.

In FIG. 12, at the start time T72 of the P phase, the comparator output VCO (the majority comparator output VCOj and the minority comparator output VCOi) has the H level, and the latch circuit 280 serving as the counting operation unit starts the counting operation in which the bit GD1[n] (the majority latch value GD1j[n] or the minority latch value GD1i[n]) toggle in accordance with the bit G[n] of the gray code.

As described with reference to FIGS. 7 and 8, in the P phase, both the majority VSL voltage and the minority VSL voltage have the reset level, and thus in the comparator 140 performing the AD conversion of the majority VSL voltage and the comparator 140 performing the AD conversion of the minority VSL voltage, the comparator outputs VCO (the majority comparator output VCOj and the minority comparator output VCOi) are inverted at close timings.

In FIG. 12, similarly to FIGS. 7 and 8, at the time T73 of the P phase, both the majority comparator output VCOj and the minority comparator output VCOi are inverted from the H level to the L level.

If the majority comparator output VCOj is inverted to the L level, the latch circuit 280 constituting the latch circuit $231_n$ of the gray code latch circuit 221 of the majority pixel (the gray code latch circuit 221 that latches the gray code in accordance with the comparison result of the majority VSL voltage and the reference signal) stops the counting operation in which the majority latch value GD1j[n] toggles.

However, if the majority comparator output VCOj is inverted to the L level, the latch circuit 290 constituting the latch circuit $231_n$ of the gray code latch circuit 221 of the majority pixel starts the counting operation serving as the dummy operation in which the majority latch value GD2j[n] toggles.

Similarly, if the minority comparator output VCOi is inverted to the L level, the configuring latch circuit 280 constituting the latch circuit $231_n$ of the gray code latch circuit 221 of the minority pixel (the gray code latch circuit 221 that latches the gray code in accordance with the comparison result of the minority VSL voltage and the reference signal) stops the counting operation in which the minority latch value GD1i[n] toggles.

However, if the minority comparator output VCOi is inverted to the L level, the latch circuit 290 constituting the latch circuit $231_n$ of the gray code latch circuit 221 of the minority pixel starts the counting operation serving as the dummy operation in which the minority latch value GD2i[n] toggles.

In FIG. 12, at the time T73 of the P phase, the majority comparator output VCOj and the minority comparator output VCOi are inverted to the L level, and as a result, all the latch circuits 280 of the H gray code latch circuits 221 stop the counting operation.

Further, in FIG. 12, in accordance with the inversion of the majority comparator output VCOj and the minority comparator output VCOi at the time T73 of the P phase, all the latch circuits 290 constituting the latch circuits $231_n$ of the H gray code latch circuits 221 start the counting operation serving as the dummy operation.

Further, at an end time T74 of the P phase, the count enable signal CE transitions from the H level to the L level, and all the latch circuits 290 constituting the latch circuits $231_n$ of the H gray code latch circuits 221 stop the counting operation serving as the dummy operation accordingly.

At a time T121 before the D phase starts after the P phase ends, for example, the system control unit 6 controls the gray code latch circuit 221 (FIG. 10) such that the count value of the N-bit gray code configured with the bit GD1[0] to GD1[N-1] (G[0] to G[N-1]) latched in the latch circuits $231_0$ to $231_{N-1}$ is converted into the count value of the binary code for the binary addition.

In the gray code latch circuit 221, the converting circuit 240 converts the bits GD1[0] to GD1[N-1] of the gray code latched in the latch circuits $231_0$ to $231_{N-1}$ into bits BC[0] to BC[N-1] of the binary code, and supplies them to the selector 250.

In accordance with the control of the system control unit 6, the selector 250 sequentially selects the bits BC[0] to BC[N-1] of the binary code supplied from the converting circuit 240 from the least significant bit, and supplies them to the binary adder 260.

Accordingly, the binary adder 260 is sequentially supplied with the bits BC[0] to BC[N-1] of the binary code from the least significant bit from the selector 250. As a result, the count value of the binary code serving as the storage value of the binary adder 260 gradually increases, and eventually becomes the binary code corresponding to the gray code whose bits are latched in (the latch circuit 280 constituting) the latch circuits $231_0$ to $231_{N-1}$.

In FIG. 12, in the control for binary addition at the time T121, the count value of the P phase of the binary code stored in the binary adder 260 gradually increases in accordance with the bits BC[0] to BC[N-1] of the binary code sequentially supplied from the selector 250 and finally becomes the value P.

Thereafter, before the D phase starts, the signal xCKL temporarily transitions to the L level, and the signal CKH temporarily transitions to the H level, and thus the count value P of the P phase is inverted to value –P as described above with reference to FIGS. 6A and 6B. The subsequent counting of the D phase is performed using the value –P as the initial value.

In FIG. 12, at the start time T75 of the D phase at which the count enable signal CE and the comparator outputs VCO of all the H comparators 140 (the majority comparator output VCOj and the minority comparator output VCOi) have the H level, the latch circuit 280 serving as the counting operation unit starts the counting operation in which the bit GD1[n] (the majority latch value GD1j[n] or the minority latch value GD1i[n]) toggles in accordance with the bit G[n] of the gray code.

In the D phase, since the majority VSL voltage and the minority VSL voltage are different, the majority comparator output VCOj of the comparator 140 that performs the AD conversion of the majority VSL voltage and the minority comparator output VCOi of the comparator 140 that performs the AD conversion of the minority VSL voltage are inverted at different timings.

In FIG. 12, the majority comparator output VCOj is inverted from the H level to the L level at a time T76 of the D phase, similarly to FIGS. 7 and 8. If the majority comparator output VCOj is inverted to the L level, the latch circuit 280 constituting the latch circuit $231_n$ of the gray code latch circuit 221 of the majority pixel stops the counting operation in which the majority latch value GD1j[n] toggles.

However, if the majority comparator output VCOj is inverted to the L level at the time T76 of the D phase, the latch circuit 290 constituting the latch circuit $231_n$ of the gray code latch circuit 221 of the majority pixel starts the counting operation serving as the dummy operation in which the majority latch value GD2j[n] toggles.

In FIG. 12, the minority comparator output VCOi is inverted from the H level to the L level at a time T77 of the D phase after the time T76. If the minority comparator output VCOi is inverted to the L level, the latch circuit 280 constituting the latch circuit $231_n$ of the gray code latch circuit 221 of the minority pixel stops the counting operation in which the minority latch value GD1i[n] toggles.

However, if the minority comparator output VCOi is inverted to the L level at time T77 of the D phase, the latch circuit 290 constituting the latch circuit $231_n$ of the gray code latch circuit 221 of the minority pixel starts the counting operation serving as the dummy operation in which the minority latch value GD2$i$[$n$] toggles.

Then, at an end time T78 of the D phase, the count enable signal CE transitions from the H level to the L level, and the latch circuits 290 constituting the latch circuits 231$_n$ of the H gray code latch circuits 221 stop the counting operation serving as the dummy operation.

At a time T122 after the time T78 at which the D phase ends, for example, the system control unit 6 controls the gray code latch circuit 221 (FIG. 10) such that the count value of the N-bit gray code configured with the bits GD1[0] to GD1[N−1] latched in the latch circuits 231$_0$ to 231$_{N-1}$ is converted into the count value of the binary code for the binary addition.

In the gray code latch circuit 221, the converting circuit 240 converts the bits GD1[0] to GD1[N−1] of the gray code latched in the latch circuits 231$_0$ to 231$_{N-1}$ into the bits BC[0] to BC[N−1] of the binary code, and supplies them to the selector 250.

In accordance with the control of the system control unit 6, the selector 250 sequentially selects the bits BC[0] to BC[N−1] of the binary code supplied from the converting circuit 240 from the least significant bit, and supplies them to the binary adder 260.

Accordingly, the binary adder 260 is sequentially supplied with the bits BC[0] to BC[N−1] of the binary code from the least significant bit from the selector 250.

As described above, the value −P obtained by inverting the count value P of the P phase is stored in the binary adder 260.

The binary addition value 260 adds the bit BC[n] of the binary code sequentially supplied from the selector 250 using the value −P as the initial value.

As a result, the count value of the binary code serving as the storage value of the binary adder 260 gradually increases, and finally becomes the pixel value obtained by performing the digital CDS of subtracting the count value of the P phase from the count value of the D phase.

In FIG. 12, the value Dj−P is obtained as the count value stored in the binary adder 260 of the gray code latch circuit 221 of the majority pixel. Further, the value Di−P is obtained as the count value stored in the binary adder 260 of the gray code latch circuit 221 of the minority pixel.

As described above, the latch circuits 280 constituting the latch circuits 231$_n$ of the H gray code latch circuits 221 perform the counting operation in which the majority latch value GD1$j$[$n$] and the minority latch value GD1$i$[$n$] toggle from the start time T72 of the P phase to the time T73 at which the majority comparator output VCOj and the minority comparator output VCOi are inverted.

Further, the latch circuit 280 constituting the latch circuit 231$_n$ of the gray code latch circuit 221 of the majority pixel among the H gray code latch circuits 221 performs the counting operation in which the majority latch value GD1$j$[$n$] toggles from the start time T75 of the D phase to the time T76 at which the majority comparator output VCOj is inverted.

Further, the latch circuit 280 constituting the latch circuit 231$_n$ of the gray code latch circuit 221 of the minority pixel among the H gray code latch circuits 221 performs the counting operation in which the minority latch value GD1$i$[$n$] toggles from the start time T75 of the D phase to the time T77 at which the minority comparator output VCOi is inverted.

On the other hand, in the P phase, the latch circuits 290 constituting the latch circuits 231$_n$ of the H gray code latch circuits 221 perform the counting operation serving as the dummy operation in which the majority latch value GD2$j$[$n$] and the minority latch value GD2$i$[$n$] toggle from the time 173 at which the majority comparator output VCOj and the minority comparator output VCOi are inverted to the end time T73 of the P phase.

Further, in the D phase, the latch circuit 290 constituting the latch circuit 231$_n$ of the gray code latch circuit 221 of the majority pixel among the H gray code latch circuits 221 performs the counting operation serving as the dummy operation in which the majority latch value GD2$j$[$n$] toggles from the time 176 at which the majority comparator output VCOj is inverted to the end time T78 of the D phase.

Further, in the D phase, the latch circuit 290 constituting the latch circuit 231$_n$ of the gray code latch circuit 221 of the minority pixel among the H gray code latch circuits 221 starts the counting operation serving as the dummy operation in which the minority latch value GD2$i$[$n$] toggles from the time 177 at which the minority comparator output VCOi is inverted to the end time T78 of the D phase.

Therefore, for the latch circuit 231$_n$ of the gray code latch circuit 221 of the majority pixel, in a case where the latch circuit 280 serving as the counting operation unit performs the counting operation in the P phase and the D phase, the latch circuit 290 serving as the dummy operation unit stops the dummy operation. Further, in a case where the latch circuit 280 stops the counting operation, the latch circuit 290 performs the dummy operation.

Similarly, even for the latch circuit 231$_n$ of the gray code latch circuit 221 of the minority pixel, in a case where the latch circuit 280 performs the counting operation in the P phase and the D phase, the latch circuit 290 stops the dummy operation. Further, in a case where the latch circuit 280 stops the counting operation, the latch circuit 290 performs the dummy operation.

As described above, in the latch circuit 231$_n$ of the gray code latch circuit 221, in the P phase and the D phase, the latch circuit 280 performs the counting operation, or the latch circuit 290 performs the dummy operation. Therefore, the operation current of gray code latch circuit 221 becomes constant over the P phase and the D phase, and the power voltage of the gray code latch circuit 221 also becomes constant regardless of an imaging condition (a subject shape, a luminance, or the like).

In other words, in FIG. 12, the power voltage Vdd1 of the gray code latch circuit 221 of the period D71 from the start time T72 of the P phase to the time T73 at which the majority comparator output VCOj and the minority comparator output VCOi are inverted, the power voltage Vdd2 of the gray code latch circuit 221 of the period D72 from the time T73 to the end time T74 of the P phase, the power voltage Vdd3 of the gray code latch circuit 221 of the period D73 from the start time T75 of the D phase to the time T76 at which the majority comparator output VCOj is inverted, the power voltage Vdd4 of the gray code latch circuit 221 of the period D74 from the time T76 at which the majority comparator output VCOj is inverted to the time T77 at which the minority comparator output VCOi is inverted, and the power voltage Vdd5 of the gray code latch circuit 221 of the period D75 from the time T77 at which the minority comparator output VCOi is inverted to the end time T78 of the D phase are the same.

As a result, it is possible to prevent the occurrence of an error in the AD conversion result and the occurrence of streaks caused by the fluctuation in (the fluctuation amount of) the power voltage of the gray code latch circuit 221 described above with reference to FIG. 7.

Note that one or more bits of the count value of the binary code are changed at the time of counting, but only one bit of the count value of the gray code is changed at the time of counting, and thus the number of bits that toggle in the count value of the gray code is equal to or less than the number of bits that toggle in the count value of the binary code. Therefore, in a case where the count value of the gray code is used, it is possible to reduce the power consumption to be smaller than a case where the count value of binary code is used.

However, in a case of using the count value of gray code, it is necessary to convert gray code to binary code for digital CDS, but in a case of using the count value of binary code, it is necessary to perform such conversion.

<Third Exemplary Configuration of Column Signal Processing Unit 4>

Figure 13:
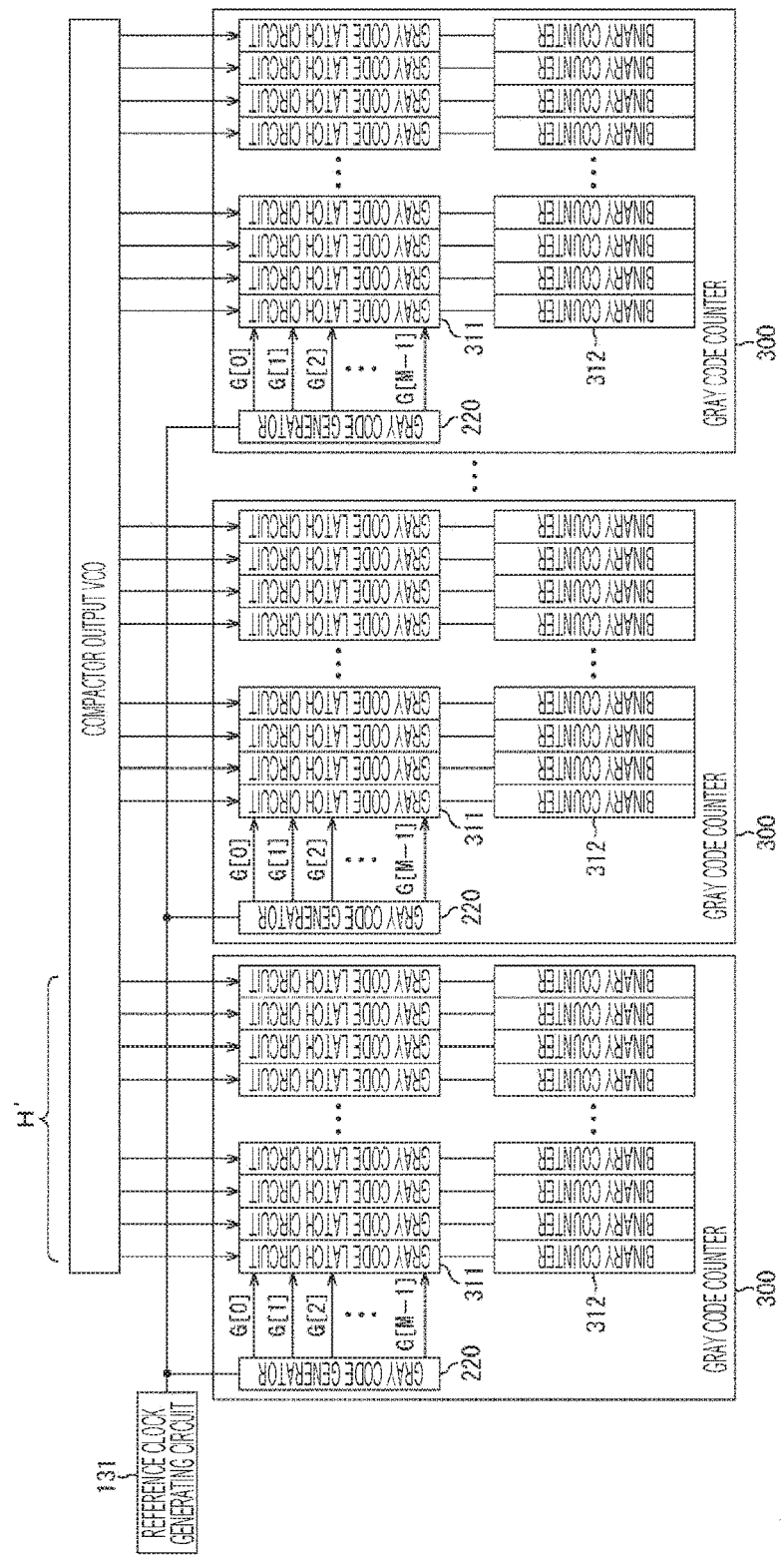
FIG. 13 is a block diagram illustrating a third exemplary configuration of a column signal processing unit 4.

FIG. 13 is a block diagram illustrating a third exemplary configuration of the column signal processing unit 4 of FIG. 1.

Note that, in FIG. 13, parts corresponding to those in FIG. 9 are denoted by the same reference numerals, and description thereof will be appropriately omitted below.

Further, similarly to the example of FIG. 9, the bias circuit 120, the reference signal generating circuit 130, the comparator 140, and the capacitors 141 and 142 are not illustrated in FIG. 13.

The column signal processing unit 4 of FIG. 13 differs from that of FIG. 9 in that a hybrid counter 300 is arranged instead of the gray code counter 210.

Similarly to the gray code counter 210 of FIG. 9, the hybrid counter 300 is arranged for every H' (<H) columns, and functions to count the count value serving as the AD conversion of the pixel signals of the pixels 110 included in the H' columns for which the hybrid counter 300 is arranged.

The hybrid counter 300 is supplied with the comparator outputs VCO of H' comparators 140 connected with the pixels 110 in the H' column for which the hybrid counter 300 undertakes the AD conversion via the VSL 8.

The hybrid counter 300 includes a gray code generator 220, H' gray code latch circuits 311, and a binary counter 312, and counts the count value in accordance with the comparator outputs VCO of the H' comparators 140.

In the hybrid counter 300, lower bits of the count value are counted using the gray code, and upper bits of the count value are counted using the binary code.

Therefore, the count value counted by the hybrid count 300 becomes a so-called hybrid value in which upper bits are configured with a binary code, and lower bits are configured with a gray code.

The hybrid counter 300 differs from the gray code counter 221 of FIG. 9 in that a gray code latch circuit 311 is arranged instead of the gray code latch circuit 221.

Further, the hybrid counter 300 differs from the gray code counter 221 of FIG. 9 in that the binary counter 312 is newly arranged.

The gray code is supplied from the gray code generator 220 to the gray code latch circuit 311.

If the count value counted by the hybrid counter 300 is assumed to be an N-bit count value, bits G[0] to G[M−1] constituting an M-bit gray code (M is less than N) are supplied from the gray code generator 220 to the gray code latch circuit 311.

Further, the gray code latch circuit 311 is arranged for each column of the pixels 110, and the comparator output VCO of the comparator 140 of the column corresponding to the gray code latch circuit 311 is supplied to the gray code latch circuit 311.

The gray code latch circuit 311 sequentially latches the M-bit gray code supplied from the gray code generator 220 when the supplied comparator output VCO has the H level. Further, if the supplied comparator output VCO is inverted to the L level, the gray code latch circuit 311 stops latching of a new gray code and maintains the latching of the gray code latched at that time.

The M-bit gray code whose latching is maintained by the gray code latch circuit 311 is lower bits of the N-bit count value serving as the AD conversion result of the VSL voltages (the pixel signals) output from the pixels in the column corresponding to the gray code latch circuit.

Here, lower M bits of the count value latched by the gray code latch circuit 311 are also referred to as a "lower bit count value."

The binary counter 312 is arranged corresponding to the gray code latch circuit 311.

A carry signal indicating the carry of (the most significant bit of) the lower bit count value counted by the gray code latch circuit 311 is supplied from the gray code latch circuit 311 corresponding to the binary counter 312 to the binary counter 312.

The binary counter 312 counts upper bits ((N-M) bits) higher than the lower M bits of the N-bit count value using the binary code in synchronization with the carry signal output from the gray code latch circuit 311.

Here, the upper (N−M) bits of the count value counted by the binary counter 312 are hereinafter also referred to as an "upper bit count value."

An N-bit value obtained from the M-bit lower bit count value latched by the gray code latch circuit 311 and the (N−M)-bit upper bit count value counted by the binary counter 312 corresponding to the gray code latch circuit 311 is an N-bit count value serving as the AD conversion result of the VSL voltages (the pixel signals) output from the pixels in the corresponding column.

<Exemplary Configuration of Gray Code Latch Circuit 311>

Figure 14:
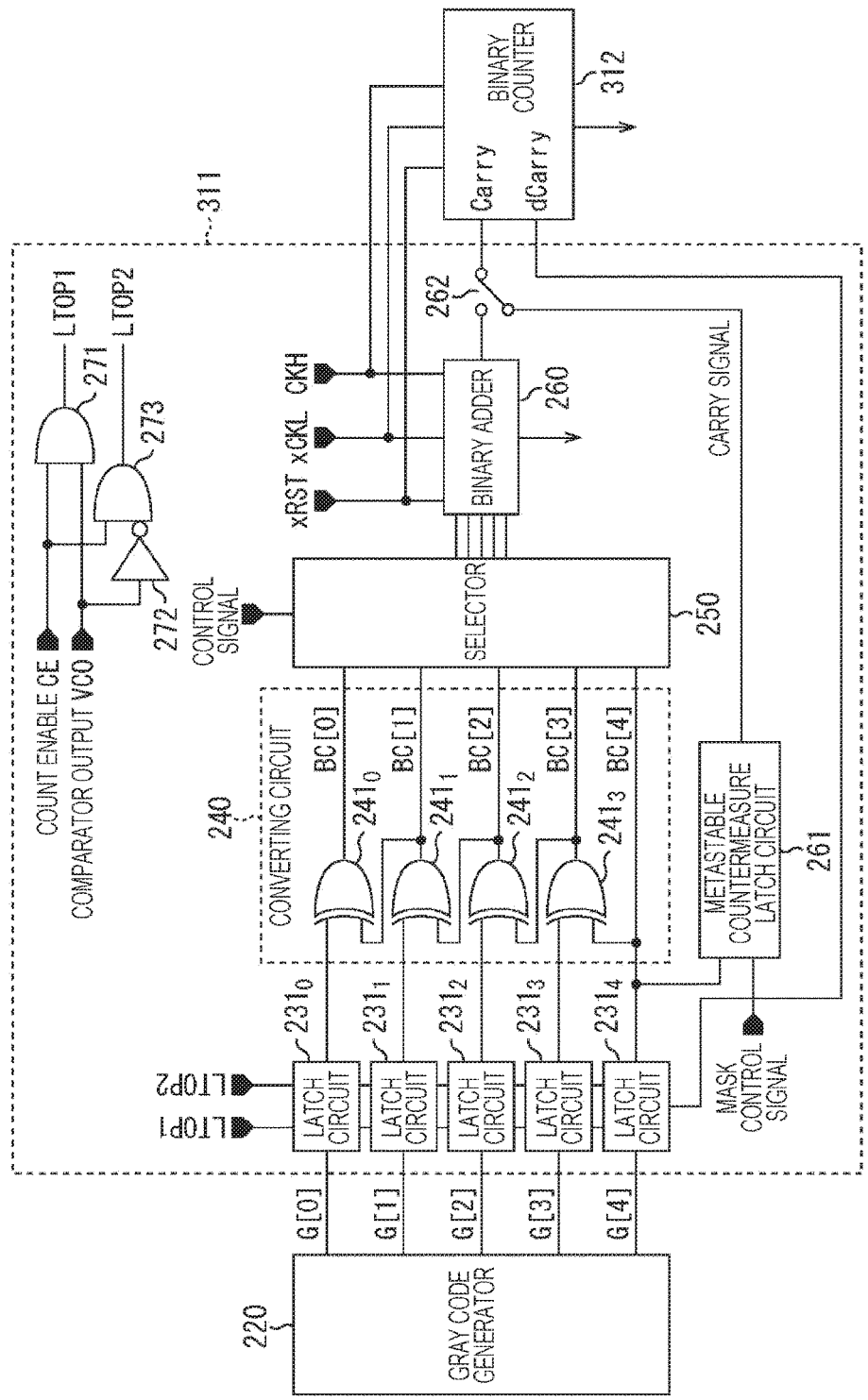
FIG. 14 is a circuit diagram illustrating an exemplary configuration of a gray code latch circuit 311.

FIG. 14 is a circuit diagram illustrating an exemplary configuration of the gray code latch circuit 311 of FIG. 13.

Note that, in FIG. 14, parts corresponding to those of the gray code latch circuit 221 of FIG. 10 are denoted by the same reference numerals, and description thereof will be appropriately omitted below.

In FIG. 14, M is 5, and thus the lower bit count value latched by the gray code latch circuit 311 is a 5-bit gray code. Note that M is not limited to 5.

The gray code latch circuit 311 of FIG. 14 is similar to the gray code latch circuit 221 of FIG. 10 in that the latch circuits $231_0$ to $231_4$, the converting circuit 240, the selector 250, and the binary adder 260 are arranged.

However, the gray code latch circuit 311 differs from the gray code latch circuit 221 of FIG. 10 in that a metastable countermeasure latch circuit 261 and a switch 262 are newly arranged.

In FIG. 14, the latch circuit $231_m$ has the configuration illustrated in FIG. 11 (m=0, 1, 2, 3, 4).

Therefore, in the gray code latch circuit 311, in the latch circuit $231_m$ that latches the lower bit count value, in the P phase and the D phase, the latch circuit 280 performs the counting operation, and the latch circuit 290 performs the dummy operation, similarly to the gray code latch circuit 221 of FIG. 10.

Therefore, in a case where only the lower bit count value is focused, the operation current of the gray code latch circuit 311 and the power voltage of the gray code latch circuit 311 are constant over the P phase and the D phase, similarly to the gray code latch circuit 221 of FIG. 10.

In FIG. 14, the bit GD1[4]=G[4] of the gray code latched in the latch circuit $231_4$, that is, the most significant bit GD1[4] of the lower bit count value of the gray code is supplied to the metastable countermeasure latch circuit 261.

Here, the most significant bit GD1[4] of the lower bit count value of the gray code latched in the latch circuit $231_4$ can be supplied to the binary counter 312 without change as the carry signal indicating the carry of the lower bit count value.

However, in a case where the bit GD1[4] latched in the latch circuit $231_4$ is supplied to the binary counter 312 without change as the carry signal indicating the carry of the lower bit count value, the least significant bit of the upper bit count value counted by the binary counter 312 may be carried due to metastable (bit inconsistency) although the carry of the lower bit count value has not occurred.

In other words, in a case where the edge of the bit GD1[4] serving as the carry signal and an inversion timing of the comparator output VCO are close to each other, metastable in which the least significant bit of the upper bit count value counted by the binary counter 312 is not decided as the L level or the H level may occur.

Figure 17:
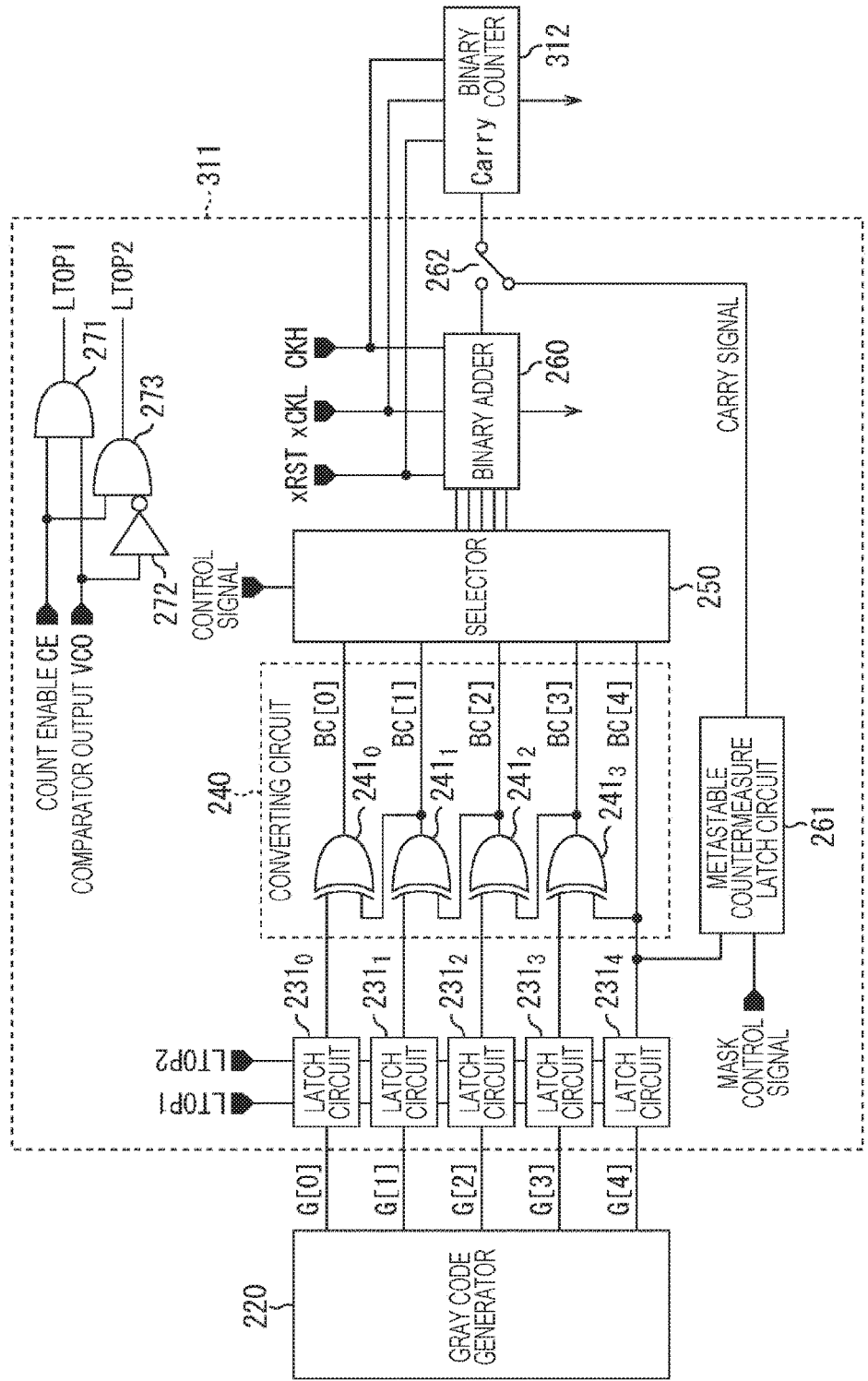
FIG. 17 is a circuit diagram illustrating another exemplary configuration of a gray code latch circuit 311.

Here, the metastable has been described in detail, for example, in FIG. 17 of Patent Document 1.

If the metastable occurs in the least significant bit of the upper bit count value, the lower bit count value of the gray code is not carried, and the least significant bit of the upper bit count value may be carried. In this case, in the case of M=5, the least significant bit of the upper bit count value corresponds to 32 (=$2^5$) in the decimal number, and thus data loss of a large value of 32 occurs in the count value.

An occurrence probability of the metastable can be reduced by temporarily latching the carry signal when it is supplied to the binary counter 312 and setting a mask period to an edge period of the carry signal.

The metastable countermeasure latch circuit 261 reduces the occurrence probability of the metastable by latching the most significant bit GD1[4] of the lower bit count value serving as the carry signal latched by the latch circuit $231_4$.

The most significant bit GD1[4] of the lower bit count value latched by the metastable countermeasure latch circuit 261 is supplied to a terminal Carry of the binary counter 312 via the switch 262 as the carry signal.

Here, the metastable countermeasure latch circuit 261 latches the most significant bit GD1[4] of the lower bit count value in accordance with a mask control signal. For example, the mask control signal is supplied from the system control unit 6 (FIG. 1).

The switch 262 supplies the carry signal indicating the carry occurring by addition of the lower bit count value performed in the binary adder 260 or the carry signal latched by the metastable countermeasure latch circuit 261 ((a signal having the same frequency as) the most significant bit GD1[4] of the lower bit count value) to the terminal Carry of the binary counter 312.

In other words, in FIG. 14, in the binary adder 260, the binary addition of the lower bit count value converted into the binary code is performed, but at that time, the carry may occur in the most significant bit of the lower bit count value.

In a case where the carry occurs in the most significant bit of the lower bit count value by the binary addition, the binary adder 260 supplies the carry signal indicating the carry to the switch 262.

In the period in which the binary adder 260 performs the binary addition, the switch 262 selects the carry signal supplied from the binary adder 260 and supplies the carry signal to the terminal Carry of the binary counter 312.

Further, for example, in a period other than the period in which the binary adder 260 performs the binary addition, the switch 262 selects the carry signal supplied from the metastable countermeasure latch circuit 261 and supplies the carry signal to the terminal Carry of the binary counter 312.

Note that the latch circuit $231_m$ has the configuration illustrated in FIG. 11 and includes latch circuits 280 and 290.

The most significant bit GD1[4] of the lower bit count value latched by the latch circuit 280 serving as the counting operation unit is supplied to the terminal Carry of the binary counter 312 as the carry signal as described above.

On the other hand, the most significant bit GD2[4] of the lower bit count value latched by the latch circuit 290 serving as the dummy operation unit is supplied to a terminal dCarry of the binary counter 312 as the carry signal.

The binary counter 312 performs the counting operation of counting the upper bit count value in synchronization with the carry signal supplied to the terminal Carry. Further, the binary counter 312 performs the dummy counting operation in synchronization with the carry signal supplied to the terminal dCarry.

In other words, in FIG. 14, the most significant bit GD2[4] of the lower bit count value latched by the latch circuit 290 serving as the dummy operation unit constituting the latch circuit $231_m$ is supplied to the terminal dCarry of the binary counter 312 as the carry signal so that the binary counter 312 performs the dummy counting operation.

<Exemplary Configuration of Binary Counter 312>

Figure 15:
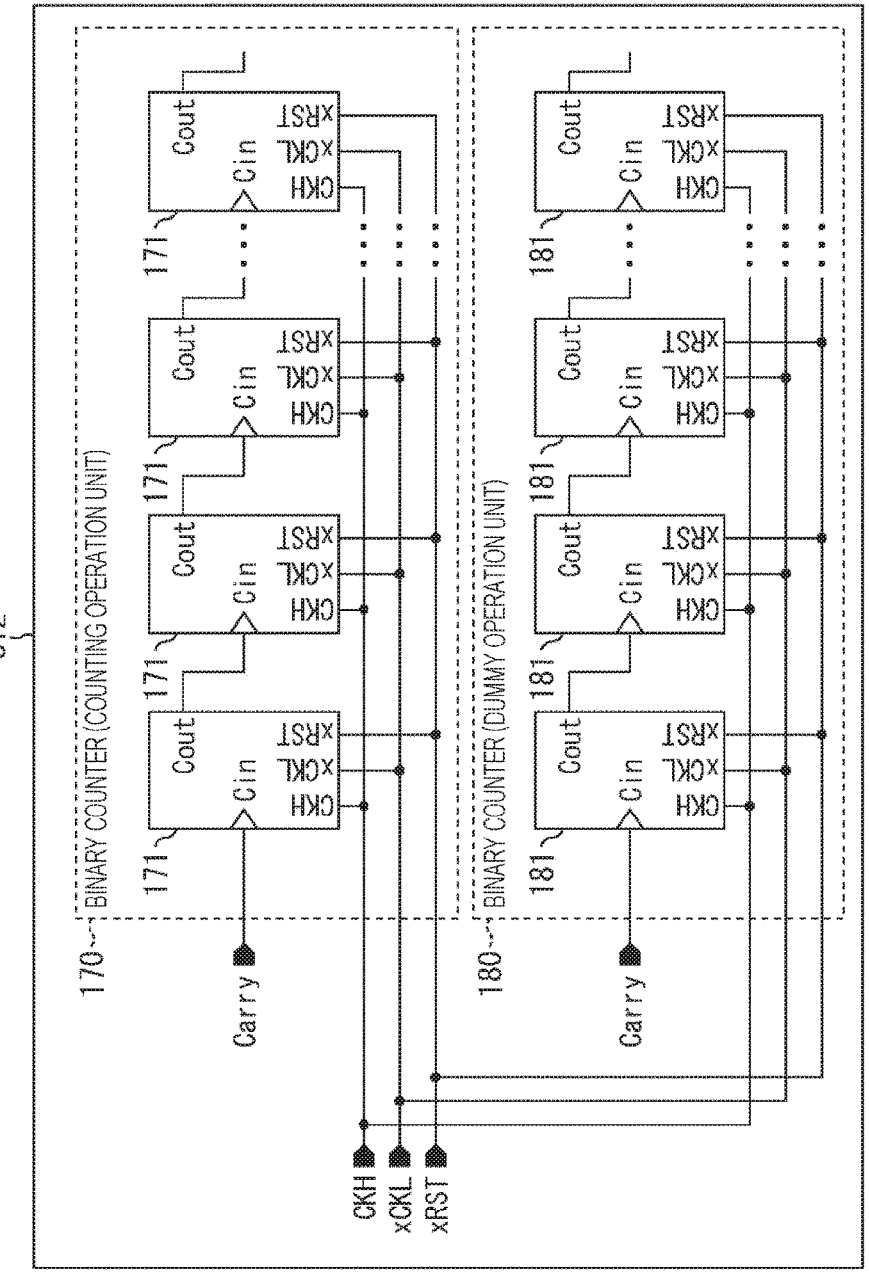
FIG. 15 is a circuit diagram illustrating an exemplary configuration of a binary counter 312.

FIG. 15 is a circuit diagram illustrating an exemplary configuration of the binary counter 312 of FIG. 14.

Note that, in FIG. 15, parts corresponding to counter 150 in FIG. 5 are denoted by the same reference numerals, and description thereof will be appropriately omitted below.

The binary counter 312 is similar to the counter 150 of FIG. 5 in that the binary counter 170 that performs the counting operation and the binary counter 180 that performs the dummy counting operation (the dummy operation) are arranged.

However, the binary counter 312 differs from the counter 150 of FIG. 5 in that the AND gates 161 and 162, the NOT gate 163, and the AND gate 164 are not arranged.

Note that, in FIG. 15, the binary counter 170 includes D-FFs 171 which are equal in number to (N−M) bits which is the number of bits of the upper bit count value. The binary counter 180 similarly includes D-FFs 181 which are equal in number to (N−M) bits.

Here, the bit GD1[n] output from the latch circuit 280 (FIG. 11) constituting the latch circuit $231_m$ (FIG. 14) toggles in a case where the comparator output VCO has the H level in the P phase or the D phase.

Therefore, the most significant bit GD1[4] of the lower bit count value latched by the latch circuit 280 constituting the latch circuit $231_4$ which is supplied to the terminal Carry of the binary counter 312 as the carry signal toggles in a case where the comparator output VCO has the H level in the P phase or the D phase.

In FIG. 15, the carry signal supplied to the terminal Carry is supplied to the binary counter 170, and the binary counter 170 performs the counting operation of counting the upper bit count value in synchronization with the carry signal supplied to the terminal Carry.

As described above, the carry signal (bit GD1[4]) supplied to the terminal Carry toggles in a case where the comparator output VCO has the H level in the P phase or the D phase. Therefore, in the binary counter 312, the binary counter 170 serving as the counting operation unit performs the counting operation in a case where the comparator output VCO has the H level in the P phase or the D phase.

On the other hand, the bit GD2[n] output from the latch circuit 290 (FIG. 11) constituting the latch circuit 231$_m$ (FIG. 14) toggles in a case where the comparator output VCO has the L level in the P phase or the D phase.

Therefore, the most significant bit GD2[4] of the lower bit count value latched by the latch circuit 290 (FIG. 11) constituting the latch circuit 231$_4$ which is supplied to the terminal dCarry of the binary counter 312 as the carry signal toggles in a case where the comparator output VCO has the L level in the P phase or the D phase.

In FIG. 15, the carry signal supplied to the terminal dCarry is supplied to the binary counter 180, and the binary counter 180 performs the dummy counting operation of counting the upper bit count value in synchronization with the carry signal supplied to the terminal dCarry.

As described above, the carry signal (bit GD2[4]) supplied to the terminal dCarry toggles in a case where the comparator output VCO has the L level in the P phase or the D phase. Therefore, in the binary counter 312, the binary counter 180 serving as the dummy operation unit performs the dummy counting operation in a case where the comparator output VCO has the L level in the P phase or the D phase.

<AD Conversion Operation>

Figure 16:
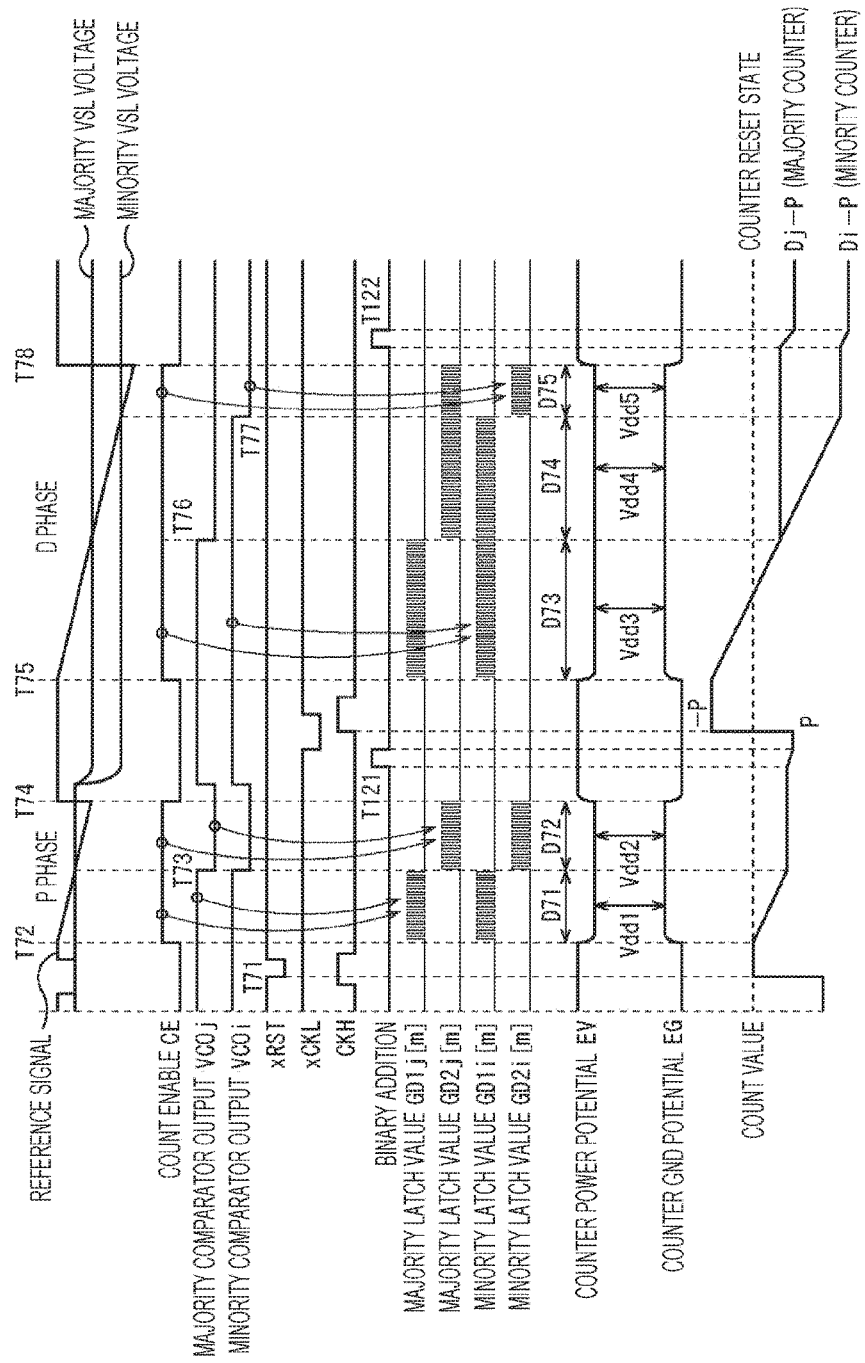
FIG. 16 is a timing chart for describing an example of an AD conversion operation of a column signal processing unit 4.

FIG. 16 is a timing chart for describing an example of the AD conversion operation of the column signal processing unit 4 of FIG. 13.

Similarly to FIG. 12, the reference signal, the majority VSL voltage, the minority VSL voltage, the count enable signal CE, the majority comparator output VCOj, the minority comparator output VCOi, the counter reset signal xRST, the signal xCKL, the signal CKH, a timing to control the binary addition, the majority latch values GD1j[m] and GD2j[m], the minority latch values GD1i[m] and GD2i[m], the counter power potential EV, the counter GND potential EG, and the count value are illustrated in FIG. 16.

Note that, in FIG. 16, the count value indicates a count value in which the M-bit lower bit value latched by the gray code latch circuit 311 is used as a lower bit value, and the (N–M)-bit upper bit count value counted by the binary counter 312 is used as an upper bit value.

Further, in FIG. 16, the reference signal, the majority VSL voltage, the minority VSL voltage, the count enable signal CE, the majority comparator output VCOj, the minority comparator output VCOi, the counter reset signal xRST, the signal xCKL, and the signal CKH are similar to those of FIGS. 7, 8, and 12, and thus description thereof will be appropriately omitted.

At a time T71 before the P phase starts, the counter reset signal xRST temporarily transitions to the L level, and the lower bit count value of the binary code serving as the storage value of the binary adder 260 is reset accordingly.

The count enable signal CE has the H level only in the P phase and the D phase.

Further, the comparator output VCO (the majority comparator output VCOj and the minority comparator output VCOi) has the H level when each of the P phase and the D phase starts.

In the P phase or the D phase, that is, in the period in which the count enable signal CE has the H level, in a case where the comparator output VCO has the H level, in the latch circuit 280 constituting the latch circuit 231$_m$ of the gray code latch circuit 311, the counting operation in which the bit GD1[m] (the majority latch value GD1j[m] or minority latch value GD1i[m]) toggles in accordance with the bit G[m] of the gray code is performed.

Further, in the P phase or the D phase, in a case where the comparator output VCO has the H level, the carry signal (bit GD1[4]) supplied to the terminal Carry of the binary counter 312 toggles. In this case, the binary counter 170 configuring the binary counter 312 performs the counting operation of counting the upper bit count value in synchronization with the toggling carry signal which is supplied to the terminal Carry.

On the other hand, in the P phase or the D phase (the period in which the count enable signal CE has the H level), in a case where the comparator output VCO has the L level, in the latch circuit 290 constituting latch circuit 231$_m$ of the gray code latch circuit 311, the dummy counting operation in which the bit GD2[m] (the majority latch value GD2j[m] or the minority latch value GD2i[m]) toggles in accordance with the bit G[m] of the gray code is performed.

Further, in the P phase or the D phase, in a case where the comparator output VCO has the L level, the bit GD2[4] serving as the carry signal supplied to the terminal dCarry of the binary counter 312 toggles. In this case, the binary counter 180 constituting the binary counter 312 performs the dummy counting operation of counting the upper bit count value in synchronization with the bit GD2[4] serving as the toggling carry signal which is supplied to the terminal dCarry.

In FIG. 16, at a start time T72 of the P phase, the comparator output VCO has the H level, and the latch circuit 280 constituting the latch circuit 231$_m$ of the gray code latch circuit 311 starts the counting operation in which the bit GD1[m] (the majority latch value GD1j[m] or the minority latch value GD1i[m]) toggles in accordance with the bit G[m] of the gray code.

Further, the binary counter 170 configuring the binary counter 312 performs the counting operation of counting the upper bit count value in synchronization with the toggling carry signal (GD1[4]) which is supplied to the terminal Carry.

In the P phase, both the majority VSL voltage and the minority VSL voltage have the reset level, and thus in the comparator 140 performing the AD conversion of the majority VSL voltage and the comparator 140 performing the AD conversion of the minority VSL voltage, the comparator outputs VCO (the majority comparator output VCOj and the minority comparator output VCOi) are inverted at close timings.

In FIG. 16, similarly to FIG. 7 and the like, at a time T73 of the P phase, both the majority comparator output VCOj and the minority comparator output VCOi are inverted from the H level to the L level.

If the majority comparator output VCOj is inverted to the L level, the latch circuit 280 constituting the latch circuit 231$_m$ of the gray code latch circuit 311 of the majority pixel (the gray code latch circuit 311 that latches the gray code in accordance with the comparison result of the majority VSL voltage and the reference signal) stops the counting operation in which the majority latch value GD1j[m] toggles.

As a result, the toggling of the bit GD1[4] serving as the carry signal supplied to the terminal Carry of the binary counter 312 of the majority pixel (the binary counter 312 to which the carry signal is supplied from the gray code latch circuit 311 of the majority pixel) is stopped.

If the toggle of the bit GD1[4] serving as the carry signal is stopped, the binary counter 170 constituting the binary counter 312 of the majority pixel stops the counting operation of counting the upper bit count value.

However, if the majority comparator output VCOj is inverted to the L level, the latch circuit 290 constituting the latch circuit 231$_m$ of the gray code latch circuit 311 of the majority pixel starts the counting operation serving as the dummy operation in which the majority latch value GD2j[m] toggles.

As a result, the toggling of the bit GD2[4] serving as the carry signal to be supplied to the terminal dCarry of the binary counter 312 of the majority pixel is started.

If the toggling of the bit GD2[4] serving as the carry signal is started, the binary counter 180 constituting the binary counter 312 of the majority pixel starts the counting operation serving as the dummy operation of counting the upper bit count value in synchronization with the toggling of the bit GD2[4] serving as the carry signal.

Similarly, if the minority comparator output VCOi is inverted to the L level, the latch circuit 280 constituting the latch circuit 231$_m$ of the gray code latch circuit 311 of the minority pixel (the gray code latch circuit 311 that latches the gray code in accordance with a comparison result between the minority VSL voltage and the reference signal) stops the counting operation in which the minority latch value GD1i[m] toggles.

As a result, the toggling of the bit GD1[4] serving as the carry signal to be supplied to the terminal Carry of the binary counter 312 of the minority pixel (the binary counter 312 to which the carry signal is supplied from the minority pixel gray code latch circuit 311) is stopped.

If the toggling of the bit GD1[4] serving as the carry signal is stopped, the binary counter 170 constituting the binary counter 312 of the minority pixel stops the counting operation of counting the upper bit count value.

However, if the minority comparator output VCOi is inverted to the L level, the latch circuit 290 constituting the latch circuit 231$_m$ of the gray code latch circuit 311 of the minority pixel starts the counting operation serving as the dummy operation in which the minority latch value GD2j[m] toggles.

As a result, the toggling of the bit GD2[4] serving as the carry signal to be supplied to the terminal dCarry of the binary counter 312 of the minority pixel is started.

If the toggling of the bit GD2[4] serving as the carry signal is started, the binary counter 180 constituting the binary counter 312 of the minority pixel starts the counting operation serving as the dummy operation of counting the upper bit count value in synchronization with the toggling of the bit GD2[4] serving as the carry signal.

In FIG. 16, at a time T73 of the P phase, the majority comparator output VCOj and the minority comparator output VCOi are inverted to the L level. As a result, the latch circuits 280 (FIG. 11) constituting the latch circuits 231$_m$ of the H gray code latch circuits 311 stop the counting operation, and the toggling of the majority latch value GD1j[m] and the minority latch value GD1i[m] is stopped.

Further, the binary counters 170 (FIG. 15) constituting the H binary counters 312 stop the counting operation as the toggling of the majority latch value GD1j[m] and the minority latch value GD1i[m] is stopped at the time T73 of the P phase.

Further, in accordance with the inversion of the majority comparator output VCOj and the minority comparator output VCOi at the time T73 of the P phase, the latch circuits 290 (FIG. 11) constituting all the latch circuits 231$_m$ of the H gray code latch circuits 311 start the counting operation serving as the dummy operation, and the toggling of the majority latch value GD2j[m] and the minority latch value GD2i[m] is started.

Furthermore, the binary counters 180 constituting the H binary counters 312 start the counting operation serving as the dummy operation as the toggling of the majority latch value GD2j[m] and the minority latch value GD2i[m] is started at the time T73 of the P phase.

Further, at an end time T74 of the P phase, the count enable signal CE transitions from the H level to the L level, and thus all of the latch circuits 290 constituting the latch circuits 231$_m$ of the H gray code latch circuits 311 stop the counting operation serving as the dummy operation.

Further, the binary counters 180 constituting the H binary counters 312 stop the counting operation serving as the dummy operation as the count enable signal CE is inverted from the H level to the L level at the end time T74 of the P phase.

Here, in the period from the time T72 to the time T73, the binary counter 170 constituting the binary counter 312 counts the upper bit count value. Accordingly, the count value increases.

At a time T121 before the D phase starts after the P phase ends, for example, the system control unit 6 controls the gray code latch circuit 311 (FIG. 14) such that the lower bit count value of the 5-bit gray code configured with the bits GD1[0] to GD1[4] latched in the latch circuits 231$_0$ to 231$_4$ is converted into the lower bit count value of the binary code for the binary addition.

In the gray code latch circuit 311, the converting circuit 240 converts the bits GD1[0] to GD1[4] of the gray code latched in the latch circuits 231$_0$ to 231$_4$ into bits BC[0] to BC[4] of the binary code, and supplies them to the selector 250.

In accordance with the control of the system control unit 6, the selector 250 sequentially selects the bits BC[0] to BC[4] of the binary code supplied from the converting circuit 240 from the least significant bit, and supplies them to the binary adder 260.

Accordingly, the binary adder 260 is sequentially supplied with the bits BC[0] to BC[4] of the binary code from the least significant bit from the selector 250. As a result, the lower bit count value serving as the storage value of the binary adder 260 gradually increases, and the count value increases with the increase in the lower bit count value.

In FIG. 16, in the control for the binary addition at the time T121, the count value (of the P phase) configured with the upper bit count value counted by the binary counter 312 and the lower bit count value stored in the binary adder 260 becomes the value P.

Thereafter, before the D phase starts, the signal xCKL temporarily transitions to the L level, and the signal CKH temporarily transitions to the H level, and thus the count value P of the P phase is inverted to value −P as described above with reference to FIGS. 6A and 6B. The subsequent counting of the D phase is performed using the value −P as the initial value.

In FIG. 16, at the start time T75 of the D phase at which the count enable signal CE and the comparator outputs VCO of all the H comparators 140 (the majority comparator output VCOj and the minority comparator output VCOi) have the H level, the latch circuit 280 serving as the counting operation unit starts the counting operation in which the bit GD1[m] (the majority latch value GD1j[m] or the minority latch value GD1i[m]) toggles in accordance with the bit G[m] of the gray code.

Further, at the start time T75 of the D phase, the binary counter 170 configuring the binary counter 312 starts the counting operation of counting the upper bit count value in synchronization with the toggling carry signal (GD1[4]) which is supplied to the terminal Carry.

In the D phase, since the majority VSL voltage and the minority VSL voltage are different, the majority comparator output VCOj of the comparator 140 that performs the AD conversion of the majority VSL voltage and the minority comparator output VCOi of the comparator 140 that performs the AD conversion of the minority VSL voltage are inverted at different timings.

In FIG. 16, the majority comparator output VCOj is inverted from the H level to the L level at a time T76 of the D phase, similarly to FIG. 7. If the majority comparator output VCOj is inverted to the L level, the latch circuit 280 (FIG. 11) constituting the latch circuit 231$_w$ of the gray code latch circuit 311 of the majority pixel stops the counting operation in which the majority latch value GD1$j$[$m$] toggles.

If the toggling of the bit GD1$j$[4] serving as the carry signal among the majority latch value GD1$j$[$m$] is stopped, the binary counter 170 (FIG. 15) constituting the binary counter 312 of the majority pixel in which the bit GD1$j$[4] serving as the carry signal is supplied to the terminal carry thereof stops the counting operation of counting the upper bit count value.

However, if the majority comparator output VCOj is inverted to the L level at the time T76 of the D phase, the latch circuit 290 (FIG. 11) constituting the latch circuit 231$_m$ of the gray code latch circuit 311 of the majority pixel starts the counting operation serving as the dummy operation in which the majority latch value GD2$j$[$m$] toggles.

If the toggling of the bit GD2$j$[4] serving as the carry signal among the majority latch value GD2$j$[$m$] starts, the binary counter 180 (FIG. 15) constituting the binary counter 312 of the majority pixel in which the bit GD2$j$[4] serving as the carry signal is supplied to the terminal dCarry starts the counting operation serving as the dummy operation of counting the upper bit count value.

Here, in the period from the time T75 to the time T76, the binary counter 170 constituting the binary counter 312 of the majority pixel counts the upper bit count value using the value −P as an initial value, and the count value increases accordingly.

In FIG. 16, the minority comparator output VCOi is inverted from the H level to the L level at a time T77 after the time T76 of the D phase. If the minority comparator output VCOi is inverted to the L level, the latch circuit 280 constituting the latch circuit 231$_m$ of the gray code latch circuit 311 of the minority pixel stops the counting operation in which the minority latch value GD1$i$[$m$] toggles.

If the toggling of the bit GD1$i$[4] serving as the carry signal among the minority latch value GD1$i$[$m$] is stopped, the binary counter 170 constituting the binary counter 312 of the minority pixel in which the bit GD1$i$[4] serving as the carry signal is supplied to the terminal carry stops the counting operation of counting the upper bit count value.

However, if the minority comparator output VCOi is inverted to the L level at time T77 of the D phase, the latch circuit 290 constituting the latch circuit 231$_m$ of the gray code latch circuit 311 of the minority pixel starts the counting operation serving as the dummy operation in which the minority latch value GD2$i$[$m$] toggles.

If the toggling of the bit GD2$i$[4] serving as the carry signal among the minority latch value GD2$i$[$m$] is started, the binary counter 180 constituting the binary counter 312 of the minority pixel in which the bit GD2$i$[4] serving as the carry signal is supplied to the terminal carry dCarry starts the counting operation serving as the dummy operation of counting the upper bit count value.

Here, in the period from the time T75 to the time T77, the binary counter 170 constituting the binary counter 312 of the minority pixel counts the upper bit count value using the value −P as the initial value, and thus the count value increases accordingly.

Thereafter, at an end time T78 of the D phase, the count enable signal CE transitions from the H level to the L level, and the latch circuits 290 constituting the latch circuits 231$_m$ of the H gray code latch circuits 311 stop the counting operation serving as the dummy operation.

As the counting operation of the latch circuit 290 is stopped, the toggling of the bit GD2[4] serving as the carry signal is stopped. As a result, the binary counters 180 constituting the H binary counters 312 in which the bit GD2[4] serving as the carry signal is supplied to the terminal dCarry stop the counting operation serving as the dummy operation.

At a time T122 after the time T78 at which the P phase ends, for example, the system control unit 6 controls the gray code latch circuit 311 (FIG. 14) such that the lower bit count value of the 5-bit gray code configured with the bits GD1[0] to GD1[4] latched in the latch circuits 231$_0$ to 231$_4$ is converted into the lower bit count value of the binary code for the binary addition.

In the gray code latch circuit 311, the converting circuit 240 converts the bits GD1[0] to GD1[4] of the gray code latched in the latch circuits 231$_0$ to 231$_4$ into the bits BC[0] to BC[4] of the binary code, and supplies them to the selector 250.

In accordance with the control of the system control unit 6, the selector 250 sequentially selects the bits BC[0] to BC[4] of the binary code supplied from the converting circuit 240 from the least significant bit, and supplies them to the binary adder 260.

Accordingly, the binary adder 260 is sequentially supplied with the bits BC[0] to BC[4] of the binary code from the least significant bit from the selector 250. As a result, the lower bit count value serving as the storage value of the binary adder 260 gradually increases, and the count value increases with the increase in the lower bit count value.

As a result, in FIG. 16, the count value configured with the upper bit count value counted by the binary counter 312 of the majority pixel and the lower bit count value stored in the binary adder 260 of the gray code latch circuit 311 of the majority pixel becomes the value Dj−P.

Further, the count value configured with the upper bit count value counted by the binary counter 312 of the minority pixel and the lower bit count value stored in the binary adder 260 of the gray code latch circuit 311 of the minority pixel becomes the value Di−P.

As described above, the latch circuits 280 constituting the latch circuits 231$_m$ of the H gray code latch circuits 311 and the binary counters 170 constituting the H binary counters 312 perform the counting operation from the start time T72 of the P phase to the time T73 at which the majority comparator output VCOj and the minority comparator output VCOi are inverted.

Further, the latch circuit 280 constituting the latch circuit 231$_w$ of the gray code latch circuit 311 of the majority pixel among the H gray code latch circuits 311 and the binary counter 170 constituting the binary counter 312 of the majority pixel among the H binary counters 312 perform the counting operation from the start time T75 of the D phase to the time T76 at which the majority comparator output VCOj is inverted.

Furthermore, the latch circuit 280 constituting the latch circuit 231$_w$ of the gray code latch circuit 311 of the minority pixel among the H gray code latch circuits 311 and the binary counter 170 constituting the binary counter 312 of the minority pixel among the H binary counters 312 perform the counting operation from the start time T75 of the D phase to the time T77 at which the minority comparator output VCOi is inverted.

On the other hand, in the P phase, the latch circuits 290 constituting the latch circuits 231$_w$ of the H gray code latch circuits 311 and the binary counters 180 constituting the H binary counters 312 perform the counting operation serving as the dummy operation from the time T73 at which the majority comparator output VCOj and the minority comparator output VCOi are inverted to the end time T73 of the P phase.

Further, in the D phase, the latch circuit 290 constituting the latch circuit 231$_w$ of the gray code latch circuit 311 of the majority pixel among the H gray code latch circuits 311 and the binary counter 180 constituting the binary counter 312 of the majority pixel among the H binary counters 312 perform the counting operation serving as the dummy operation from the time T76 at which the majority comparator output VCOj is inverted to the end time T78 of the D phase.

Furthermore, in the D phase, the latch circuit 290 constituting the latch circuit 231$_m$ of the gray code latch circuit 311 of the minority pixel among the H gray code latch circuits 311 and the binary counter 180 constituting the binary counter 312 of the minority pixel among the H binary counters 312 perform the counting operation serving as the dummy operation from the time T77 at which the minority comparator output VCOi is inverted to the end time T78 of the D phase.

Therefore, in the latch circuit 231$_m$ (FIG. 11) of the gray code latch circuit 311, in a case where the latch circuit 280 serving as the counting operation unit performs the counting operation in the P phase and the D phase, the latch circuit 290 serving as the dummy operation unit stops the dummy operation. Further, in a case where the latch circuit 280 stops the counting operation, the latch circuit 290 performs the dummy operation.

In the binary counter 312 (FIG. 15), in a case where the binary counter 170 performs the counting operation in the P phase and the D phase, the binary counter 180 stops the dummy operation. Further, in a case where the binary counter 170 stops the counting operation, the binary counter 180 performs the dummy operation.

As described above, in the latch circuit 231$_m$ of the gray code latch circuit 311, in the P phase and the D phase, the latch circuit 280 performs the counting operation, or the latch circuit 290 performs the dummy operation.

Furthermore, in the binary counter 312, in the P phase and the D phase, the binary counter 170 performs the counting operation, or the binary counter 180 performs the dummy operation.

Therefore, the operation currents of the gray code latch circuit 311 and the binary counter 312 are constant over the P phase and the D phase, and the power voltages of the gray code latch circuit 311 and the binary counter 312 are also constant regardless of an imaging condition (a subject shape, a luminance, or the like).

In other words, in FIG. 16, the power voltage Vdd1 of the period D71 from the start time T72 of the P phase to the time T73 at which the majority comparator output VCOj and the minority comparator output VCOi are inverted, the power voltage Vdd2 of the period D72 from the time T73 to the end time T74 of the P phase, the power voltage Vdd3 of the period D73 from the start time T75 of the D phase to the time T76 at which the majority comparator output VCOj is inverted, the power voltage Vdd4 of the period D74 from the time T76 at which the majority comparator output VCOj is inverted to the time T77 at which the minority comparator output VCOi is inverted, and the power voltage Vdd5 of the period D75 from the time T77 at which the minority comparator output VCOi is inverted to the end time T78 of the D phase are the same.

As a result, it is possible to prevent the occurrence of an error in the AD conversion result and the occurrence of streaks caused by the fluctuation in (the fluctuation amount of) the power voltage of the gray code latch circuit 311 described above with reference to FIG. 7.

<Another Exemplary Configuration of Gray Code Latch Circuit 311>

FIG. 17 is a circuit diagram illustrating another exemplary configuration of the gray code latch circuit 311 of FIG. 13.

Note that, in FIG. 17, parts corresponding to those in FIG. 14 are denoted by the same reference numerals, and description thereof will be appropriately omitted below.

In FIG. 14, the most significant bit GD2[4] of the lower bit count value latched by the latch circuit 290 serving as the dummy operation unit constituting the latch circuit 231$_m$ (FIG. 11) is supplied to the binary counter 312 as the carry signal.

On the other hand, the gray code latch circuit 311 of FIG. 17 differs from the example of FIG. 14 in that the bit GD2[4] serving as the carry signal is not supplied to the binary counter 312 in FIG. 17.

In the gray code latch circuit 311 of FIG. 17, similarly to the example of FIG. 14, in the latch circuit 231$_m$ that latches the lower bit count value, in the P phase and the D phase, the latch circuit 280 performs the counting operation, or the latch circuit 290 performs the dummy operation.

Therefore, in a case where only the lower bit count value latched by the gray code latch circuit 311 is focused, the operation current of the gray code latch circuit 311 and the power voltage of the gray code latch circuit 311 are constant over the P phase and the D phase, similarly to the gray code latch circuit 221 of FIG. 10.

<Exemplary Configuration of Binary Counter 312>

Figure 18:
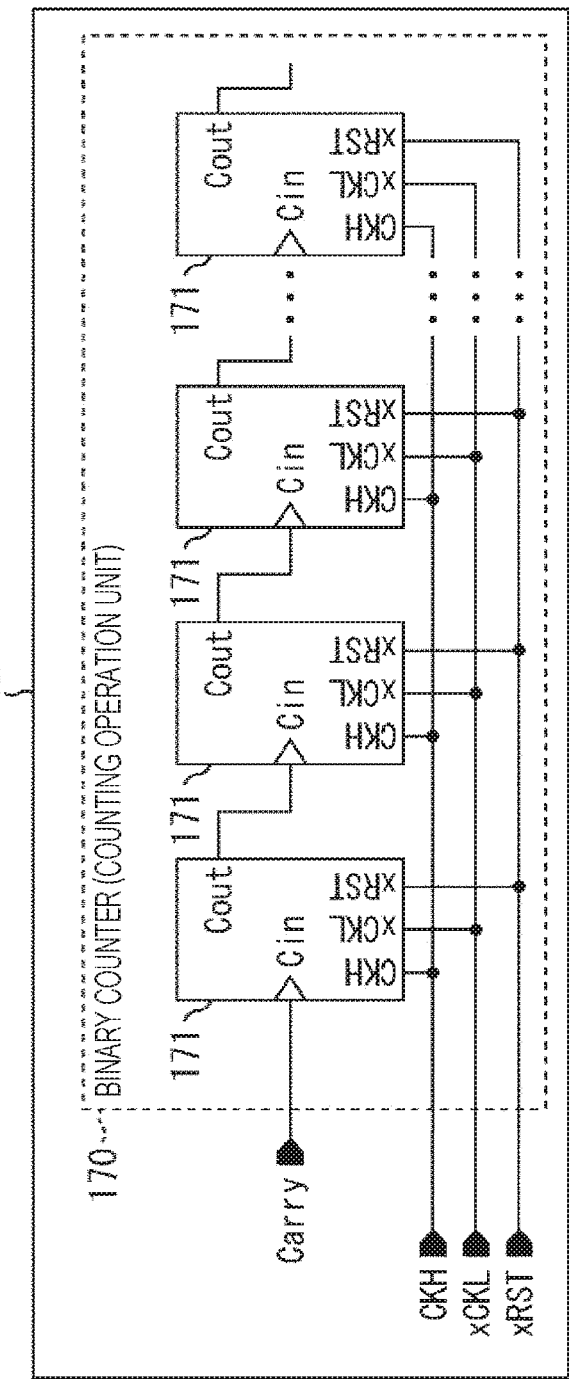
FIG. 18 is a circuit diagram illustrating an exemplary configuration of a binary counter 312.

FIG. 18 is a circuit diagram illustrating an exemplary configuration of the binary counter 312 of FIG. 17.

In other words, FIG. 18 is a circuit diagram illustrating an exemplary configuration of the binary counter 312 in a case where the gray code latch circuit 311 has the configuration illustrated in FIG. 17.

Note that, in FIG. 18, parts corresponding to those in FIG. 15 are denoted by the same reference numerals, and description thereof will be appropriately omitted below.

In FIG. 18, the binary counter 312 is similar to that of FIG. 15 in that the binary counter 170 that performs the counting operation is arranged.

However, the binary counter 312 of FIG. 18 differs from that of FIG. 15 in that the binary counter 180 that performs the dummy counting operation (the dummy operation) is not arranged.

As described above, since the binary counter 180 that performs the dummy operation is not arranged in the binary counter 312 of FIG. 18, the bit GD2[4] serving as the carry signal is not supplied to the binary counter 312 as described with reference to FIG. 17.

Therefore, in the binary counter 312 of FIG. 18, the counting operation is performed by the binary counter 170, but the dummy operation is not performed.

As a result, in a case where only to the upper bit count value counted by the binary counter 312 is focused, the operation current of the binary counter 312 and hence the power voltage of the binary counter 312 vary depending on whether or not the counting operation is performed in the P phase and the D phase.

However, for the operation currents of the gray code latch circuit 311 and the binary counter 312, charging and discharging performed by the toggling of the lower bit count value having a high operating frequency is dominant.

Therefore, it is possible to sufficiently suppress the fluctuation in the power voltage only by making constant the operation current of the gray code latch circuit 311 that latches the lower bit count value out of the gray code latch circuit 311 and the binary counter 312. As a result, it is possible to prevent the occurrence of an error in the AD conversion result and the occurrence of streaks caused by the fluctuation in (the fluctuation amount of) the power voltage.

Note that, in the counter 150 (FIG. 2) that counts the count value, the gray code latch circuit 221 (FIG. 9), and the gray code latch circuit 311 (FIG. 13), the fluctuation in the operation current and hence the power voltage is greatly affected by the lower bit having a high toggling frequency of the count value.

Therefore, even in a case where the binary counter 180 (FIG. 5 and FIG. 15) that performs the dummy operation and the latch circuit 290 (FIG. 11) are arranged only for one or more lower bits from the least significant bit rather than all bits of the count value, it is possible to effectively suppress the fluctuation in the operation current and (the fluctuation amount of) the power voltage and suppress the occurrence of streaks.

In other words, in the counter 150 of FIG. 5, the binary counter 180 that performs the dummy operation and the latch circuit 290 that performs the dummy operation in the latch circuit $231_n$ of FIG. 11 may be arranged only for one or more lower bits from the least significant bit of the count value.

Further, in the gray code latch circuit 311 of FIG. 17, the latch circuit 290 (FIG. 11) that performs the dummy operation may be arranged only in some of the latch circuits $231_0$ through $231_4$ rather than all the latch circuits $231_0$ through $231_4$. In other words, in the gray code latch circuit 311 of FIG. 17, the latch circuit 290 that performs the dummy operation may be arranged only in the latch circuit $231_w$ that latches one or more lower bits from the least significant bit of the lower bit count value among the latch circuits $231_0$ to $231_4$.

The present technology has been described focusing on the example in which the column AD converter is applied, but the present technology can be applied to other examples, for example, an area AD converter in which the pixels 110 of the pixel array unit 2 are divided into a plurality of areas, and the AD conversions for the pixel signals of the pixels 100 of all the areas are performed in parallel, a pixel parallel AD converter in which the AD conversions for the pixel signals of a plurality of predetermined pixels 110 are performed in parallel, and an AD converter in which the AD conversions for the pixel signals of a plurality of pixels 110 are performed in parallel.

Since a degree of streaking caused by the fluctuation in the power voltage increases as the number of pixels 110 whose pixel signals are subject to the AD conversion in parallel increases, the present technology is more effective as the number of pixels 110 whose pixel signals are subject to the AD conversion in parallel increases.

<Application Example of Imaging Element>

Figure 19:
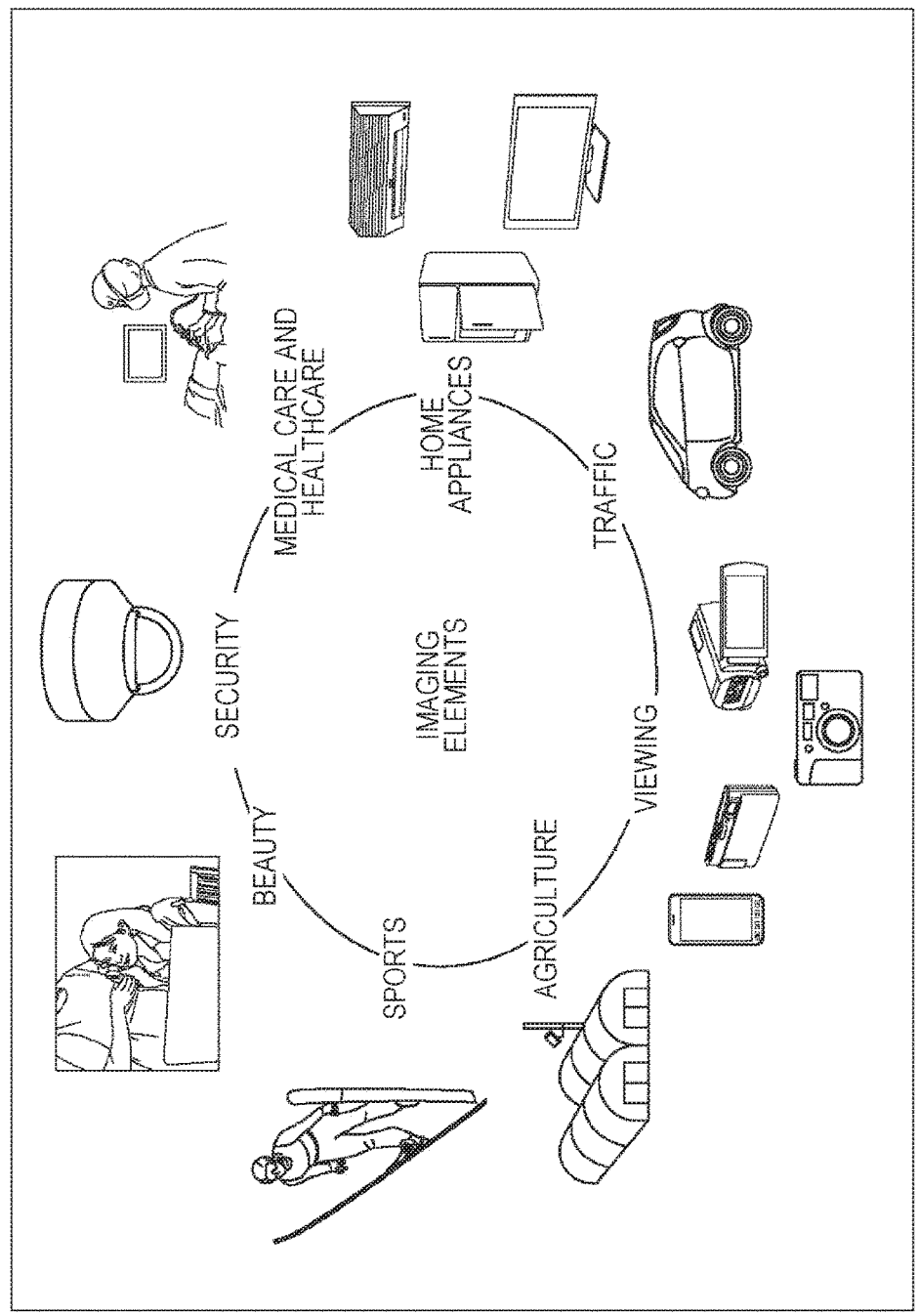
FIG. 19 is a diagram illustrating an application example using an imaging element.

FIG. 19 is a diagram illustrating an application example using the imaging element of FIG. 1.

For example, the imaging element described above can be used for various electronic devices that sense light such as visible light, infrared light, ultraviolet light, X-rays, and the like as will described below.

Electronic devices that capture images used for viewing such as digital cameras or mobile phones with a camera function Electronic devices for traffic such as in-vehicle sensors that image areas before, behind, and around automobiles, a vehicle inside, and the like, monitoring cameras used for monitoring traveling vehicles or roads, distance measuring sensors used or measuring distances of vehicles and the like for the sake of safe driving such as automatic stop, recognition of driver states, and the like Electronic devices for home appliances such as televisions, refrigerators, air conditioners, and the like in order to image the user's gesture and operating devices in accordance with the gesture Electronic devices for medical care or healthcare such as endoscopes and devices that receive infrared light and perform angiography Electronic devices for security such as monitoring cameras for crime prevention purposes and cameras for person authentication purposes Electronic devices for beauty purposes such as skin measuring devices for imaging skin and microscopes for imaging a scalp Electronic devices for sports purposes such as action cameras or wearable cameras for sports Electronic devices for agriculture such as cameras for monitoring states of fields or crops <Digital Camera to which Imaging Element is Applied>

Figure 20:
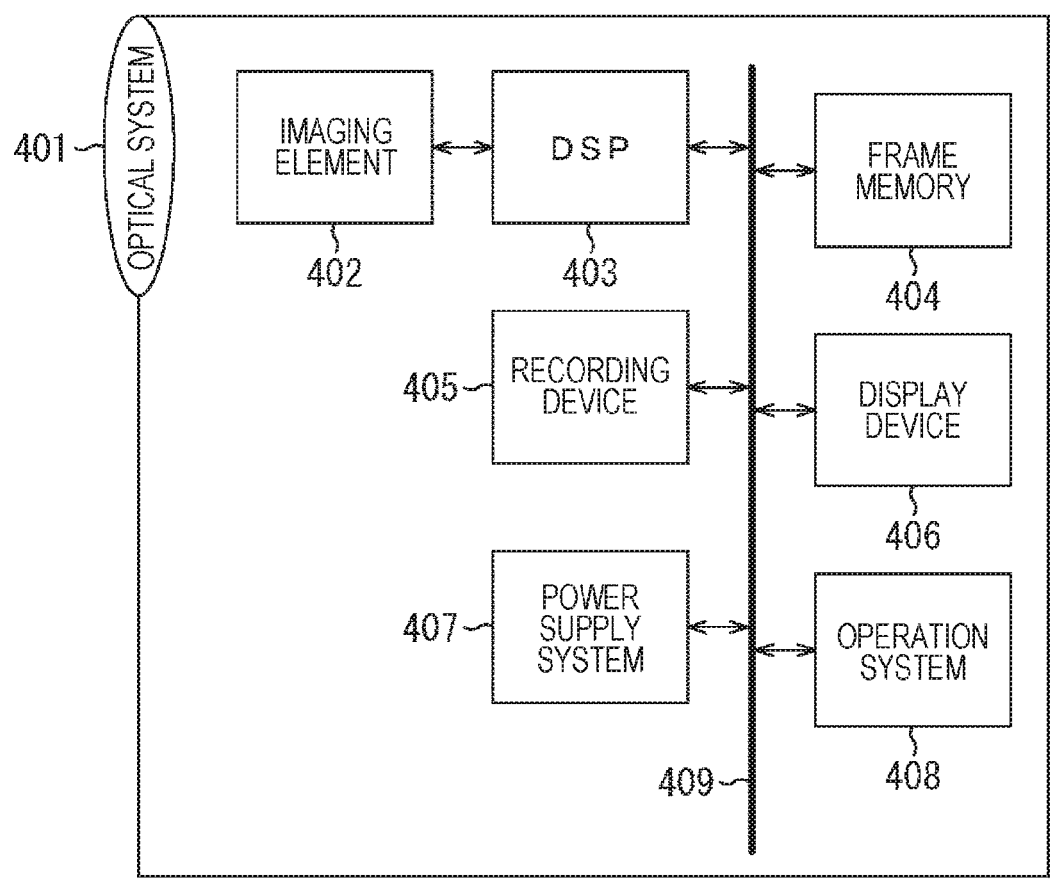
FIG. 20 is a block diagram illustrating an exemplary configuration of one embodiment of a digital camera which is one of electronic devices to which an imaging element is applied.

FIG. 20 is a block diagram illustrating an exemplary configuration of one embodiment of a digital camera which is one of electronic devices to which the imaging element of FIG. 1 is applied.

It is possible to capture still images and moving images using the digital camera.

Referring to FIG. 20, the digital camera includes an optical system 401, an imaging element 402, a digital signal processor (DSP) 403, a frame memory 404, a recording device 405, a display device 406, a power supply system 407, an operation system 408, and a bus line 409. In the digital camera, the components from the DSP 403 to the operation system 408 are connected to one another via the bus line 409.

The optical system 401 causes external light to focus on the imaging element 402.

The imaging element 402 has a configuration similar to the imaging element of FIG. 1, and receives light from the optical system 401, performs photoelectric conversion, and outputs image data serving as an electric signal.

The DSP 403 performs signal processing necessary for image data output by the imaging element 402.

The frame memory 404 temporarily holds the image data which has been subject to signal processing performed by the DSP 403 in units of frames.

The recording device 405 records image data of a moving image or a still image captured by the imaging element 402 on a recording medium such as a semiconductor memory or a hard disk.

For example, the display device 406 is configured with a panel type display device such as a liquid crystal panel or an organic electro luminescence (EL) panel and displays an image (a moving image or a still image) corresponding to the image data stored in the frame memory 404.

The power supply system 407 supplies necessary electric power to the imaging element 402 to the display device 406 and the operation system 408.

The operation system 408 outputs operation commands for various kinds of functions included in the digital camera in accordance with an operation performed by the user.

Note that the embodiment of the present technology is not limited to the above-described embodiment, and various modifications can be made within the scope not departing from the gist of the present technology.

Further, the effects described in the present specification are merely examples and are not limited, and other effects may be included.

Note that the present technology can have the following configurations.

<1>
An imaging element, including:
a pixel including a photoelectric converting element that performs photoelectric conversion, the pixel outputting an electric signal;
a reference signal generating unit that generates a reference signal whose level changes;
a comparing unit that compares the electric signal with the reference signal; and
a counting unit that counts a count value in accordance with a comparison result of the electric signal and the reference signal and performs analog to digital (AD) conversion of the electric signal,
the counting unit including
a counting operation unit that performs a counting operation of counting the count value, and
a dummy operation unit that performs a dummy counting operation at a timing complementary to the counting operation of the counting operation unit.

<2>
The imaging element according to <1>,
in which the counting operation unit performs the counting operation from a start timing of the AD conversion to a timing at which a magnitude relation between the electric signal and the reference signal changes, and
the dummy operation unit performs the counting operation from a timing at which the magnitude relation between the electric signal and the reference signal changes and an end timing of the AD conversion.

<3>
The imaging element according to <1> or <2>,
in which the counting unit counts the count value using a binary code.

<4>
The imaging element according to <1> or <2>,
in which the counting unit counts the count value using a gray code.

<5>
The imaging element according to <1> or <2>,
in which the counting unit counts an upper bit of the count value using a binary code and counts a lower bit of the count value using a gray code.

<6>
The imaging element according to any of <1> to <5>,
in which the counting unit includes the dummy operation unit only for the lower bit of the count value.

<7>
The imaging element according to <5>,
in which the counting unit includes the dummy operation unit only for a lower bit among the lower bits of the count value which is counted using the gray code.

<8>
A processing method performed by an imaging element including
a pixel including a photoelectric converting element that performs photoelectric conversion, the pixel outputting an electric signal,
a reference signal generating unit that generates a reference signal whose level changes,
a comparing unit that compares the electric signal with the reference signal, and
a counting unit that includes a counting operation unit and a dummy operation unit, the counting unit counting a count value in accordance with a comparison result of the electric signal and the reference signal and performing analog to digital (AD) conversion of the electric signal,
the processing method including:
performing, by the counting operation unit, a counting operation of counting the count value; and
performing, by the dummy operation unit, a dummy counting operation at a timing complementary to the counting operation of the counting operation unit.

<9>
An electronic device, including:
an optical system that collects light; and
an imaging element that receives the light and captures an image,
the imaging element including
a pixel including a photoelectric converting element that performs photoelectric conversion, the pixel outputting an electric signal,
a reference signal generating unit that generates a reference signal whose level changes,
a comparing unit that compares the electric signal with the reference signal, and
a counting unit that counts a count value in accordance with a comparison result of the electric signal and the reference signal and performs analog to digital (AD) conversion of the electric signal,
the counting unit including
a counting operation unit that performs a counting operation of counting the count value, and
a dummy operation unit that performs a dummy counting operation at a timing complementary to the counting operation of the counting operation unit.

REFERENCE SIGNS LIST

1 Semiconductor substrate
2 Pixel array unit
3 Row scanning unit
4 Column signal processing unit
5 Column scanning unit
6 System control unit
7 Pixel drive line
8 VSL
9 Transfer line
10 Output terminal
101 to 105 FET
106 FD
110 Pixel
120 Bias circuit
130 Reference signal generating circuit 131 Reference clock generating circuit
140 Comparator
141, 142 Capacitor
150 Counter
161, 162 AND gate
163 NOT gate
164 AND gate
170 Binary counter
171 D-FF
180 Binary counter
181 D-FF
191 AND gate
192 NOR gate
193 NOT gate
194 NAND gate
195 Switch
196 to 199 NOT gate
210 Gray code counter
220 Gray code generator
221 Gray code latch circuit
$231_0$ to $231_{N-1}$ Latch circuit
240 Converting circuit
$241_0$ to $241_{N-2}$ EXOR gate
250 Selector
260 Binary adder
261 Metastable countermeasure latch circuit
271 AND gate
272 NOT gate
273 AND gate
280 Latch circuit
281 to 283 NOT gate
290 Latch circuit
291 to 293 NOT gate
300 Hybrid counter
311 Gray code latch circuit
312 Binary counter
401 Optical system
402 Imaging element
403 DSP
404 Frame memory
405 Recording device
406 Display device
407 Power supply system
408 Operation system
409 Bus line

The invention claimed is:

1. An imaging element, comprising:
a pixel including a photoelectric converting element,
wherein the photoelectric converting element is configured to convert incident light into an electric signal, and
wherein the pixel is configured to output the electric signal;
a reference signal generating unit configured to generate a reference signal, wherein a signal level of the reference signal is changeable from a first value to a second value;
a comparing unit configured to compare the electric signal with the reference signal; and
a counting unit that includes a counting operation unit and a dummy operation unit, wherein the counting unit is configured to:
count a count value based on the comparison of the electric signal with the reference signal; and
convert, via analog to digital (AD) conversion, the electric signal to a digital signal,
wherein the counting operation unit is configured to count the count value based on a counting operation, and
wherein the dummy operation unit is configured to count the count value at a time complementary to the counting operation based on a dummy counting operation.

2. The imaging element according to claim 1,
wherein the counting operation unit is further configured to count the count value based on the counting operation from a start time of the AD conversion to a first time, wherein the first time corresponds to a time of change of a magnitude relation between the electric signal and the reference signal, and
wherein the dummy operation unit is further configured to count the count value based on the dummy counting operation from the first time to an end time of the AD conversion.

3. The imaging element according to claim 1,
wherein the counting unit is further configured to count the count value based on a binary code.

4. The imaging element according to claim 1,
wherein the counting unit is further configured to count the count value based on a gray code.

5. The imaging element according to claim 1,
wherein the counting unit is further configured to count an upper bit of the count value based on a binary code and count a lower bit of the count value based on a gray code.

6. The imaging element according to claim 1,
wherein the dummy operation unit is further configured to count only a lower bit of the count value.

7. The imaging element according to claim 1,
wherein the counting unit is further configured to count the count value based on a gray code, and wherein the dummy operation unit is further configured to count only a first lower bit among a plurality of lower bits of the count value.

8. A processing method, comprising:
in an imaging element:
converting, by a photoelectric converting element of a pixel, incident light into an electric signal;
outputting, by the pixel, the electric signal;
generating, by a reference signal generating unit, a reference signal, wherein a signal level of the reference signal is changeable from a first value to a second value;
comparing, by a comparing unit, the electric signal with the reference signal;
counting, by a counting unit, a count value based on the comparison of the electric signal with the reference signal,
wherein the counting unit includes a counting operation unit and a dummy counting operation unit;
converting, by the counting unit, the electric signal from an analog signal to a digital signal;
counting, by the counting operation unit, the count value based on a counting operation; and
counting, by the dummy operation unit, the count value at a time complementary to the counting operation of the counting operation unit based on a dummy counting operation.

9. An electronic device, comprising:
an optical system configured to collect light; and
an imaging element configured to receive the light and capture an image, wherein the imaging element including:
  a pixel including a photoelectric converting element,
    wherein the photoelectric converting element is configured to convert incident light into an electric signal, and
    wherein the pixel is configured to output the electric signal,
  a reference signal generating unit configured to generate a reference signal, wherein a signal level of the reference signal is changeable from a first value to a second value,
  a comparing unit configured to compare the electric signal with the reference signal, and
  a counting unit that includes a counting operation unit and a dummy operation unit, wherein the counting unit is configured to:
    count a count value based on the comparison of the electric signal with the reference signal, and
    convert, via analog to digital (AD) conversion, the electric signal to a digital signal,
    wherein the counting operation unit is configured to count the count value based on a counting operation, and
  wherein the dummy operation unit is configured to count the count value at a time complementary to the counting operation based on a dummy counting operation.

* * * * *